(12) United States Patent
Dimitropoulos et al.

(10) Patent No.: US 11,735,691 B2
(45) Date of Patent: Aug. 22, 2023

(54) MICRO LIGHT EMITTING DEVICES

(71) Applicant: Lumileds LLC, San Jose, CA (US)

(72) Inventors: Costas Dimitropoulos, Redwood City, CA (US); Sungsoo Yi, Sunnyvale, CA (US); John Edward Epler, San Jose, CA (US); Byung-Kwon Han, Santa Clara, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/518,699

(22) Filed: Nov. 4, 2021

(65) Prior Publication Data
US 2022/0059612 A1 Feb. 24, 2022

Related U.S. Application Data

(60) Continuation of application No. 17/030,674, filed on Sep. 24, 2020, now Pat. No. 11,271,033, which is a
(Continued)

(30) Foreign Application Priority Data

Nov. 29, 2018 (EP) ..................................... 18209260

(51) Int. Cl.
*H01L 33/24* (2010.01)
*H01L 27/15* (2006.01)
(Continued)

(52) U.S. Cl.
CPC ............ *H01L 33/24* (2013.01); *H01L 27/156* (2013.01); *H01L 33/007* (2013.01);
(Continued)

(58) Field of Classification Search
None
See application file for complete search history.

(56) References Cited

U.S. PATENT DOCUMENTS

| 6,410,942 B1 | 6/2002 | Thibeault et al. |
| 6,657,236 B1 | 12/2003 | Thibeault et al. |

(Continued)

FOREIGN PATENT DOCUMENTS

| EP | 2027608 A1 | 2/2009 |
| EP | 2203939 A1 | 7/2010 |

(Continued)

OTHER PUBLICATIONS

"Non-Final Office Action in U.S. Appl. No. 16/584,941 dated Apr. 21, 2020, 9 pages".
(Continued)

*Primary Examiner* — Steven M Christopher
(74) *Attorney, Agent, or Firm* — Servilla Whitney LLC

(57) ABSTRACT

Techniques, devices, and systems are disclosed and include LEDs with a first flat region, at a first height from an LED base and including a plurality of epitaxial layers including a first n-layer, a first active layer, and a first p-layer. A second flat region is provided, at a second height from the LED base and parallel to the first flat region, and includes at least a second n-layer. A sloped sidewall connecting the first flat region and the second flat region is provided and includes at least a third n-layer, the first n-layer being thicker than at least a portion of third n-layer. A p-contact is formed on the first p-layer and an n-contact formed on the second n-layer.

22 Claims, 31 Drawing Sheets

Related U.S. Application Data continuation of application No. 17/030,542, filed on Sep. 24, 2020, now Pat. No. 11,201,265, which is a continuation-in-part of application No. 16/586,882, filed on Sep. 27, 2019, now Pat. No. 10,964,845, which is a continuation-in-part of application No. 16/584,941, filed on Sep. 26, 2019, now Pat. No. 10,923,628, which is a division of application No. 16/144,751, filed on Sep. 27, 2018, now Pat. No. 10,811,460, which is a continuation-in-part of application No. 16/144,751, filed on Sep. 27, 2018, now Pat. No. 10,811,460.

(51) Int. Cl.
*H01L 33/00* (2010.01)
*H01L 33/20* (2010.01)
*H01L 33/50* (2010.01)
*H01L 33/58* (2010.01)

(52) U.S. Cl.
CPC .......... *H01L 33/0075* (2013.01); *H01L 33/20* (2013.01); *H01L 33/0093* (2020.05); *H01L 33/50* (2013.01); *H01L 33/58* (2013.01)

(56) References Cited

U.S. PATENT DOCUMENTS

| | | | |
|---|---|---|---|
| 6,821,804 B2 | 11/2004 | Thibeault et al. | |
| 8,222,811 B2 | 7/2012 | Vaufrey et al. | |
| 8,258,044 B2 | 9/2012 | Brun et al. | |
| 8,487,340 B2 | 7/2013 | Gilet et al. | |
| 8,638,032 B2 | 1/2014 | Maindron et al. | |
| 8,647,957 B2 | 2/2014 | Borowik et al. | |
| 8,697,548 B2 | 4/2014 | Borowik et al. | |
| 8,698,396 B2 | 4/2014 | Maindron et al. | |
| 8,890,111 B2 | 11/2014 | Templier et al. | |
| 9,093,607 B2 | 7/2015 | Gilet et al. | |
| 9,109,296 B2 | 8/2015 | Metaye et al. | |
| 9,112,112 B2 | 8/2015 | Do et al. | |
| 9,192,290 B2 | 11/2015 | Spinnler et al. | |
| 9,209,366 B2 | 12/2015 | Maindron et al. | |
| 9,263,633 B2 | 2/2016 | Gilet et al. | |
| 9,396,970 B2 | 7/2016 | Gillot et al. | |
| 9,422,628 B2 | 8/2016 | Simonato et al. | |
| 9,484,492 B2 | 11/2016 | Bour et al. | |
| 9,496,465 B2 | 11/2016 | Sugimoto et al. | |
| 9,507,204 B2 | 11/2016 | Pelka et al. | |
| 9,601,542 B2 | 3/2017 | Robin et al. | |
| 9,601,659 B2 | 3/2017 | Bour et al. | |
| 9,722,160 B2 | 8/2017 | Nakabayashi | |
| 9,768,350 B2 | 9/2017 | Bavencove et al. | |
| 9,865,772 B2 | 1/2018 | Bour et al. | |
| 9,887,184 B2 | 2/2018 | Takeya et al. | |
| 9,945,526 B2 | 4/2018 | Singer et al. | |
| 9,978,727 B2 | 5/2018 | Takeya et al. | |
| 9,997,688 B2 | 6/2018 | Takeya et al. | |
| 10,002,928 B1 | 6/2018 | Raring et al. | |
| 10,018,325 B2 | 7/2018 | Kim et al. | |
| 10,050,026 B2 | 8/2018 | Takeya et al. | |
| 10,068,884 B2 | 9/2018 | Takeya et al. | |
| 10,145,518 B2 | 12/2018 | Do et al. | |
| 10,193,013 B2 | 1/2019 | Bour et al. | |
| 2004/0129929 A1 | 7/2004 | Okuyama et al. | |
| 2007/0200135 A1* | 8/2007 | Wang .................. H01L 33/24 257/E33.003 | |
| 2009/0032799 A1 | 2/2009 | Pan | |
| 2010/0264441 A1 | 10/2010 | Kim | |
| 2011/0151607 A1 | 6/2011 | Landis et al. | |
| 2011/0287606 A1 | 11/2011 | Brun et al. | |
| 2012/0074441 A1 | 3/2012 | Seo et al. | |
| 2012/0205614 A1 | 8/2012 | Templier et al. | |
| 2013/0020115 A1 | 1/2013 | Mataye et al. | |
| 2013/0112945 A1 | 5/2013 | Gilet et al. | |
| 2014/0077156 A1 | 3/2014 | Bavencove et al. | |
| 2014/0094878 A1 | 4/2014 | Gossler et al. | |
| 2014/0138719 A1 | 5/2014 | Maindron et al. | |
| 2014/0166974 A1 | 6/2014 | Yoo et al. | |
| 2014/0225059 A1 | 8/2014 | Yang et al. | |
| 2015/0118544 A1 | 4/2015 | Oukassi | |
| 2015/0144590 A1 | 5/2015 | Simonato et al. | |
| 2015/0228873 A1 | 8/2015 | Gebuhr et al. | |
| 2015/0280060 A1 | 10/2015 | Gilet et al. | |
| 2015/0380461 A1 | 12/2015 | Robin et al. | |
| 2016/0079565 A1 | 3/2016 | Maindron et al. | |
| 2016/0087150 A1 | 3/2016 | Ristic et al. | |
| 2016/0190400 A1 | 6/2016 | Jung et al. | |
| 2016/0197232 A1 | 7/2016 | Bour et al. | |
| 2016/0218240 A1 | 7/2016 | Bouvier et al. | |
| 2016/0293811 A1 | 10/2016 | Hussell et al. | |
| 2017/0012175 A1 | 1/2017 | Wang et al. | |
| 2017/0080457 A1 | 3/2017 | Eymery et al. | |
| 2017/0098746 A1 | 4/2017 | Bergmann et al. | |
| 2017/0137645 A1 | 5/2017 | Manceau et al. | |
| 2017/0162746 A1* | 6/2017 | Cha .................. H01L 33/504 | |
| 2017/0186612 A1 | 6/2017 | Almadori et al. | |
| 2017/0243860 A1 | 8/2017 | Hong et al. | |
| 2017/0293065 A1 | 10/2017 | Kim | |
| 2017/0358563 A1 | 12/2017 | Cho et al. | |
| 2017/0358724 A1 | 12/2017 | Shichijo et al. | |
| 2018/0017939 A1 | 1/2018 | Allier et al. | |
| 2018/0019369 A1 | 1/2018 | Cho et al. | |
| 2018/0019373 A1 | 1/2018 | Lehnhardt et al. | |
| 2018/0061316 A1 | 3/2018 | Shin et al. | |
| 2018/0074372 A1 | 3/2018 | Takeya et al. | |
| 2018/0090539 A1* | 3/2018 | Son .................. H01L 33/405 | |
| 2018/0090540 A1 | 3/2018 | Von Malm et al. | |
| 2018/0090639 A1* | 3/2018 | Ting .................. H01L 33/44 | |
| 2018/0138157 A1 | 5/2018 | Im et al. | |
| 2018/0145059 A1 | 5/2018 | Welch et al. | |
| 2018/0149328 A1 | 5/2018 | Cho et al. | |
| 2018/0156406 A1 | 6/2018 | Feil et al. | |
| 2018/0166470 A1 | 6/2018 | Chae | |
| 2018/0174519 A1* | 6/2018 | Kim .................. H01L 33/06 | |
| 2018/0174931 A1 | 6/2018 | Henley | |
| 2018/0182275 A1 | 6/2018 | Ahmed et al. | |
| 2018/0210282 A1 | 7/2018 | Song et al. | |
| 2018/0238511 A1 | 8/2018 | Hartmann et al. | |
| 2018/0259137 A1 | 9/2018 | Lee et al. | |
| 2018/0259570 A1 | 9/2018 | Henley | |
| 2018/0272605 A1* | 9/2018 | Gmeinwieser ........ H01L 27/156 | |
| 2018/0283642 A1 | 10/2018 | Liao et al. | |
| 2018/0297510 A1 | 10/2018 | Fiederling et al. | |
| 2018/0339643 A1 | 11/2018 | Kim | |
| 2018/0339644 A1 | 11/2018 | Kim | |
| 2018/0354406 A1 | 12/2018 | Park | |
| 2019/0067522 A1 | 2/2019 | Chang et al. | |
| 2019/0115495 A1 | 4/2019 | Bour et al. | |
| 2020/0035748 A1 | 1/2020 | Xia et al. | |
| 2020/0058838 A1* | 2/2020 | Choi .................. H01L 27/156 | |

FOREIGN PATENT DOCUMENTS

| | | |
|---|---|---|
| EP | 2211387 A2 | 7/2010 |
| EP | 2339658 A2 | 6/2011 |
| EP | 2491591 A1 | 8/2012 |
| EP | 2499958 A1 | 9/2012 |
| EP | 2521161 A1 | 11/2012 |
| EP | 2521162 A1 | 11/2012 |
| EP | 2553149 A1 | 2/2013 |
| EP | 2617069 A1 | 7/2013 |
| EP | 2674516 A1 | 12/2013 |
| EP | 2855744 B1 | 5/2016 |
| EP | 3053199 A1 | 8/2016 |
| EP | 3144272 A1 | 3/2017 |
| EP | 3410002 A1 | 12/2018 |
| FR | 2952366 A1 | 5/2011 |
| FR | 2964796 A1 | 3/2012 |
| FR | 2969995 A1 | 7/2012 |
| FR | 2972815 A1 | 9/2012 |
| FR | 2974940 A1 | 11/2012 |
| FR | 2974941 A1 | 11/2012 |
| FR | 2975532 A1 | 11/2012 |

(56) References Cited

FOREIGN PATENT DOCUMENTS

| | | |
|---|---|---|
| FR | 2991342 A1 | 12/2013 |
| FR | 2991999 A1 | 12/2013 |
| FR | 2998090 A1 | 5/2014 |
| FR | 3011383 A1 | 4/2015 |
| FR | 3041274 A1 | 3/2017 |
| FR | 3046155 A1 | 6/2017 |
| FR | 3052915 A1 | 12/2017 |
| JP | 2016066765 A | 4/2016 |
| KR | 20140118466 A | 10/2014 |
| KR | 20170018687 A | 2/2017 |
| KR | 20180010670 A | 1/2018 |
| KR | 20180114413 A | 10/2018 |
| TW | 201709559 A | 3/2017 |
| WO | 2008091846 A2 | 7/2008 |
| WO | 2011045289 A1 | 4/2011 |
| WO | 2011048318 A1 | 4/2011 |
| WO | 2012035243 A1 | 3/2012 |
| WO | 2012059837 A1 | 5/2012 |
| WO | 2012156620 A2 | 11/2012 |
| WO | 2013182969 A1 | 12/2013 |
| WO | 2015044620 A1 | 4/2015 |
| WO | 2017089676 A1 | 6/2017 |
| WO | 2017102708 A1 | 6/2017 |
| WO | 2017216445 A1 | 12/2017 |
| WO | 2018091657 A1 | 5/2018 |
| WO | 2018139866 A1 | 8/2018 |
| WO | 2018143682 A1 | 8/2018 |
| WO | 2018159977 A1 | 9/2018 |
| WO | 2018169243 A1 | 9/2018 |

OTHER PUBLICATIONS

"PCT International Search Report and Written Opinion in PCT/US2019/053694 dated Nov. 29, 2019, 34 pages".

Chang, et al., "Boosting Brightness with V-Shaped Pits," Compound Semiconductor Magazine, vol. 21, Issue VII, pp. 48-52, (2015).

* cited by examiner

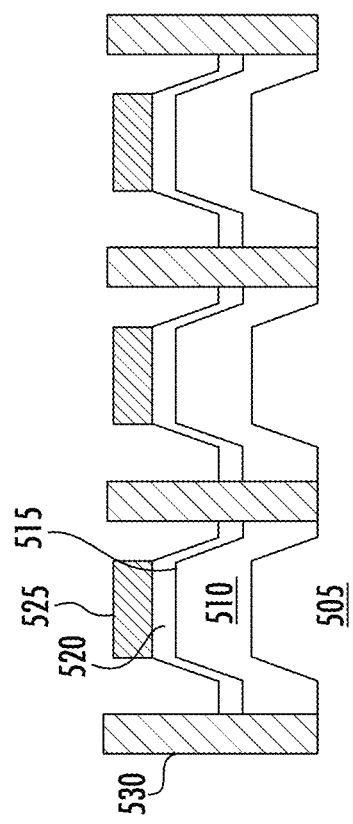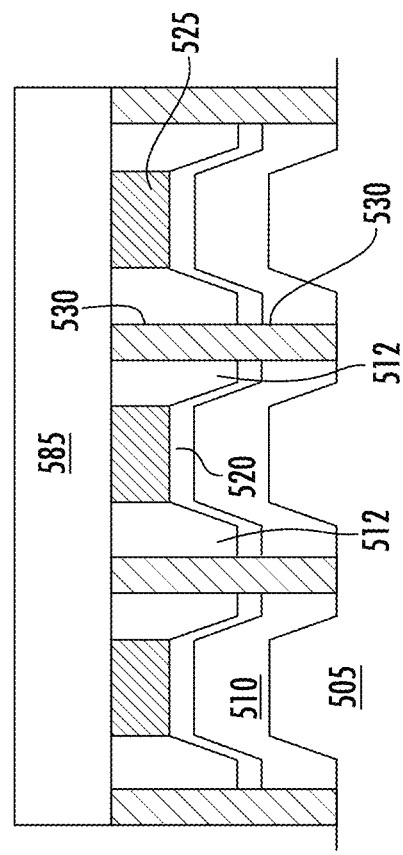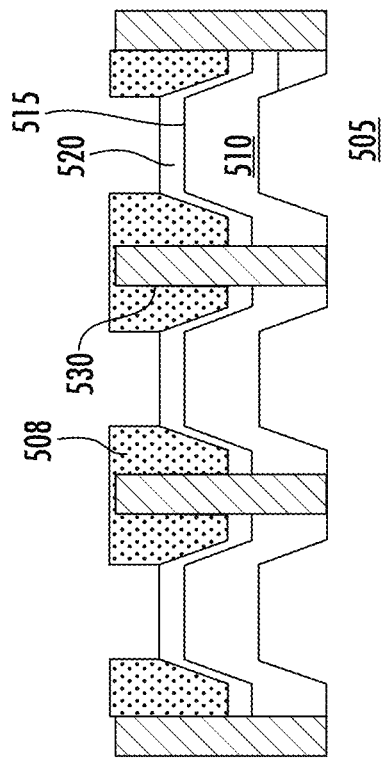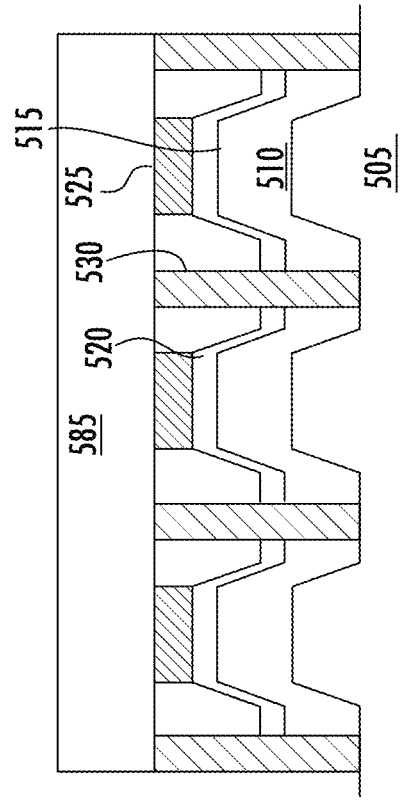

680

| 681: PROVIDING A PATTERNED SUBSTRATE HAVING MESAS WITH TOP SURFACES AND SLOPED SIDEWALLS EXTENDING FROM THE TOP SURFACES TOWARDS A NON-PATTERNED SURFACE OF THE PATTERNED SUBSTRATE |

↓

| 685: GROWING A CONTINUOUS N-LAYER, ACTIVE LAYER, AND P-LAYER HAVING A FIRST REGION OVER THE TOP SURFACES, A SECOND REGION OVER THE NON-PATTERNED SURFACE, AND A THIRD REGION OVER THE SLOPED SIDEWALLS, THE THIRD REGION OF THE N-LAYER, ACTIVE LAYER, AND P-LAYER HAVING A SLOWER GROWTH RATE THAN THE GROWTH RATE OF THE FIRST AND SECOND REGIONS OF THE N-LAYER, ACTIVE LAYER, AND P-LAYER RESPECTIVELY |

| 691: PROVIDING AN N-LAYER HAVING MESAS WITH TOP SURFACES AND SLOPED SIDEWALLS EXTENDING FROM THE TOP SURFACES TOWARDS A NON-PATTERNED SURFACE OF THE PATTERNED SUBSTRATE |

↓

| 695: GOWING A CONTINUOUS ACTIVE LAYER, AND P-LAYER (AND, OPTIONALLY, N REGROWTH LAYER) HAVING A FIRST REGION OVER THE TOP SURFACES, A SECOND REGION OVER THE NON-PATTERNED SURFACE, AND A THIRD REGION OVER THE SLOPED SIDEWALLS, THE THIRD REGION OF THE N-LAYER, ACTIVE LAYER, AND P-LAYER HAVING A SLOWER GROWTH RATE THAN THE GROWTH RATE OF THE FIRST AND SECOND REGIONS OF THE N-LAYER, ACTIVE LAYER, AND P-LAYER, RESPECTIVELY |

FIG. 6C

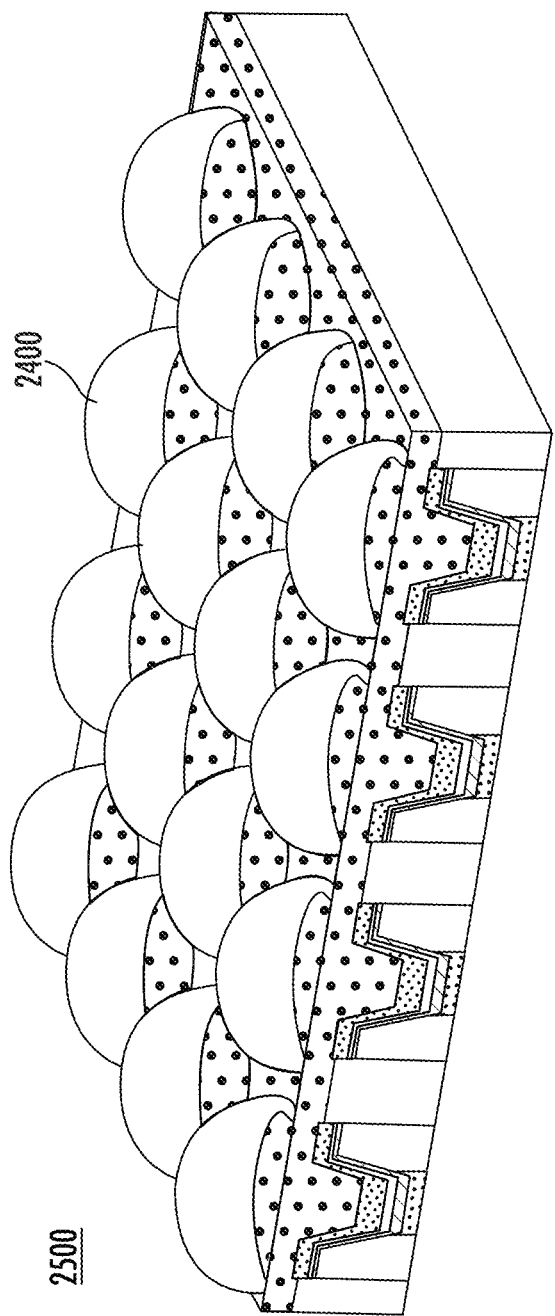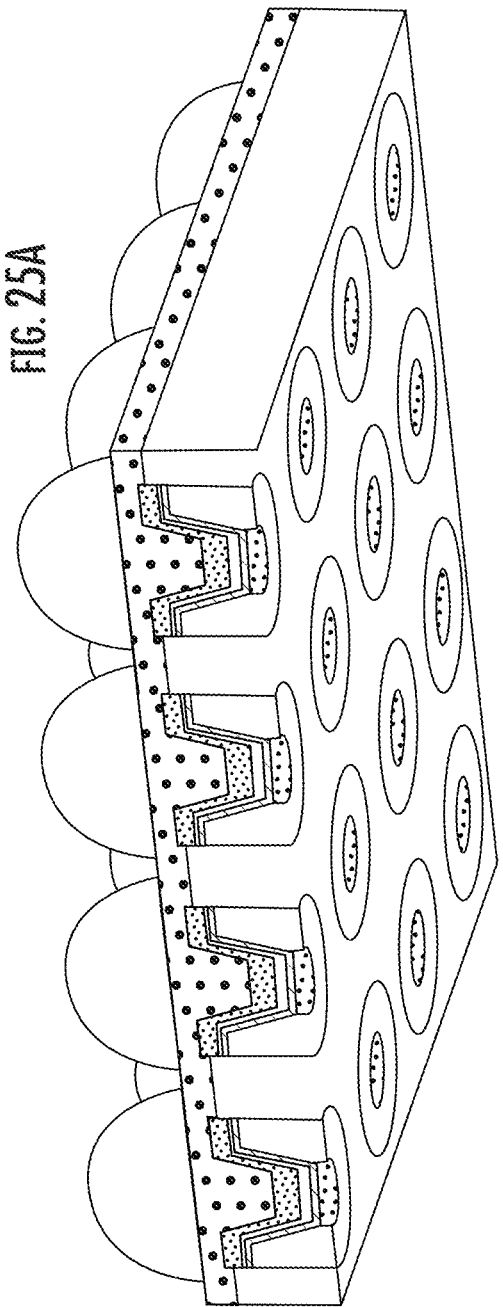

MICRO LIGHT EMITTING DEVICES

CROSS-REFERENCE TO RELATED APPLICATIONS

This application claims continuation priority to U.S. application Ser. No. 17/030,674, filed on Sep. 24, 2020, which is a divisional application of U.S. application Ser. No. 16/144,751 under 35 U.S.C. § 121. This application also claims continuation priority under 35 U.S.C. § 120 to U.S. application Ser. No. 17/030,542, filed on Sep. 24, 2020, which claims continuation-in-part priority Ser. No. 16/586,882, filed on Sep. 27, 2019, now U.S. Pat. No. 10,964,845, which claims continuation-in-part priority to U.S. application Ser. No. 16/584,941, filed on Sep. 26, 2019, now U.S. Pat. No. 10,923,628, which claims continuation-in-part priority to U.S. application Ser. No. 16/144,751, filed on Sep. 27, 2018, now U.S. Pat. No. 10,811,460, and to Europe Ser. No. 18209260.1 filed on Nov. 29, 2018, the disclosures of which are incorporated herein by reference in their entireties.

BACKGROUND

Light emitting diodes (LEDs) have emerged as an appealing light source for many applications. From road signage and traffic signals, LEDs are becoming dominant in general lighting, automotive, mobile electronics, camera flash, display backlighting, horticulture, sanitization and other applications.

SUMMARY

Techniques and devices are disclosed that include LEDs with a first flat region, at a first height from a reference point (e.g., a base of an LED, a contact, a backplane, etc.), including a plurality of epitaxial layers such as a first n-layer, a first p-layer, and a first active layer. A second flat region at a second height from the first reference point and that is different than the first height (e.g., the first flat region may be 10 micrometers higher than the second flat region) and parallel to the first flat region includes at least a second n-layer. Sloped sidewalls connect the first flat region and the second flat region and include at least a third n-layer. The p-layer of the first flat region is thicker than at least a portion of the sloped sidewalls. A p-contact is formed on the first p-layer and an n-contact is formed on the second n-layer.

Techniques and devices are disclosed that include a patterned substrate having a patterned region forming mesas with non-patterned surfaces, and sloped sidewalls extending from the non-patterned surfaces toward a bottom surface of the patterned substrate. A continuous epi layer is on the patterned substrate, the continuous epi layer comprising an n-layer adjacent the patterned substrate, a p-layer, and an active layer positioned between the n-layer and the p-layer, the continuous epi layer having a first portion, a second portion and a third portion, the first portion positioned adjacent to the non-patterned surfaces of the mesas, the second portion positioned adjacent the bottom surface, and a third portion positioned adjacent the sloped sidewalls, the third portion having a thickness less than a thickness of the at least one of the first portion and the second portion, p-contacts electrically coupled to the first portion of the epi layer, n-contacts electrically coupled to the second portion of the epi layer and extending vertically from the second portion of the epi layer toward a plane extending laterally from the non-patterned surface of the mesas, insulating material positioned between the third portion of the continuous epi layer and the n-contact.

Techniques, and devices are disclosed that include an array of light emitting diodes (LEDs), that include a backplane, a plurality of LEDs, such that each LED includes an n-contact and a p-contact electrically coupled to the backplane, a plurality of pockets having a base layer and a top layer connected via a sloped sidewall layer extending from the base layer outwardly and away from the backplane, the base layer, the top layer and the sloped sidewall layer comprising a light emitting active region, the sloped sidewall layer is thinner than at least one of the base layer and the top layer. The n-contact may extend vertically from the backplane towards a plane extending laterally from the top layer of the plurality of pockets, the n-contact surrounding the base layer and the top layer and providing optical isolation between adjacent LEDs of the plurality of LEDs. A p-contact may be electrically coupled to the base layer, and an insulating material may be positioned between the n-contacts and the p-contacts attached to the plurality of pockets.

BRIEF DESCRIPTION OF THE DRAWINGS

A more detailed understanding may be had from the following description, given by way of example in conjunction with the accompanying drawings wherein:

FIGS. 5A-5L illustrate a monolithic LED array e.g., Thin Film Flip Chip (TFFC) at various stages of the workflow;

FIG. 6B illustrates a method of producing a light emitting device (LED) having epitaxy layers;

FIG. 6C illustrates another method for producing a light emitting device (LED) having epitaxy layers;

FIGS. 7A-7I illustrate a monolithic LED array e.g., Vertical Injection Thin Film (VTF) at various stages of the workflow;

FIGS. 25A and 25B illustrate a monolithic array of substrate-on LEDs that do not require pick and place.

DETAILED DESCRIPTION

Figure 1A:
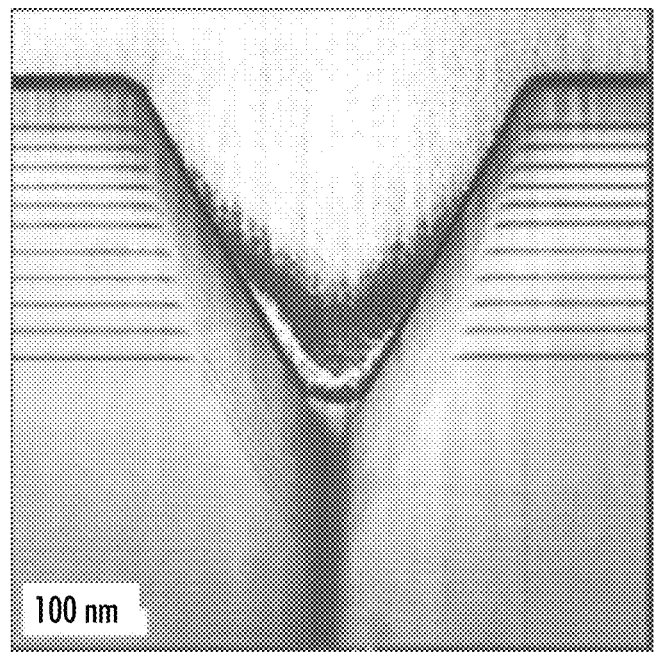
FIG. 1A (from Chang C-Y., Li H. and LU T-C., Compound Semiconductor, Vol. 21, Issue VII, p 48-52, 2015) illustrates a variation of epitaxial growth rate on different crystallographic planes for a V-pit for InGaN multi-quantum wells, and correlation to epitaxial structure on patterned substrates.

Typical benefits of LEDs compared to competing light sources include increased efficiency, longer lifespan and adaptability to a large variety of form factors. One type of LED that exhibits leading efficiency and lifespan is an inorganic semiconductor-based LED, hereafter simply referred to as LED. In this type of LED, the diode typically includes one or more semiconductor-based quantum well light-emitting layers sandwiched between thicker semiconductor-based outer layers conducting the current.

An emerging application of LEDs is in directly illuminated displays, where the increased efficiency and longer lifespan of LEDs makes the LEDs an attractive replacement for organic LEDs (OLEDs), which are the current dominant technology. The high luminous efficacy of LEDs (lumens per watt; >100 Lm/W) allows for lower power consumption usage compared to OLEDs, as well as reduced heat generation. The reduction in heat, in conjunction with the increased chemical stability of inorganic LEDs compared to OLEDs improves the relative lifetime of a corresponding display. Similarly, the higher efficacy of inorganic LEDs allows for a smaller chip area to achieve a given system brightness, which reduces cost compared to an OLED array. This is particularly applicable to large area displays such as monitors. In order to deploy LEDs for high density display applications or for large area, medium density applications, the LED unit is desired to have characteristic dimensions (e.g., height, width, depth, thickness, etc.) of less than 100 micrometers with typical values of less than 50 micrometers, less than 25 micrometers, including a range of 1.5 to 25 micrometer, and all subranges therebetween. This class of LEDs is commonly referred to as micro-LEDs (uLEDs). The embodiments disclosed herein may generally be applied to uLEDs with characteristic dimensions of less than 100 micrometers, though it will be understood that the embodiments are not limited only to uLEDs.

As the dimensions of LEDs are reduced to below 100 micrometers, it is expected that luminous efficacy may suffer additional losses compared to LEDs with characteristic dimensions of 100 micrometers or larger. The main reason is that in a typical LED process, an etch cutting through the epitaxial active region borders the electrically active part of the device. Defects at the etched sidewall accelerate non-radiative carrier (electron and hole) recombination where heat is generated instead of light. Also, the defects can compensate p-type material, converting the layer to n-type and creating a path for leakage currents. In either case, what is known as the sidewall or edge effect creates an inefficient border area. As device dimensions and drive currents decrease, the impact of the sidewall or edge effects increase. For example, in AlInGaP devices, non-radiative centers at the die edge may reduce light emission over a range of order of 5 micrometers, so a 50 micrometer device might suffer a 20% deficit in efficiency, while a 15 micrometers device would suffer a greater than 50% deficit in efficiency.

Attempts have been made to passivate the sidewalls to reduce or eliminate recombination that typically involve deposition of passivation layers including certain epitaxial layers and dielectric layers. These attempts, however, can lead to larger manufacturing complexity, higher cost and less flexibility in layout design of LED devices. In addition, the effectiveness of proposed passivation layers has not been established conclusively, as it depends on the interaction between the LED active region and the deposited passivating material. It is not clear, for example, to what extent the passivating material prevents carrier transport to the sidewall.

One or more embodiments described herein address the aforementioned luminous efficacy loss mechanism and are based upon established carrier transport physics that is independent of the dimension of the LED. In addition, one or more embodiments allow for economical fabrication of LEDs and flexibility in fabrication of monolithic LED devices (e.g., displays) from a wafer. One or more embodiments described herein advantageously exclude a passivation layer on sidewalls (e.g., sloped regions). In one or more embodiments, the sidewalls or sloped regions exclude a dielectric layer.

When using traditional techniques for fabricating LED displays, it is commonly understood that each LED die or group of LED dies are transferred to a backplane such as a thin film transistor (TFT) backplane by pick-and-place methods. The backplane may be configured to individually address each of a plurality of LEDs in an array of LEDs, and may be configured such that that at least one of: a color temperature, an intensity, or a source pattern for each LED are adjustable via the backplane (e.g., if the plurality of LEDs are configured to emit white light). When the display resolution and size increase, the number of transferred dies increases. The cost to fabricate HD or 4K display panels, requiring millions of die transfers, becomes too high to realize commercially viable products. Direct emission LEDs may be difficult to fabricate because of the requirements for uniform emission wavelength and minimal color shift with drive current. Red emitting LEDs based upon AlInGaP may suffer from temperature sensitivity of efficiency.

As used herein, a "patterned body" is a structure having patterned regions and non-patterned regions. In an embodiment, the patterned body is a patterned substrate; exemplary substrates are: sapphire, silicon, silicon carbide, GaN and GaAs substrates. In an embodiment, the patterned body is a patterned template; exemplary templates are n-layers. In an embodiment, the patterned body is a combination of a patterned substrate and a patterned template. In an embodiment, the patterned body is a combination of a planar substrate and a patterned template. According to one or more embodiments disclosed herein, a plurality of LEDs may be formed at a wafer level (e.g., by growing on a patterned substrate such as, for example, a patterned sapphire substrate (PSS), or n-layer, as disclosed herein) and additional material or components (e.g., phosphor material, secondary optics, etc.) may be deposited into or over pockets of each individual LED prior to the plurality of LEDs being bonded to a backplane. Alternatively, the plurality of LEDs may be formed at a wafer level and additional material or components may be deposited into or over pockets of each individual LED after the plurality of LEDs have been bonded to a backplane. Notably, in accordance with one or more disclosed embodiments, a group of LEDs prepared on a patterned body may be bonded to an LED backplane as an alternative to implementing a pick-and-place technique. According to an embodiment, a plurality of LEDs may be formed at a wafer level and may be bonded to a backplane prior to etching or otherwise separating the plurality of LEDs on the backplane into a smaller array of LEDs. According to another embodiment, a plurality of LEDs may be formed at a wafer level and may be etched or otherwise separated into a smaller array of LEDs after being bonded to a backplane.

Embodiments described herein include: a single color monolithic micro display (e.g., a red, a green, or a blue), a direct emission display, or a monolithic full color display that eliminates the costly die-transfer and simplifies the fabrication process. As an example, a direct emission display comprises an array of LEDs, whose active layers directly emit light, and may not include a phosphor converting element as part of one or more LEDs within the array of LEDs. Also, with respect to phosphor-converted LEDs, monolithic Thin Film Flip Chip (TFFC) or Vertical Injection Thin Film (VTF) arrays may be less challenging to manufacture because the requirements on wavelength uniformity and wavelength shift with drive current are reduced, and the growth of uniform, high efficiency, low droop epitaxies with less wavelength shift is easier in the near-UV (NUV) (e.g., approximately 400 nm wavelength), blue (e.g., royal blue at approximately 450 nm), or like emission. The growth of NUV, blue, or like emitting epitaxies is known to be less challenging than, for example, green emitting epitaxy. According to embodiments disclosed herein, an LED structure (e.g., uLED structure) including a plurality of LEDs, where adjacent LEDs are separated by streets (e.g., "S" of FIG. 1B), may be segmented from a wafer of a larger number of fully or partially formed LEDs. Although limited to relatively small physical dimensions, the described embodiments may enable commercialization of display panels of greater than 4K resolution, in a compact form factor suitable for Virtual/Mixed/Augmented Reality hardware, projectors, and high end wearables. The provided display may be a thin film device limited in flexibility by the TFT backplane and may support flexible or curved displays. Finally, coupling of optical elements may be done in an efficient parallel fashion with, for example, over-molding.

Figure 5A:
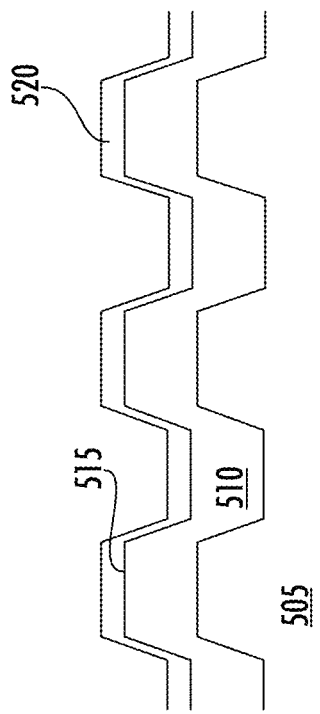

Embodiments described herein include light emitting devices, such as LEDs, that can be implemented in a color display and that include a semiconductor structure that has a plurality of epitaxial layers. The epitaxial layers may include one or more of an n-layer, n-layer growth or regrowth, p-layer, active layer, electron blocking layer, setback layer, and the like. The semiconductor structure of a light emitting device may include a first flat portion, a second flat portion recessed from and parallel to the first flat portion, and a sloped sidewall that connects the first flat portion to the second flat portion. According to one or more embodiments, the light emitting device may include an array of LEDs that are formed using a patterned substrate that has a patterned region forming mesas with a bottom surface and sloped sidewalls extending from the bottom surface toward a non-patterned surface of the patterned substrate. For example, FIG. 5A shows a patterned substrate 505 that includes a patterned region 502 and non-patterned region 501. The patterned region 502 includes a bottom surface 503a (or second flat region), and sloped sidewalls 503b. The non-patterned region 501 includes the non-patterned surface 503c (or first flat region) which is connected to the bottom surface via the sidewall 503b. As applied herein, a first flat region may be referred to as a non-patterned surface (e.g., single LED) or non-patterned surfaces (e.g., array of LEDs) and a second flat region may be referred to as a bottom surface, and vice versa. The resistivity of the sidewall junction may be at least 10 times greater than the resistivity of the junction between the top and base layer.

Figure 5B:
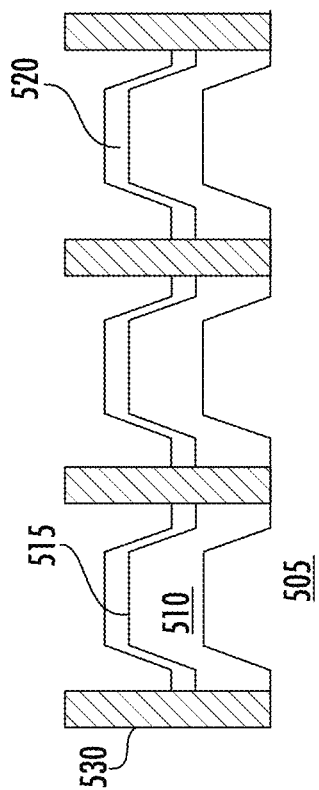
Figure 5C:
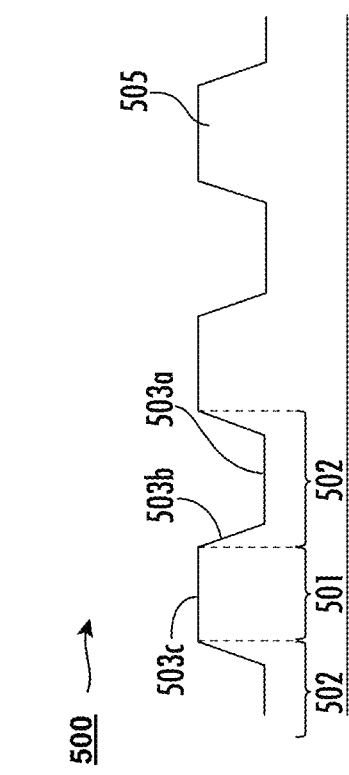
Figure 5D:
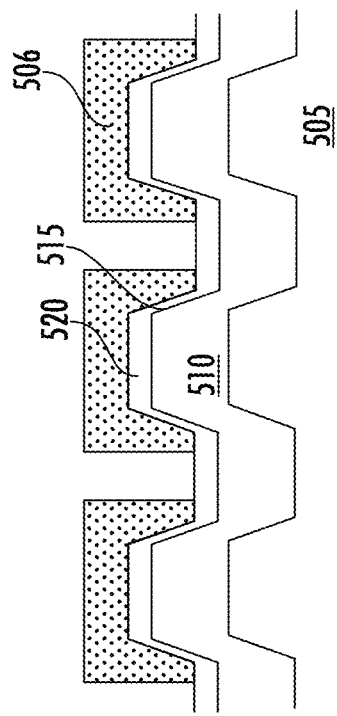

A first flat portion may be at a first height relative to a reference point (e.g., from a backplane, from a contact, from an LED layer or component) and the second flat portion may be at a second height relative to the same reference point. The difference in the first height and the second height may be between 1 micrometers and 50 micrometers according to an implementation and between 1 micrometers and 10 micrometers according to another implementation. For example, the top of a first flat portion may be at a height of 13 micrometers from the middle of a backplane and the top of a second flat portion may be at a height of 8 micrometers from the middle of the same backplane such that the difference in height between the first flat portion and the second flat portion is 5 micrometers. According to embodiments, the thickness of an n-layer in the first region may at least approximately equal the thickness of the n-layer in the second region plus the difference between the height of the first flat region and the height of the second flat region. According to embodiments, the first flat portion may be vertically offset from the second flat portion such that a line extending vertically from the second flat portion would not intersect with the first flat portion and vice versa. According to an embodiment, the first flat portion may be shaped as a polygon as shown in FIG. 5L. According to an embodiment, the first flat portion may have a thickness between 1 micrometers and 50 micrometers.

Epitaxial layers in the sloped sidewall may have a thickness that is less than 80% of their corresponding thickness of the first flat portion and/or the second flat portion. Reference herein to thickness means a thickness orthogonal to an underlying surface, for example, a flat portion or sloped sidewall. For a given doping level, the electrical resistance of the p-layer is inversely proportional to the layer thickness, thus the reduction of thickness of the p-layer in the sloped region increases electrical resistance and reduces parasitic hole leakage currents between the first flat portion and the second flat portion or sloped sidewalls. For example, a 50% reduction in thickness may increase the resistance by 200% and reduce parasitic hole currents by a factor of 2. Similar reduction of the thickness of the quantum well (QW) active region in the sloped sidewall will increase the energy bandgap of the crystal in that region. The higher energy bandgap will create an energy barrier and restrict carriers to the first portion. It shall be noted that "restrict" may result from choaking or blocking of carriers as applied in this disclosure. For example, a 50% decrease in QW thickness may increase the energy bandgap by ~75 meV and provide effective confinement. A second effect of the thinner QW active region is to increase the forward voltage of the p-n junction in the sloped sidewalls. Parasitic hole currents that flow from the first region to the sloped sidewall will be blocked from flowing through the p-n junction in the sloped sidewall. The combined effect of thinner p-layer and QW active region in the sloped sidewall may effectively cause greater than 90% of a forward bias hole injection to be confined to the first flat portion of an LED. According to embodiments, the height of the sloped sidewall may be between 1 micrometers and 10 micrometers and the angle created by the first flat region and the sloped sidewalls may be between 45 degrees and 160 degrees. The sloped sidewalls may at least partially or fully surround the first flat region of each LED and the second flat region may at least partially surround the sloped sidewalls.

According to embodiments, the height of the sloped sidewalls may be between 1 micrometers and 10 micrometers, and the angle created by the first flat region and the sloped sidewalls may be between 45 degrees and 160 degrees. The sloped sidewalls may at least partially or fully surround the first flat region of each LED and the second flat region may at least partially surround the sloped sidewalls.

In accordance with embodiments described herein, a patterned body, e.g., a patterned template or substrate, such as the patterned substrate shown in FIG. 5A is provided and combined with appropriate growth conditions to modify the epitaxial layer structure on the semi-polar crystal planes present at the device sidewalls. A resulting polygonal array of LEDs based on the patterned substrate is shown in 5L. Specifically, the growth rate on the sloped sidewalls is greatly reduced relative to low index planes. With appropriate epitaxial structure design, p-side carrier transport along the sidewalls is blocked because of high electrical resistance and increased bandgap while n-side lateral current flow is maintained. Current injection is intrinsically limited to the first flat region (e.g., non-patterned region) via the reflective p-contact and p-side leakage currents from p to n-contact are pinched off. Post-growth processing steps normally required to isolate the current injection and passivate the damage of isolation etching are eliminated. Cost saving and a reduction in scale of the devices are realized since each lithography step/thin film layer requires some lateral spacing to accommodate edge effects, misalignment, and runout. Therefore, in accordance with embodiments disclosed herein, light emitting devices having a lateral extent of less than 10 micrometers may incorporate epitaxial structures greater than 5 micrometers thick. Standard processing techniques may not be practical for fabricating devices having an aspect ratio greater than 2. As an example, with the proposed embodiments, fabrication LEDs with two light-emitting junctions and a tunnel junction disposed in between, and having a less than 10 micrometers lateral extent, maybe realized. Further, the phenomenon of reduced sidewall growth rate is analogous to that observed in MOCVD growth of InGaN LEDs on surfaces containing V-pits.

FIG. 1A (from Chang C-Y., Li H. and LU T-C., Compound Semiconductor, Vol. 21, Issue VII, p 48-52, 2015) illustrates variation of epitaxial growth rate on different crystallographic planes for a V-pit for InGaN multi-quantum wells, and correlation to epitaxial structure on patterned substrates. The TEM in FIG. 1A clearly shows the differences in growth rates between crystallographic planes. In the TEM image, the top part of an epitaxially deposited InGaN where the V-pit feature that is formed on the underlying material is decorated on its sidewalls. The thickness of the dark layers decreases dramatically on the inclined sidewalls of the V-pit feature. The patterned body (e.g., substrate and template) designs herein leverages the same effect to produce the thin sidewall layers in the context of deposition of epitaxial layers for uLEDs discussed above. An advantage of this technique is the elimination of a need to passivate sidewalls.

Figure 1B:
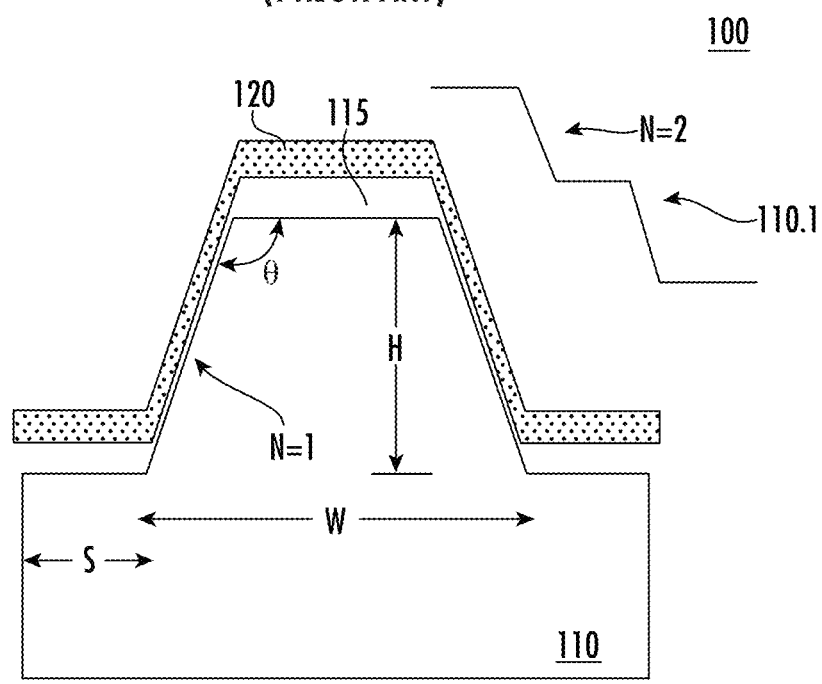
FIG. 1B illustrates a LED growth/regrowth with thinner deposition on a sidewall of a patterned template.

FIG. 1B illustrates a LED 100 growth/regrowth with thinner deposition on a sidewall of a patterned template. LED 100 growth/regrowth may be grown on a patterned substrate (not shown) or template (e.g., n-layer) 110. As depicted in FIG. 1B, the number of steps in the patterned n-layer 110 may be N=1. A depiction of a patterned n-layer with N=2 is shown as n-layer 110.1. The pattern may include a width w, street width s, a height h, and an angle φ. Width w may be defined as the width of the pattern at its base. Width w may range from (or be approximately) 1-50 micrometers. Height h may be defined as the height from the base to the top of the pattern. Height h may range from (or be approximately) 1-10 micrometers. Street width s may be defined as the amount of the n-layer 110 (or substrate if the substrate is patterned) that does not include the pattern on it. Street width s may be equal on the sides of the pattern for patterns that are centered, or approximately centered, with n-layer 110. Street width s may range from (or be approximately) 1-5 micrometers. The angle the top of the pattern of n-layer 110 creates with the sidewall of the pattern may be defined as angle φ. Angle φ may range from (or be approximately) between 45 degrees and 160 degrees.

On the patterned n-layer 110, there may be an epitaxially grown p-layer 120. This p-layer 120 may take the shape of the patterned n-layer 110 and may maintain a thinner deposition on the sidewall. In between n-layer 110 and p-layer 120 is an active layer 115. A silicone encapsulant and/or an epoxy encapsulant may be provided on the second flat portion of the n-layer and/or a light converting phosphor, as further described herein.

The described embodiments can be implemented with sapphire, silicon, silicon carbide, GaN and GaAs substrates or through patterning (n-layer) templates (for example by electron beam lithography) deposited directly on them (in this case, either patterned or planar). Material deposition can be accomplished with established methods for macroscopic LEDs, such as, but not limited to MOCVD, MOVPE, HVPE MBE, RPCVD, Reactive and Non-reactive Sputtering. For example, one can use direct MOCVD growth on the substrate or in conjunction with different deposition technologies, such as reactive sputtering or PVD, to prepare the surface for epi nucleation (for example, aluminum nitride). Moreover, the resulting epitaxial structures are compatible with standard semiconductor processing steps, such as electrical contact formation, optical isolation layers (for example, silicon nitride, silicon oxide, titanium oxide, etc.), growth substrate removal, and interconnects (electroplating, evaporation, etc.). The final result may be singulated element LEDs for large area displays with sparse arrays or arrays (e.g., highly dense monolithic) for compact displays which may include LEDs that are single color, multi-color, or direct emission. Arrays of LEDs may be shaped in any applicable manner including rectangular arrays, circular arrays, hexagonal arrays, trapezoidal arrays, or any other configuration including those that do not form a pre-determined shape.

The techniques described herein may be implemented by forming all or part of a plurality of LEDs as a wafer of LEDs that are formed and singulated to generate arrays of LEDs. For example, a wafer of 1000 LEDs may be formed and singulated to form a subset array of LEDs to be implemented in a 4 inch by 6 inch display. The LEDs in the subset array of LEDs may all emit light in the same range of wavelength or, alternatively, the subset array of LEDs may include sets of LEDs that emit different wavelengths (e.g., the subset array of LEDs may include a plurality of red, green, and blue LEDs). According to embodiments, an array of LEDs may be singulated from a wafer, and the first flat regions (i.e., top flat regions) of the LEDs in the array may form a regular array of similar polygons with periodicity between 4 micrometers and 40 micrometers, each polygon having a lateral extent between 2 and 100 micrometers. According to embodiments, the first flat region may be shaped as a prism having a lateral extent between 2 micrometers and 100 micrometers and a thickness between 1 micrometers and 50 micrometers.

The described embodiments do not limit the variety of substrate patterns and patterning technologies that can be used. They are compatible with wet-etch or dry etch processes, electron beam lithography amongst others. They can also benefit from multilevel patterning technologies, especially those that can be fabricated in a self-aligned way, e.g., using lithography through deposition of different thickness resists to control etch rates. They are compatible with and can benefit from, when necessary, selective etching to further isolate edge/sidewall of the active region from the p-side/n-side. An active region as applied herein may be any applicable active region such as a homo junction, double junction, hetero structure junction (e.g., a first material is a different bandgap than a second material), double hetero structure junction, a single quantum well, a multiple quantum well, or the like.

Figure 2A:
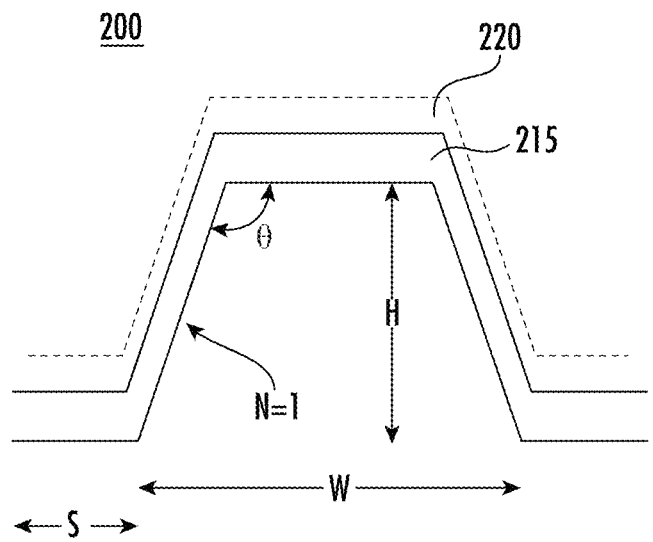
FIGS. 2A and 2B illustrate a LED growth/regrowth on a patterned template.
Figure 2B:
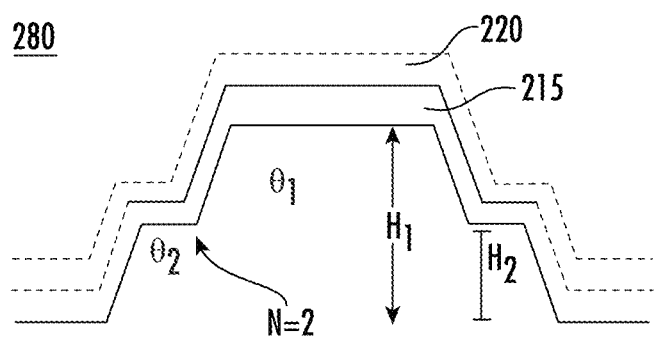

Generally, the disclosed embodiments are based upon growth of an LED structure on a patterned body such as a patterned template deposited on a planar substrate, or growth on a patterned substrate. By way of example, FIGS. 2A and 2B illustrate a LED growth/regrowth on a patterned template. FIG. 2A illustrates a LED 200 growth/regrowth with N=1 and FIG. 2B illustrates a LED 280 growth/regrowth with N=2. Referring now to either, or both, of FIGS. 2A and 2B, a substrate 205 is utilized. Substrate 205 may take the form of planar sapphire, GaN, Si, SiC, GaAs, for example. Substrate 205 may have deposited thereon an n-layer 210. The n-layer 210 may be deposited as an initial template layer for the shape and structure desired. For example, the layer may include a width w, street width s, a total height h and a lower level light $h_2$, and an upper angle $\varphi_1$, and lower angle $\varphi_2$. While the present examples illustrate each shoulder width as identical, such a configuration is not required. FIG. 2A illustrates a single step, while FIG. 2B illustrates a dual step. In essence, n-layer 210 may be patterned by varying any variable include height h (e.g., between 1 micrometers and 10 micrometers), width w, street width s, number of steps n and angle φ (e.g., between 45 degrees and 160 degrees) to achieve a desired shape. While each of FIGS. 2A and 2B generally show a trapezoidal pattern with a squared shape, the perimeter shape may be from circular to polygonal, symmetric or elongated.

An active layer 215 may be deposited on n-layer 210 taking the shape and form of n-layer 210 including height h, width w, street width s, number of steps n and angle φ. Active region 215 may be formed as a layer, also referred to as a cavity, and may take the form of a layer of pGaN. As would be understood by those possessing an ordinary skill in the pertinent arts, GaN is a binary III/V direct bandgap semiconductor commonly used in light-emitting diodes. GaN has a crystal structure with a wide band-gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN.

A p-layer 220 may be deposited on active layer 215 taking the shape and form of the active layer 215 including height h, width w, street width s, number of steps n and angle φ. A p-layer 220 may be replaced with a tunnel junction layer, which consists of heavily Mg doped p++-layer and heavily Si-doped n++-layer. The tunnel junction layer may result in an epitaxial structure that includes a junction n-layer, a second active layer, a junction p-layer, a tunnel junction disposed above a structure including at least a p-layer, a first active layer, and an n-layer such that the tunnel junction layer faces the p-layer. Replacing high resistance p-GaN layer with low-resistance n-GaN layer enables facile formation of ohmic contact and improved current spreading, and therefore a reduced contact metal footprint. The resulting epitaxial structure is compatible with the semiconductor fabrication process described herein.

Figure 3:
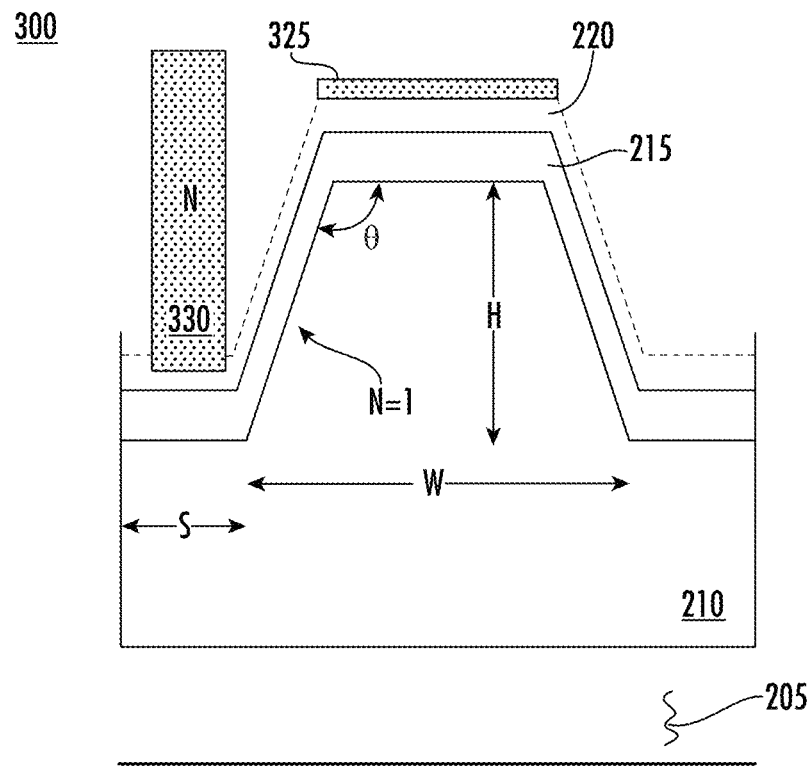
FIG. 3 illustrates the LED of FIG. 2A with added P- and N-contacts.

FIG. 3 illustrates a LED of FIG. 2A with p-contact and n-contacts. LED 300 includes the elements of LED 200 including n-contact 330 and p-contact 325. N-contact 330 may be formed by exposing n-layer 210 and forming the n-contact 330 thereon. P-contact 325 may be formed on p-layer 220. It will be understood that any contact described herein may include any applicable conductive material (e.g., silver) and may be positioned adjacent to and/or in connection with an indium tin oxide (ITO) layer. For example, an ITO layer may be provided between a contact and a backplane. Further, as a specific example, an n-contact as disclosed herein may be fully or partially composed of an aluminum or aluminum alloy.

Figure 4:
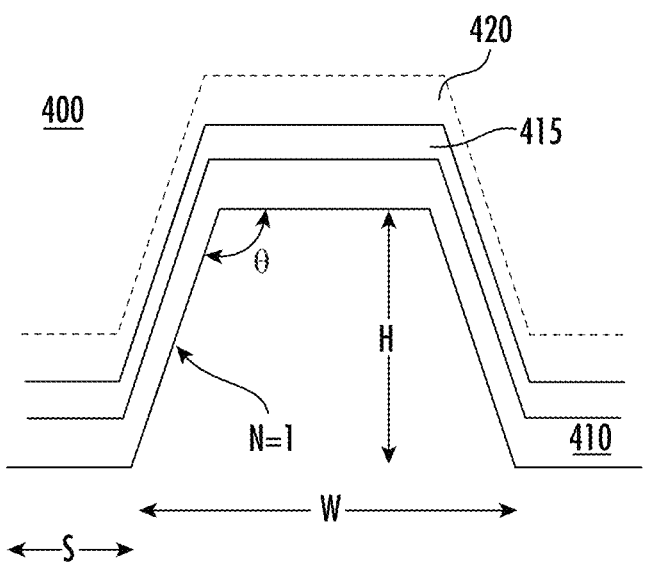
FIG. 4 illustrates a LED deposition on a patterned substrate.

FIG. 4 illustrates a LED 400 deposition on a patterned substrate 405. Substrate 405 may be formed of sapphire, GaN, Si, SiC, GaAs, for example. As with the n-layer in the previous example, the substrate 405 may be patterned by varying any variable including height h, width w, street width s, number of steps n and angle φ to achieve desired shape and a perimeter shape may vary from circular to polygonal.

The n-layer 410 may be deposited on the patterned substrate 405 taking the shape and form of substrate 405 including height h, width w, street width s, number of steps n and angle φ.

An active layer 415 may be deposited on n-layer 410 taking the shape and form of n-layer 410 including height h, width w, street width s, number of steps n and angle φ imparted from substrate 405.

A p-layer 420 may be deposited on active layer 415 taking the shape and form of active layer 415 including height h, width w, street width s, number of steps n and angle φ imparted from substrate 405. As discussed with respect to FIG. 3, n- and p-contacts may be formed on LED 400.

The embodiments depicted in FIGS. 2-4 are primarily representative LED elements. The mechanism of the patterned body growth may determine the range of shapes and dimensions of light-emitting flat regions (e.g., mesas), non-light emitting sidewall areas, and non-light emitting streets. Reflective p-contacts may cover the mesas, and n-contacts may be formed in the streets as shown in FIG. 3. Reflective design elements such as TiOx-silicone suspensions and non-conductive reflective structures may be employed on the sidewalls to enhance efficiency and optically isolate devices. The body (substrate or template) patterning may include a very fine nanometer scale (sub-micron) patterning (random or periodic) to enhance optical outcoupling into the phosphor layer. A silicone encapsulant and/or an epoxy encapsulant may be provided over the phosphor layer. The roughening may be created after substrate removal by nano-imprint lithography and etching, photo electrochemical etching or similar methods.

Combinations of the growth in forming LED 200 and LED 400 may be used. Combinations of the techniques may be used to achieve desired thickness ratio between flat areas and sidewalls. The thinner sidewalls in each of LED 200 and LED 400, and in techniques that are combined, leverage thinner deposition on sidewall to reduce surface sidewall recombination, improve performance, reduce processing and fabrication cost, and expose n-layer and make n- and p-contacts (similar to FIG. 3). The thinner sidewalls may increase p-side electrical resistance and reduce leakage currents. The thinner QW in the active region may increase the bandgap energy of the sidewall material, creating a hole barrier and restraining recombination to the semiconductor under the p-contact 325. The elimination of process steps to isolate n and p-contact reduces fabrication cost and enables smaller feature size. The latter is a result of fewer lithography steps, which require an offset to accommodate misalignment.

The thinner deposition on the sidewalls in each of LED 200 and LED 400 leverage the thinner deposition on sidewall to create an energy barrier by increasing bandgap (thinner QWs) on sidewall epitaxial layers, increase electrical resistance to current spreading (thinner P-layer), reduce sidewall recombination by blocking hole current flow, improve efficiency by isolating current injection to light emitting region on top of mesa, and reduce processing and fabrication cost.

In an exemplary embodiment, a micrometer scale light emitting diode (uLED) comprises: a plurality of continuous epitaxial layers comprising: a n-layer having a first flat region, a sloped region, and a second flat region; an active layer adjacent to the first flat region of the n-layer and a portion of the sloped region of the n-layer; a p-layer adjacent to the first flat region of the active-layer and a portion of the sloped region of the n-layer; a thickness of the n-layer in the sloped region being less than a thickness of the n-layer in the first flat region or the second flat region or both; and the active layer, or the p-layer, or both the active and p-layers comprise a pinch-off zone within the sloped region; a p-contact on the p-layer adjacent to the first flat region; and an n-contact on the n-layer adjacent to the second flat region. The uLED may include one or more of the following: an absence of a passivation layer on the sloped region; thickness of the n-layer in the sloped region is less than 80% of the thickness of the n-layer in the first flat region or the second flat region or both; thickness of the active layer adjacent to the portion of the sloped region of the n-layer is less than 80% of the thickness of the active layer adjacent to the first flat region of the n-layer; thickness of the p-layer adjacent to the portion of the sloped region of the n-layer is less than 80% of the thickness of the p-layer on the first flat region of the n-layer; an angle created by the first flat region and the sloped region is between 45 degrees and 160 degrees; the first flat region is vertically displaced from the second flat region by a distance; the distance is between 1 µm and 10 µm; at least one layer of light converting phosphor adjacent to the n-layer; at least one characteristic dimension of less than 100 micrometers, the character dimension being selected from the group consisting of: height, width, depth, thickness, and combinations thereof; a body on which the plurality of continuous epitaxial layers is deposited; the body may be: sapphire, silicon, silicon carbide, GaN, or GaAs.

In an exemplary embodiment, a micrometer scale light emitting diode (uLED) comprises: a substrate comprising: a first flat region, a second flat region parallel to the first flat region, a sloped sidewall connecting the first flat region and the second flat region; a plurality of continuous epitaxial layers on the substrate comprising: a n-layer on the entirety of the substrate; an active layer adjacent to a portion of the n-layer; a p-layer adjacent to a portion of the active layer; a thickness of the n-layer on the sloped sidewall being less than a thickness of the n-layer on the first flat region or the second flat region or both; and the active layer, or the p-layer, or both the active and p-layers comprise a pinch-off zone within the sloped region; a p-contact on the p-layer adjacent to the first flat region; and an n-contact formed on the n-layer adjacent to the second flat region. The uLED may include one or more of the following: an absence of a passivation layer on the sloped sidewall; thickness of the n-layer in the sloped sidewall is less than 80% of the thickness of the n-layer in the first flat region or the second flat region or both; thickness of the active layer adjacent to the portion of the sloped sidewall of the n-layer is less than 80% of the thickness of the active layer adjacent to the first flat region of the n-layer; thickness of the p-layer adjacent to the portion of the sloped sidewall of the n-layer is less than 80% of the thickness of the p-layer on the first flat region of the n-layer; an angle created by the first flat region and the sloped sidewall is between 45 degrees and 160 degrees; the first flat region is vertically displaced from the second flat region by a distance; the distance is between 1 µm and 10 µm; at least one layer of light converting phosphor adjacent to the n-layer; at least one characteristic dimension of less than 100 micrometers, the character dimension being selected from the group consisting of: height, width, depth, thickness, and combinations thereof; the substrate may be: sapphire, silicon, silicon carbide, GaN, or GaAs.

Examples of layouts for minimizing footprint and maximizing performance and manufacturability are shown in FIGS. 9-18. The light-emitting mesas may be square, rectangular or other types of polygons. The p-contact is typically the largest of the two contacts since the light generation and active region current injection occur principally under the p-contact. A larger p-contact reduces current density and improves efficiency for most operating currents. The size of the n-contact may be smaller to minimize footprint, however an n-contact around the entire perimeter would reduce the current density and electric field in the sidewall regions, minimizing leakage current and operating voltage.

Figure 5J:
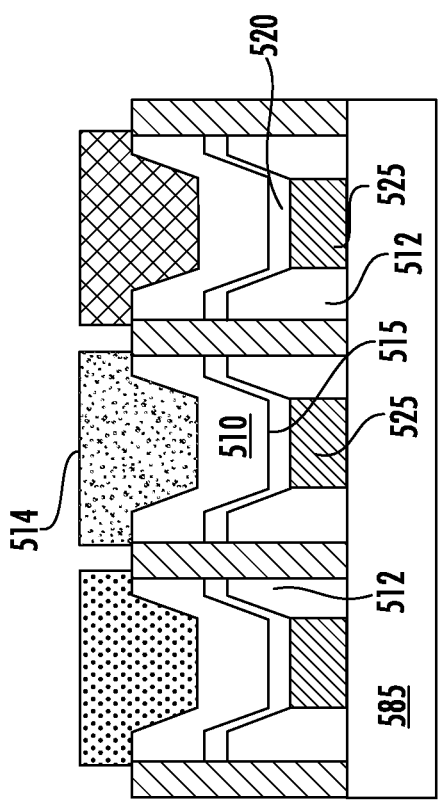
Figure 5L:
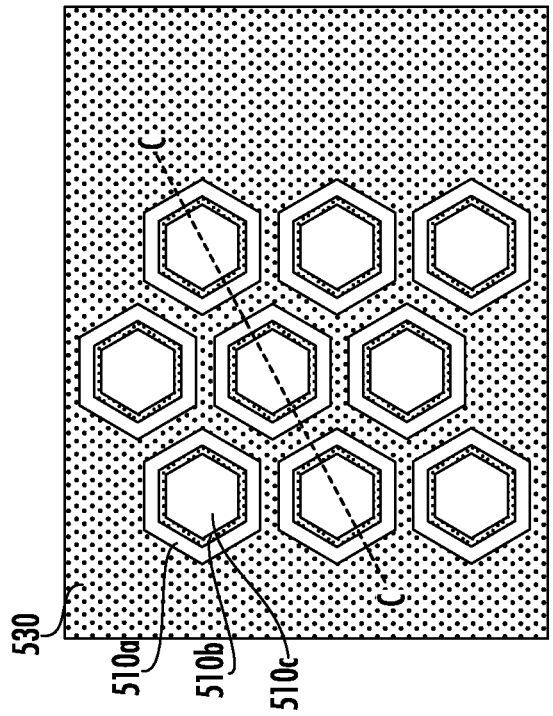
Figure 5I:
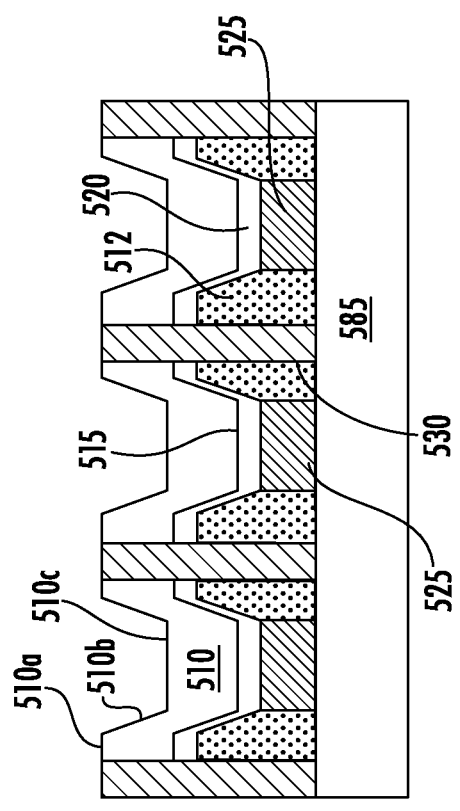
Figure 5K:
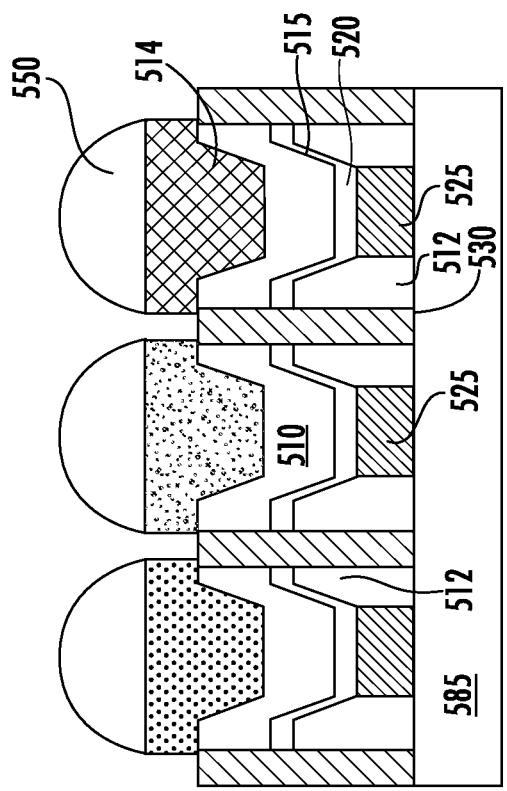
Figure 6A:
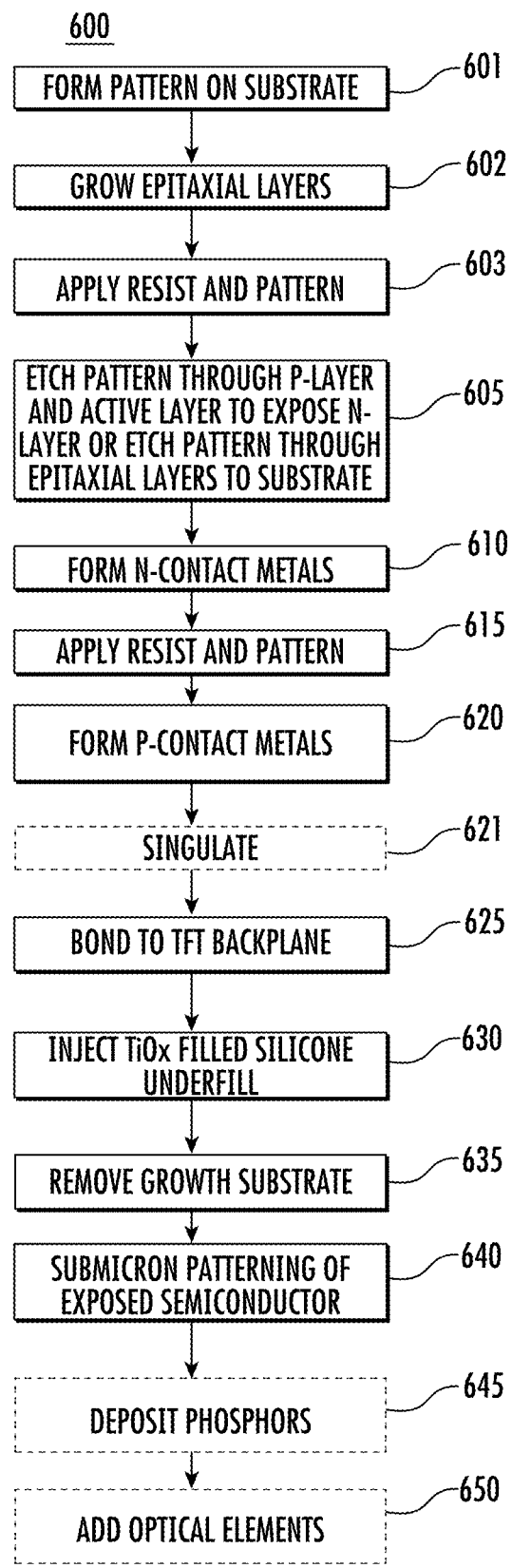
FIG. 6A illustrates a method of producing a monolithic LED array (e.g, TFFC)

FIGS. 5A-L (collectively referred to as FIG. 5) illustrate a monolithic LED array (e.g., Thin Film Flip Chip (TFFC)) 500 at various stages of the workflow and the accompanying FIG. 6A represents the method 600 of manufacturing a monolithic LED array (e.g., TFFC). As shown in FIG. 5, an array of LEDs, e.g., uLEDs, may be generated and each LED may include a first flat region, a second flat region recessed from the first flat region, and slopped sidewalls that connect the first flat region to the second flat region. Notably, epitaxial layers of the sloped sidewalls comprise pinch-off zones in that they have thicknesses less than their corresponding thicknesses on the flat regions. In one or more embodiments, the epitaxial layers in/of the sloped sidewalls may have a thickness that is less than 80% of their corresponding thickness in/of the first flat region and/or second flat region. For a given doping level, the electrical resistance of the p-layer is inversely proportional to the layer thickness, thus the reduction of thickness of the p-layer in the sloped region increases electrical resistance and reduces parasitic hole leakage currents between the first portion and the second or slopped sidewalls. For example, a 50% reduction in thickness may increase the resistance by 200% and reduce parasitic hole currents by a factor of 2. Similar reduction of the thickness of the QW active region in the sloped sidewalls will increase the energy bandgap of the crystal in that region. The higher energy bandgap will create an energy barrier and confine carriers to the first region. For example, a 50% decrease in QW thickness would increase the energy bandgap by ~75 meV and provide effective confinement. A second effect of the thinner QW active region is to increase the forward voltage of the p-n junction in the sloped sidewalls. Parasitic hole currents that flow from the first region to the sloped sidewalls will be blocked from flowing through the p-n junction in the sloped sidewalls. The combined effect of thinner p-layer and QW active region in the sloped sidewalls may effectively cause greater than 90% of a forward bias hole injection to be confined to the first flat portion of an LED.

FIGS. 5 and 6A are discussed in parallel to describe the method of manufacturing a monolithic LED array, e.g., a thin film flip chip (TFFC), and the associated depictions of the monolithic LED array at each stage of the method. The array of LEDs created in accordance with FIG. 5 and FIG. 6A may include, for example, several million uLEDs configured to provide a complete high density RGB display or, alternatively, three to five LEDs that are configured as a full color gamut pixel (e.g., configured to emit the entire range of colors available on a particular device such as a mobile phone, a monitor, or the like). Alternatively, the array of LEDs created in accordance with FIG. 5 and FIG. 6A may be a single color monolithic micro display (e.g., a red, a green, or a blue) such that all or a group of LEDs in the array each emit the same color.

Method 600 includes the formation of a patterned body (e.g., substrate or template) at 601. For illustration purposes, reference is made to a patterned substrate. As shown in FIG. 5A, patterned substrate 505 may be formed with a pattern (generally shown in FIG. 5A) including height h, width w, street width s, number of steps n and angle φ to achieve a desired shape as discussed above with respect to FIGS. 2A-2B, 3, and 4.

At 602 of method 600, the epitaxial growth may be formed having a desired emission wavelength, for example, ranging from infrared to ultraviolet. In an example, a near-UV emission wavelength is desired. As shown in FIG. 5B, the epitaxy may include an n-layer 510, an active layer 515, and a p-layer 520. Each of these layers may be as described with respect to FIG. 4 and may be formed using a technology such as organometallic vapor-phase epitaxy (OMVPE), and/or metalorganic vapor deposition (MOCVD), for example. FIGS. 6B and 6C show exemplary methods of generating light emitting devices (LEDs) having epitaxy layers.

At 603 of method 600, a resist 506 may be applied to the structure. As shown in FIG. 5C, a resist 506 may be applied adjacent to the p-layer 520. Resist 506 may include a pattern in preparation for subsequent steps in method 600.

At 605 of method 600, the epi layer (including n-layer 510, active layer 515, p-layer 520) may be etched to provide access to substrate 505. The n-contact metals may be applied at 610 and may be applied by any applicable manner such as by deposition. As shown in FIG. 5D, n-contacts 530 may be electrically coupled to the substrate 505 based on the etching and deposition. The n-contacts 530 may entirely surround each LED to provide for optical isolation and/or optical reflection of each LED, and may also minimize operating voltage.

At 615 of method 600, a subsequent resist layer 508 may be applied onto p-layer 520 surrounding the exposed n-contact 530. Resist layer 508 may be patterned in order to provide for the subsequent placement of a p-contact layer. In FIG. 5E, resist layer 508 is formed to provide an opportunity for the subsequent placement of a p-contact.

At 620 of method 600, p-contact metals may be deposited by any applicable techniques such as by a lift-off deposition. As illustrated in FIG. 5F, p-contacts 525 may be placed adjacent to p-layer 520. As shown, the wafer may be singulated at step 621 after the p-contact metals are deposited at 620. According to embodiments, if step 621 is not taken after step 620, then the wafer may be singulated after any steps 625-650 of FIG. 6a. The singulation may result in a single pixel (e.g., red, green, blue LEDs) or larger groups of LEDs to create an array.

At 625 and referring to FIG. 5G, the structure may be bonded to a backplane such as the TFT backplane 585 (e.g., a Si TFT backplane). TFT backplane 585 may be coupled to p-contact 525 and n-contact 530 to provide the control and electrical connections to the LED. TFT backplane 585 may be a MOSFET or amorphous Si CMOS, for example. The backplane may be configured to individually address each of a plurality of LEDs in an array of LEDs.

At 630 of method 600, additional optical isolation and/or reflection may be provided by injecting a TiOx-silicone underfill 512 to fill in areas around n-contact 530, p-contact 525 and p-layer 520. Underfill 512 may be worked back to expose bonding metal of the contacts, p-contact 525 and n-contact 530. As illustrated in FIG. 5H, underfill 512 may form a complete structure. TiOx-silicone underfill 512 provides mechanical strength, chemical protection, optical isolation and reflectivity. As shown in FIG. 5H, the n-contacts 530 may extend through the n-layer 510 to the substrate 505. According to another embodiment (not shown), the n-contacts may extend into the n-layer 510 but not through the n-layer 510.

At 635 and as depicted in FIG. 5I, the structure may be inverted and the growth substrate 505 may be removed. FIG. 5I is a cross section of FIG. 5L at the cross line C, and as further disclosed herein. Once removed, n-layer 510 may be exposed. The removal of the growth substrate 505 may create pockets such that a first flat region of the structure is a base of the pocket and the sloped sidewalls of each structure create the sides of the pocket. As further disclosed herein, the pockets may be filled with phosphors 514. The phosphors 514 may all be the same spectral properties for each created LED or different LEDs (e.g., adjacent LEDs) may include different phosphor particles with different spectral properties such that the light emission from such different phosphor particles is different across a set of LEDs. According to an embodiment, an array of LEDs may include a plurality of LEDs that form a RGB display for projection of full color images based at least on different phosphor material deposited in or on a set of LEDs. Alternatively, the pockets may be filed with a high refractive index material, such as in the case of a single color monolithic array. As an example, the high refractive index may have a refractive index greater than 1.5. The structure may include n-layer 510, active layer 515 and p-layer 520, with p-contacts 525 and n-contacts 530 each attached to TFT backplane 585. Although not specifically illustrated in FIG. 5, a submicron patterning of the exposed semiconductor may occur at 640.

The n-contacts 530 may have a height such that they optically isolate two adjacent LEDs. As shown in FIG. 5I, the epitaxial layers may include a first flat region 510a, sidewalls 510b and second flat region 510c.

At 645 and as depicted in FIG. 5J, phosphors 514 may be deposited onto newly exposed n-layer 510 to convert NUV (e.g., approximately 400 nm wavelength), blue (e.g., royal blue at approximately 450 nm), or like light to the desired color emission. The structure may include phosphors 514, n-layer 510, active layer 515 and p-layer 520, with p-contacts 525 and n-contacts 530 each attached to TFT backplane 585. Phosphors 514 may be selected to produce colors such as blue, green and red, for example. A silicone encapsulant and/or an epoxy encapsulant may be provided on the phosphors 514.

At 650 and as depicted in FIG. 5K, optical elements 550 may be added to be optically coupled to phosphors 514. These optical elements 550 may be designed to collimate the emission from phosphors 514, for example. Alternatively, optical elements 550 may be used to manipulate the emitted radiation from phosphors 514 or through high refractive index material (e.g., material with a refractive index greater than 1.5) in others ways, such as focusing, for example. As noted herein, the n-contacts 530 may optically isolate emissions from two adjacent optical elements 550 such that emissions from a first optical element of optical elements 550 does not enter or otherwise interfere with the emission from an adjacent optical element of the optical elements 550 in an adjacent LED.

For completeness, the bottom of the array of LEDs is shown in FIG. 5L. The pattern is looking down on FIG. 5I after the removal of patterned substrate 505. N-contact 530 is shown. N-contact 530 is adjacent to first flat region 510a which surrounds the sloped sidewalls 510b. The first flat region 510a and sloped sidewalls 510b are shown to surround the second flat region 510c. Notably, the n-contact 530 may be positioned and/or have a height that results in optical isolation between two adjacent LEDs.

With the techniques herein, no pixel level singulation is required, so the loss in area associated with scribe streets is avoided. A lateral n-contact may be used to maximize the available light emitting area for a given pitch. The contact metal may extend upwards far enough to provide optical isolation and a "pocket" for phosphor deposition. Alternate methods of enhancing reflection may include providing an inorganic reflector on the non-contact areas of the device. Techniques include physical vapor deposition of dielectric and metal coatings, as well as atomic layer deposition of reflector layers. The precise registration of the patterned substrate may enable phosphor deposition techniques. For example, in an embodiment, quantum dot printing techniques, such as intaglio transfer printing may be used. Other techniques such as, but not limited to, screen printing or micro-molding may also be used to enable the claimed LED device form factors.

The display may be monochrome, built from a single color (ultra-violet, violet, blue, green, red, or infra-red) emitting wafer or a multi-color array built by adding converters such as phosphors and quantum dots to convert the pump light into various color pixels. A combination of direct and PC converted light with three or more colors may be utilized. The size or number of a given color pixel may be adjusted to optimize performance, for example, a large green pixel plus blue and red, or two small green pixels plus blue and red. The present disclosure may remove the requirement of the pick and place process relieving a major source of cost that currently hinders commercialization. It should be noted that the method of FIG. 6A may be modified to fabricate individual red, green, and blue LEDs that are picked and placed in a display device. The n-contact may be made discontinuous to create appropriate scribe streets and the pixels laid out in regular grid. Singulation may occur before 640 of method 600.

Figure 6D:
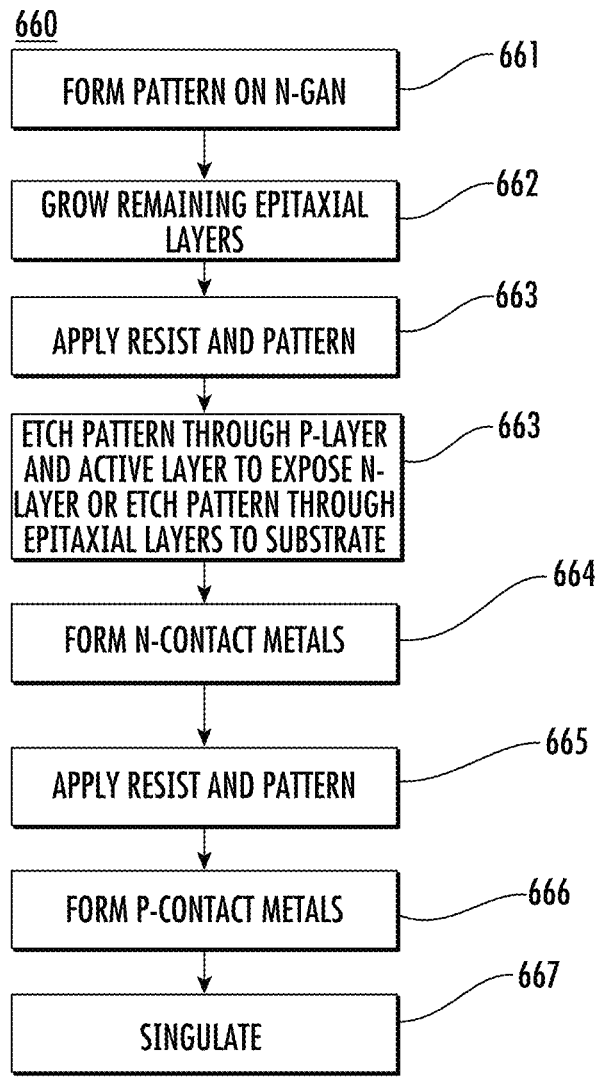
FIG. 6D illustrates another method for producing an LED array.

FIG. 6D shows a process similar to FIG. 6A however instead of a patterned substrate, an n-Gan pattern may be formed at step 661. Remaining epitaxial layers (e.g., p-layer, n-growth or regrowth layer, and active layer) may be grown at step 662. A resist may be applied at step 663, as described in step 600 of FIG. 6A. A pattern may be etched through the p-layer and active layer to expose the n-layer at step 663. N-contact metals may be formed at step 665, and resist may be applied and patterned at step 665. P-contact metals may be formed at step 666 and the wafer may be singulated into a smaller group of LEDs at step 667. It will be understood that the details provided in accordance with FIG. 6A may apply to one or more of the steps recited in FIG. 6D.

FIG. 6B includes a method 680 for producing light emitting devices (LEDs) having epitaxial layers. The LEDs may be generated as a wafer that may be singulated to provide an array of LEDs that may be implemented in a display device such as a color display. At 681 a patterned substrate having mesas with bottom surfaces and sloped sidewalls extending from the bottom surfaces towards a non-patterned surface of the patterned substrate may be provided. FIG. 5F shows an example of first flat regions that are adjacent to p-contacts 525, second flat regions that are in contact with n-contacts 530, and sloped sidewalls that connect the first flat regions to the second flat regions.

In an exemplary embodiment, a method for manufacturing a monolithic light emitting diode (LED) array comprises: growing an epitaxial layer an active layer and a p-layer on a patterned body, the patterned body comprising a patterned substrate and a continuous epitaxial n-layer, or a patterned n-layer on a planar substrate. The patterned body comprises a first plurality of flat regions comprising a first crystallographic plane orientation and being located a first distance from a base of the patterned body, a second plurality of flat regions comprising the first crystallographic plane orientation and being located a second distance from a base of the patterned body, the second distance being smaller than the first distance, and a plurality of sloped sidewalls comprising a second crystallographic plane orientation, such that a portion of the n-layer positioned adjacent to the sloped sidewalls has a thickness less than a thickness of portions of the n-layer adjacent any of the flat regions. A first resist is applied to the epitaxial layer adjacent to the p-layer, the resist being patterned to provide access to the patterned substrate or the planar substrate. N-contact metals are deposited to produce n-contacts electrically coupled to the patterned substrate or the planar substrate. A second resist is applied to the epitaxial layer, the second resist being designed for placement of p-contacts. P-contact metals are deposited to produce the p-contacts electrically coupled to the p-layer to form a plurality of light emitting diodes (LEDs). A thin film transistor (TFT) is bonded backplane to the plurality of LEDs, the bonding causing the p-contacts and n-contacts to provide the electrical connections to the LEDs. An underfill is injected to fill in areas surrounding the p-contacts, n-contacts, and p-layer. The patterned substrate or the planar substrate is removed and the n-layer is exposed, thereby forming a thin film flip chip (TFFC) array. The method may further comprise one or more of: submicron patterning of exposed n-layer; depositing n-contact and optical isolation metals in electrical contact to the n-layer;

depositing a phosphor layer onto the exposed n-layer; and adding optical elements optically coupled to the phosphor layer.

As disclosed herein, one or more epitaxial layers may be grown on different portions of a patterned substrate or n-layer. The difference in growth rates between different flat portions (e.g., first flat portion and second flat portion) may be achieved based on differences in height between the layers, due to the respective distances a reactant diffuses through to reach a given flat layer. For example, a reactant may travel a greater distance to reach a bottom layer than a top layer, resulting in different growth rates. Additionally, differences in growth rates between flat portions (e.g., first flat portion and second flat portion) and the sloped sidewalls may be achieved due to differences in surface energy that affect surface diffusion and kinetics. Notably, the surface orientation of a sloped sidewall may result in a change in growth rate as a reactant may bond with the sloped surface at an angle which affects the bonding process due to the slope. Additionally, the growth rates between surfaces may be affected based on the molecule orientation of the respective crystallographic planes of the layers. For example, an C-crystallographic plane orientation may allow for a faster growth rate in comparison to an A-crystallographic plane orientation or M-crystallographic plane orientation.

Figure 10A:
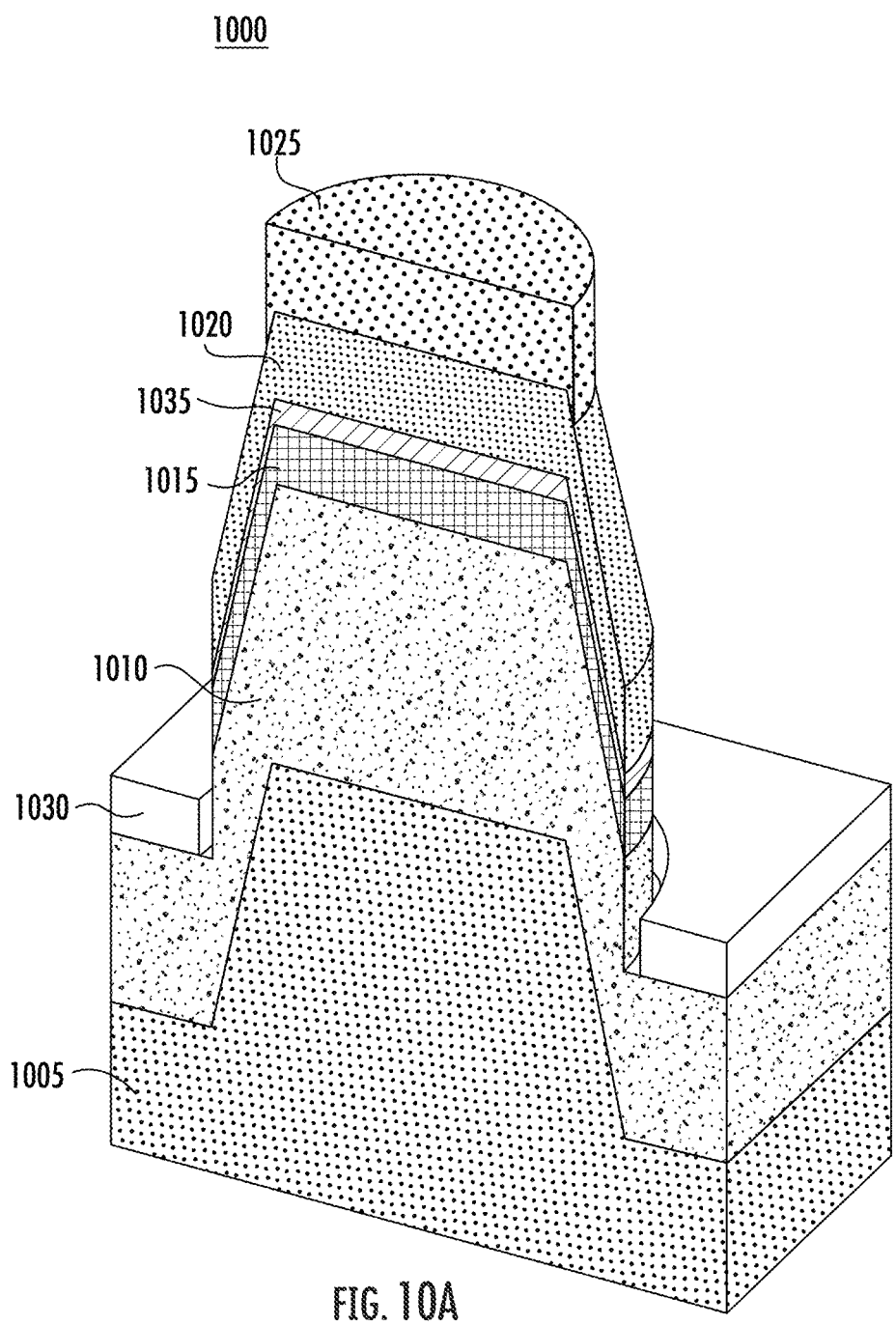
FIG. 10A illustrates a LED structure on a patterned substrate.

At 685, a continuous n-layer, active layer, and p-layer having a first region may be grown over the non-patterned surfaces, a second region over the bottom surface, and a third region over the sloped sidewalls, the third region of the n-layer, active layer, and p-layer having a slower growth rate than the growth rate of the first and second regions of the n-layer, active layer, and p-layer, respectively. The angle of the sloped sidewalls and/or the crystallographic plane orientation may be modified to adjust the growth rate of a given region or sidewall. For example, the crystallographic plane orientation of the sloped sidewalls may result in slower growth rate when compared to the crystallographic plane orientation of the first flat region and/or second flat region. FIG. 10A includes a patterned substrate growth substrate 1005. A semiconductor in accordance with method 680 may be grown on the patterned substrate growth substrate 1005, resulting in the LED 1000.

Epitaxial layers in the sloped sidewall may have a thickness that is less than 80% of their corresponding thickness in the first flat portion and/or second flat portion. For a given doping level, the electrical resistance of the p-layer is inversely proportional to the layer thickness, thus the reduction of thickness of the p-layer in the sloped region increases electrical resistance and reduces parasitic hole leakage currents between the first portion and the second portion or sloped sidewalls. For example, a 50% reduction in thickness may increases the resistance by 200% and reduce parasitic hole currents by a factor of 2. Similar reduction of the thickness of the QW active region in the sloped sidewalls will increase the energy bandgap of the crystal in that region. The higher energy bandgap will create an energy barrier and confine carriers to the first region. For example, a 50% decrease in QW thickness may increase the energy bandgap by ~75 meV and provide effective confinement. A second effect of the thinner QW active region is to increase the forward voltage of the p-n junction in the sloped sidewalls. Parasitic hole currents that flow from the first region to the sloped sidewalls will be blocked from flowing through the p-n junction in the sloped sidewalls. The combined effect of thinner p-layer and QW active region in the sloped sidewalls may effectively cause greater than 90% of a forward bias hole injection to be confined to the first flat region of an LED.

FIG. 6C includes a method 690 for producing light emitting devices (LEDs) having epitaxy layers. The LEDs may be generated as a wafer that may be singulated to provide an array of LEDs that may be implemented in a display device such as a color display. At 691 of method 690, an n-layer having mesas with un-patterned surfaces and sloped sidewalls extending from the un-patterned surfaces towards a bottom surface of the patterned substrate may be provided. The n-layer may be grown over a patterned substrate or may be grown and shaped using any applicable shaping process such as via lithography. FIG. 3 shows an example of first flat regions that are adjacent to p-contacts 325, second flat regions that are in contact with n-contacts 330, and sloped sidewalls that connect the first flat regions to the second flat regions.

Figure 10B:
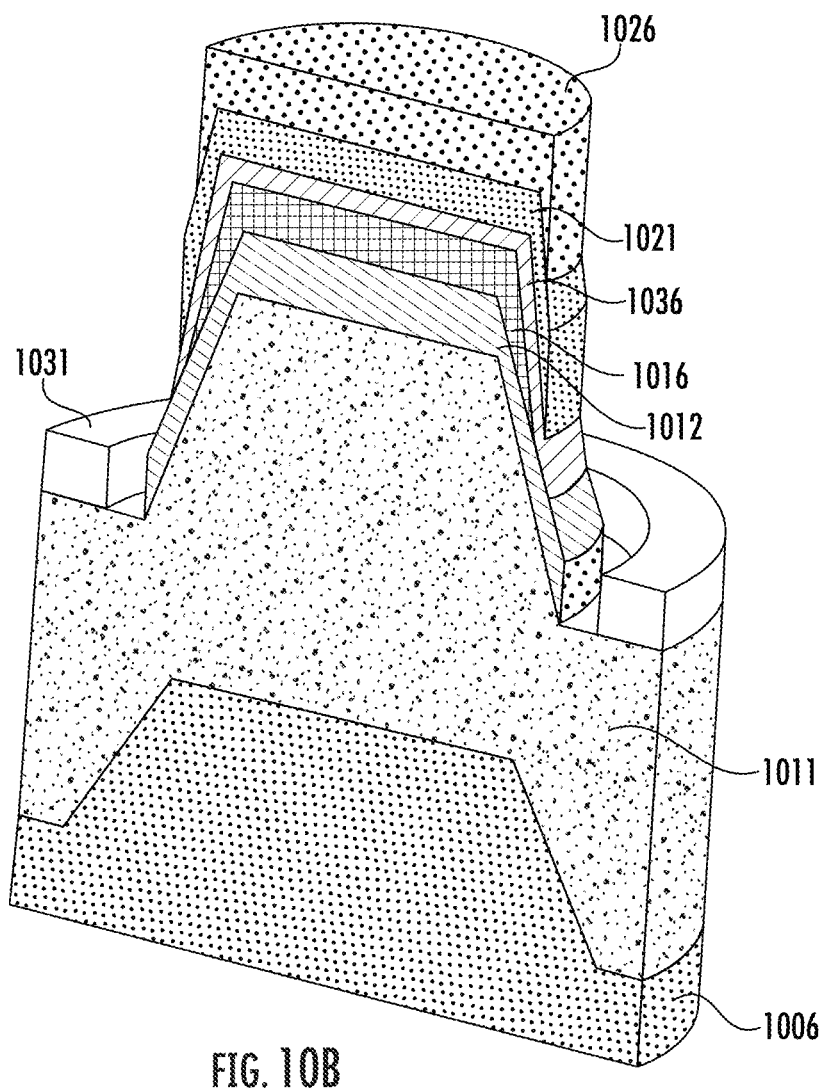
FIG. 10B illustrates a LED structure on a patterned body including both a patterned substrate and patterned n-layer.

At 695, a continuous active layer, and p-layer (and, optionally, n growth or regrowth layer) having a first region over the non-patterned surfaces, a second region over the bottom surface, and a third region over the sloped sidewalls, the third region of the n-layer, active layer, and p-layer having a slower growth rate than the growth rate of the first and second regions of the n-layer, active layer, and p-layer, respectively. The angle of the sloped sidewalls and/or the crystallographic plane orientation may be modified to adjust the growth rate of a given region or sidewall. For example, the crystallographic plane orientation of the sloped sidewalls may result in slower growth rate when compared to the crystallographic plane orientation of the first flat region and/or second flat region. FIG. 10B includes a shaped n-layer 1011. A semiconductor structure in accordance with method 690 may be grown on the n-layer 1011, resulting in the LED 1001.

Figure 7A:
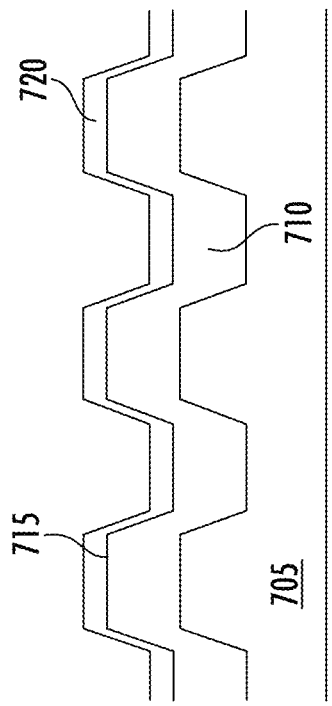
Figure 7B:
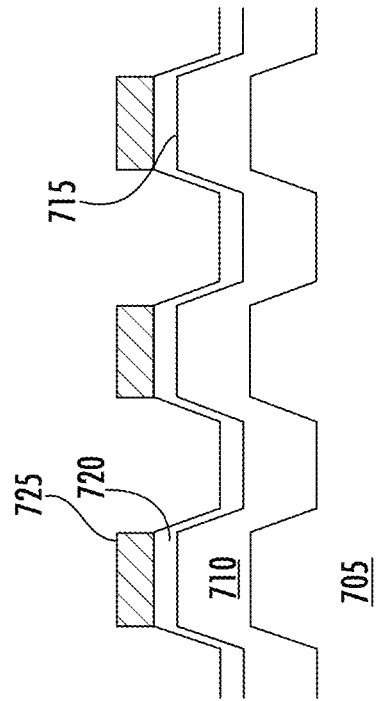
Figure 7C:
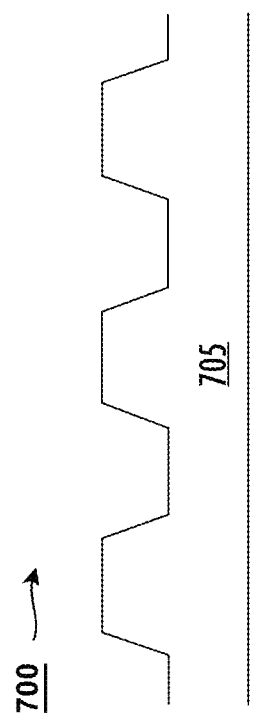
Figure 7D:
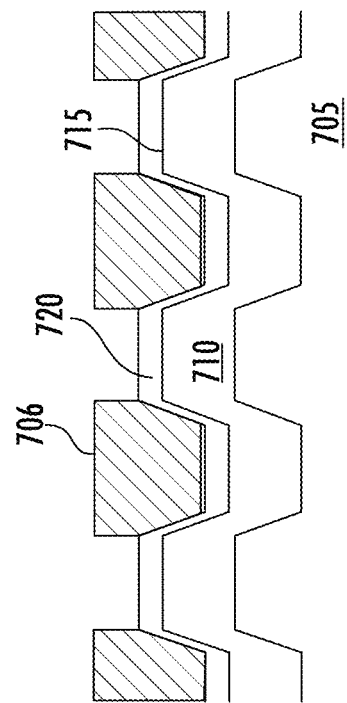
Figure 7E:
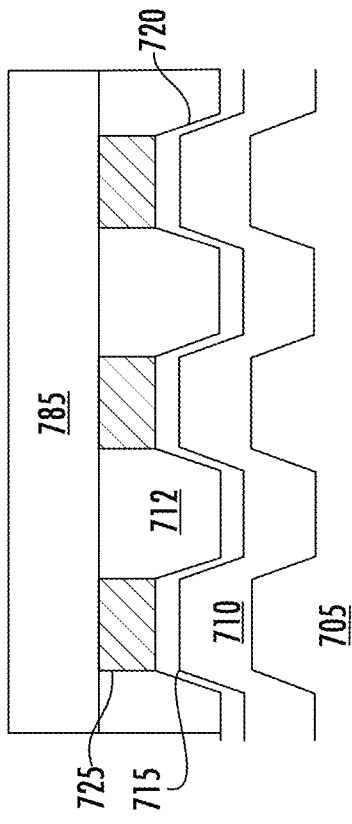
Figure 7F:
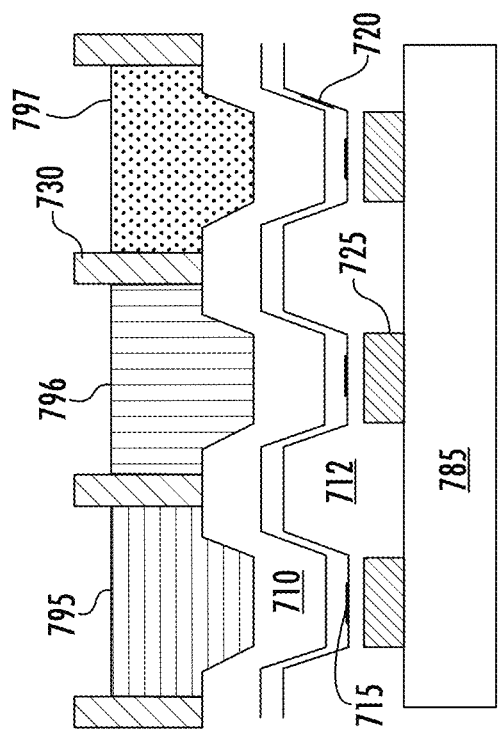
Figure 7G:
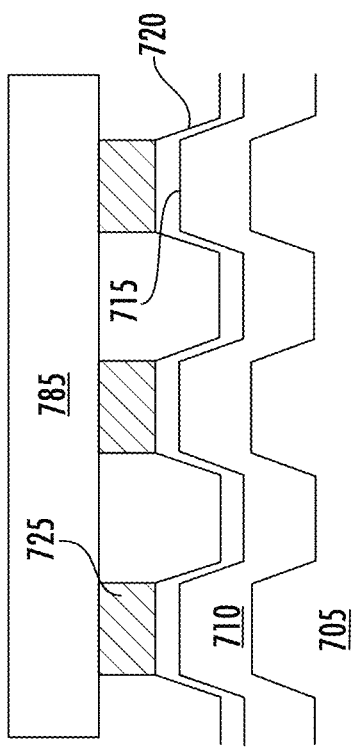
Figure 7H:
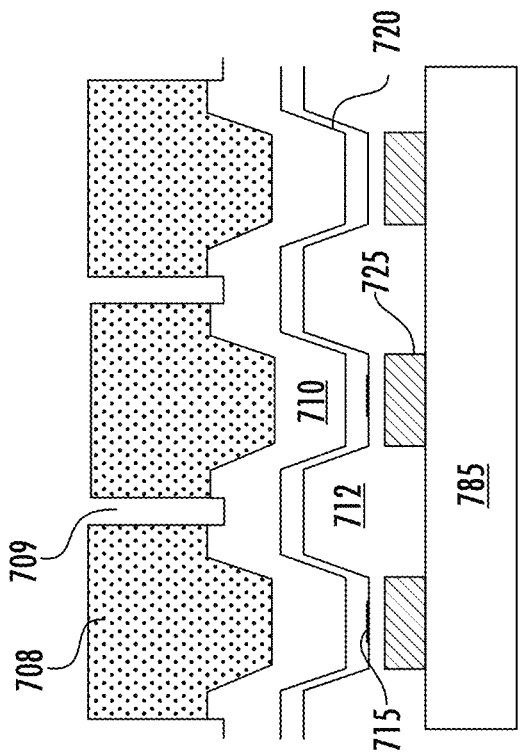
Figure 71:
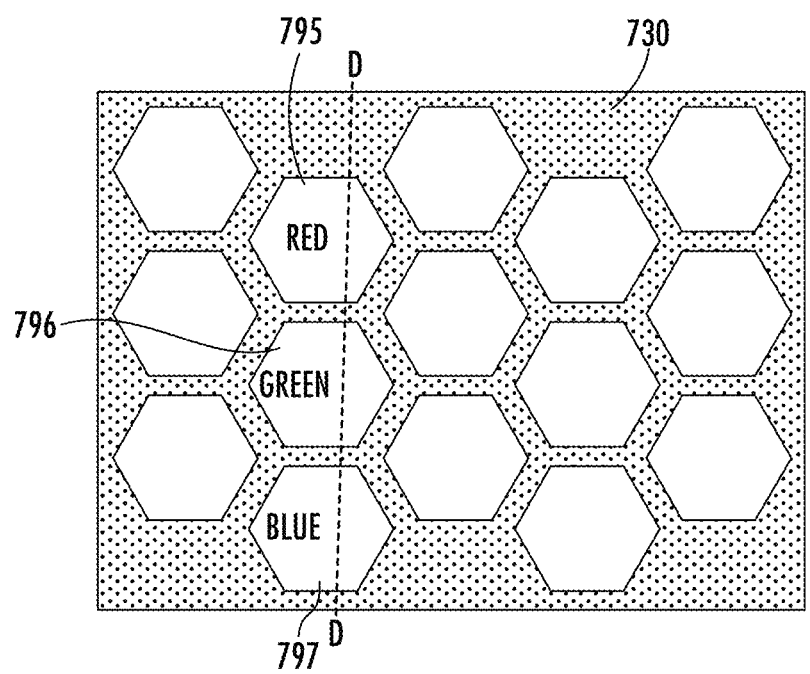
Figure 8:
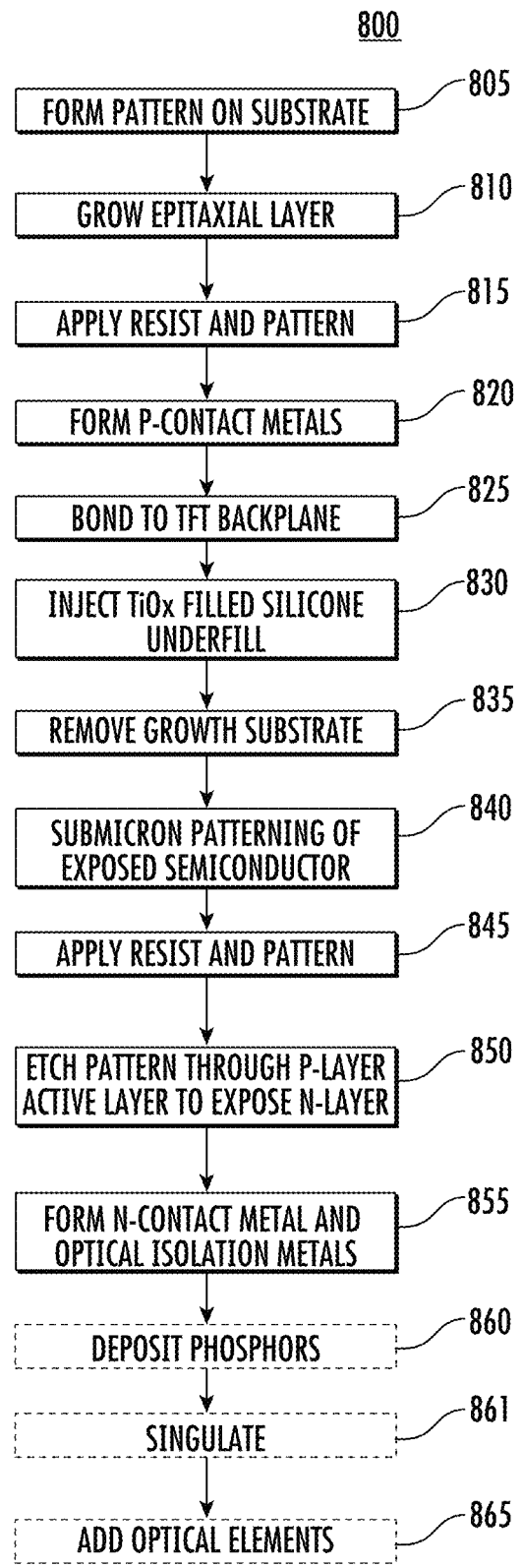
FIG. 8 illustrate a method of producing a monolithic LED array (e.g, VTF)

FIGS. 7A-7I (collectively referred to as FIG. 7) illustrate a monolithic LED array (e.g., Vertical Injection Thin Film (VTF)) 700 at various stages of the workflow, and the accompanying FIG. 8 represents the method 800 of manufacturing a monolithic LED array (e.g., VTF). As shown, the monolithic LED array 700 includes a plurality of LEDs and each LED may include a first flat region, a second flat region recessed from the first flat region, and sloped sidewalls that connect the first flat region to the second flat region. Notably, the epitaxial layers in the sloped sidewalls may have a thickness that is less than 80% of their corresponding thickness in the first flat region and/or second flat region. For a given doping level the electrical resistance of the p-layer is inversely proportional to the layer thickness, thus the reduction of thickness of the p-layer in the sloped region increases electrical resistance and reduces parasitic hole leakage currents between the first region and the second region or sloped sidewalls. For example, a 50% reduction in thickness may increase the resistance by 200% and reduce parasitic hole currents by a factor of 2. Similar reduction of the thickness of the QW active region in the sloped sidewall will increase the energy bandgap of the crystal in that region. The higher energy bandgap will create an energy barrier and confine carriers to the first region. For example, a 50% decrease in QW thickness may increase the energy bandgap by ~75 meV and provide effective confinement. A second effect of the thinner QW active region is to increase the forward voltage of the p-n junction in the sloped sidewalls. Parasitic hole currents that flow from the first region to the sloped sidewalls will be blocked from flowing through the p-n junction in the sloped sidewalls. The combined effect of thinner p-layer and QW active region in the sloped sidewalls may effectively cause greater than 90% of a forward bias hole injection to be confined to the first flat region of an LED.

FIGS. 7 and 8 are discussed in parallel to describe the method of manufacturing of a monolithic LED array (VTF) and the associated depictions of the monolithic LED array at each stage of the method. FIGS. 7 and 8 illustrate the process workflow and method for a monolithic LED display using the VTF architecture with n- and p-contacts on opposite sides of the epitaxial layers (phosphor deposition and optional optical element attachment steps not shown). The array of LEDs created in accordance with FIG. 7 and FIG. 8 may include, for example, several million LEDs configured to provide a complete high density RGB display or, alternatively, three to five LEDs that are configured as a full color gamut pixel (e.g., configured to emit an entire range of colors available on a particular device such as a mobile phone, a monitor, or the like).

Method 800 includes the formation of a patterned substrate at 805. As shown in FIG. 7A, patterned substrate 705 may be formed with a pattern (generally shown in FIG. 7A) including height h, width w, street width s, number of steps n and angle φ to achieve desired shape as discussed above with respect to FIGS. 2A-2B, 3, and 4.

At 810 of method 800, the epitaxial growth may be formed having a desired emission wavelength, for example, ranging from infrared to ultraviolet. In an example, a near-UV emission wavelength. As shown in FIG. 7B, the epitaxy may include an n-layer 710, an active layer 715, and a p-layer 720. Each of these layers may be as described with respect to FIG. 4 and may be formed using a technology such as organometallic vapor-phase epitaxy (OMVPE), and/or metalorganic vapor deposition (MOCVD), for example. FIGS. 6B and 6C show exemplary methods of generating light emitting devices (LEDs) having epitaxy layers At 815 of method 800, a resist 706 may be applied to the structure. As shown in FIG. 7C, resist 706 may be applied adjacent to the p-layer 720. Resist 706 may include a pattern in preparation for subsequent steps in method 800. It will be noted that although resist 706 is shown as a hexagon, the shape of the resist 706 may match the shape of the p-contacts 725 (e.g., FIG. 7D) such that the resist 706 is shaped to allow formation of the corresponding p-contacts 725.

At 820 of method 800, p-contact metals 725 and an alloy may be formed by any applicable technique such as via deposition. As illustrated in FIG. 7D, p-contacts 725 may be placed adjacent to p-layer 720.

At step 825 and referring to FIG. 7E, the structure may be bonded to the thin film transistor (TFT) backplane 785. TFT backplane 785 may be coupled to p-contact 725 to provide the control and electrical connections to the LED. TFT backplane 785 may be a MOSFET or amorphous Si CMOS for example.

At 830 of method 800, the structure is injection filled with a TiOx-silicone underfill 712 to fill in areas around p-contact 725 and p-layer 720. Underfill 712 may be worked back to expose bonding metal of p-contact 525. As illustrated in FIG. 7F, underfill 712 may form a complete structure. TiOx-silicone underfill 712 provides mechanical strength, chemical protection, optical isolation and reflectivity. Alternatively, for greater optical isolation between LEDs, inorganic layers with alternating high and low refractive index may be deposited over p-layer 715 via a lift-off process.

At 835 and as depicted in FIG. 7G, the structure may be inverted and the growth substrate 705 may be removed. Once removed, n-layer 710 may be exposed. The removal of the growth substrate 705 may create pockets such that a first flat region of the structure is a base of the pocket and the sloped sidewalls of each structure create the sides of the pocket. The structure may include n-layer 710, active layer 715 and p-layer 720, with p-contacts 725 attached to TFT backplane 785. Although not shown in FIG. 7, 840 may include submicron patterning of the exposed semiconductor.

At 845 of method 800, a resist 708 may be applied to the structure and may create gaps 709. As shown in FIG. 7G, resist 708 may be applied adjacent to the n-layer 710. Resist 708 may include a pattern in preparation for subsequent steps in method 800.

At 850 of method 800, the epitaxial layer is etched to the contact layer. At 855 of method 800, a metal stack may then be deposited to provide the n-contact 730. As shown in FIG. 7H, n-contacts 730 may be electrically coupled to n-layer 710 based on the etching and deposition. As shown, phosphor material 795, 796, and 797 may be provided in respective different LEDs and may be the same phosphor material or different phosphor material with different spectral properties. Although not shown in FIG. 7, 855 includes depositing n-contact and optical isolation materials. The n-contacts 730 may optically isolate two adjacent LEDs such that emission from a first LED may not enter or otherwise optically interfere with emissions from a second adjacent LED. FIG. 7H shows a cross section of FIG. 7I at the cross line D, as shown.

At 860 of method 800, phosphors (not shown—see FIG. 5) may be deposited onto the exposed n-layer to convert NUV (e.g., approximately 400 nm wavelength), blue (e.g., royal blue at approximately 450 nm), or like light to the desired color emission. Phosphors 514 may be selected to produce colors such as blue, green and red, for example. As shown, the wafer may be singulated at step 861 after the phosphor is deposited at 860. According to embodiments, the wafer may be singulated at other steps such as after step 820 or any steps of FIG. 8 shown thereafter.

At 865 of method 800, optional optical elements (not shown—see FIG. 5) may be added to be optically coupled to phosphors. These optical elements may be designed to collimate the emission from phosphors, for example. Alternatively, optic elements may be used to manipulate the emitted radiation from phosphors in others ways, such as focusing, for example.

For completeness, the top of the array of LEDs is shown in FIG. 7I. The pattern is looking down on FIG. 7H. N-contact 730 is shown. N-contact 730 is adjacent to the a plurality of LEDs including LED 790 which emits red light, LED 791 which emits green light, and LED 792 which emits blue light. Notably, the n-contact 730 may be positioned and/or have a height that results in optical isolation between two adjacent LEDs such as between LED 790 and LED 791.

All the capabilities described above for the flip chip version of the monolithic array are applicable to the VTF version, with the exception of the fabrication of individual elements. Individual VTF emitters are unlikely to be competitive with flip-chip elements.

In an exemplary embodiment, a method for manufacturing a monolithic light emitting diode (LED) array comprises: growing an epitaxial layer including an active layer and a p-layer on a patterned body, the patterned body comprising a patterned substrate and a continuous epitaxial n-layer, or a patterned n-layer on a planar substrate, a first plurality of flat regions comprising a first crystallographic plane orientation and being located a first distance from a base of the patterned substrate, a second plurality of flat regions comprising the first crystallographic plane orientation and being located a second distance from a base of the patterned body, the second distance being smaller than the first distance, a plurality of sloped sidewalls comprising a second crystallographic plane orientation, and a portion of the n-layer positioned adjacent to the sloped sidewalls having a thickness less than a thickness of portions of the n-layer adjacent any of the flat regions; applying a first resist to the p-layer, the first resist being patterned to provide access to a portion of the p-layer; depositing p-contact adjacent to the p-layer to form a plurality of light emitting diodes (LEDs); bonding to a thin film transistor (TFT) backplane to form a plurality of light emitting diodes (LEDs), the bonding causing the p-contacts to provide the electrical connections to the LEDs; injecting an underfill to fill in areas surrounding the p-contacts, n-contacts, and p-layer; removing the patterned substrate or planar substrate by inverting the manufactured structure to expose the n-layer thereby forming a vertical injection thin film (VTF) array. The method may further comprise one or more of: submicron patterning of exposed n-layer; depositing n-contact and optical isolation metals in electrical contact to the n-layer; depositing a phosphor layer onto the exposed n-layer; and adding optical elements optically coupled to the phosphor layer.

Both methods 600 and 800 are compatible with standard TFT backplanes to enable compatibility with existing systems. Methods 600 and 800 offer the potential for a flexible display if mated to a flexible backplane. Optical isolation between pixels of both pump and converted light is excellent. Coupling of optical elements may be done in an efficient parallel fashion with, for example, over-molding.

The various embodiments are depicted in the non-exclusive illustrations of FIGS. 9-22.

Figure 9:
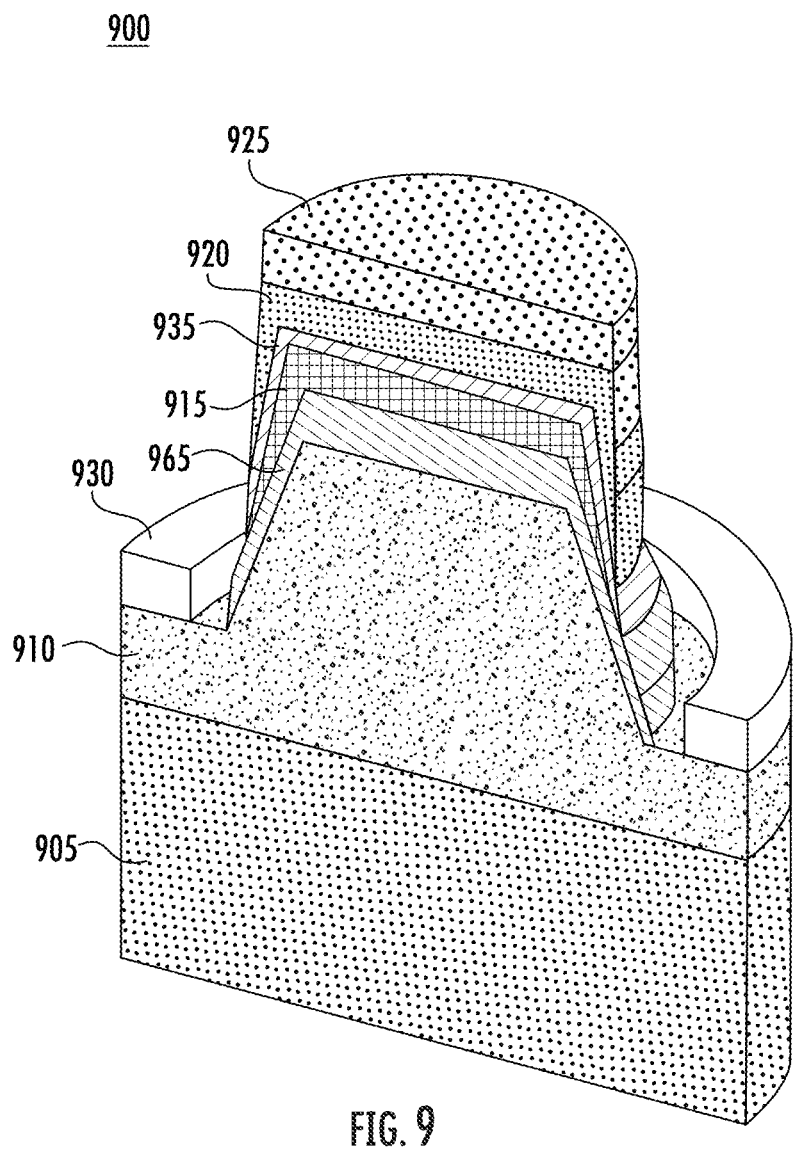
FIG. 9 illustrates a LED by growth/regrowth on a patterned template (not limited to depicted circular cross-section)

FIG. 9 illustrates a LED 900 created by growth/regrowth on a patterned n-layer 910 with a subsequent device growth. While LED 900 includes a circular cross-section, LEDs may be configured based on LED 900 with other cross sections. LED 900 includes a layered device including layers of a substrate 905, n-layer 910, n-layer growth/regrowth 965, active layer 915, electron blocking layer (EBL) 935, p-layer 920, and p-contact 925. EBL 935 may provide electron blocking as would be understood in the art and/or may provide a set-back in the geometry of the configuration. N-contact 930 may be provided around the layered device and may extend as high or low on the device structure as needed to provide the necessary electrical connections. LED 900 may be formed via method 600. LED 900 is depicted before removal of the substrate 905 in method 600. As shown in FIG. 9, the epitaxial layers each include a flat first region and a sloped sidewall region. The n-layer 910 also includes a second flat region in contact with the n-contact 930. The sloped sidewall region is shown to be etched to a width that creates a pinch-off region as disclosed herein. According to an embodiment, as shown in FIG. 9, the second flat region only includes the n-layer 910 such that growth of other epitaxial layers does not extend to the second flat region.

FIG. 10A illustrates a LED 1000 created on a patterned substrate 1005. While LED 1000 includes a circular cross-section, LEDs may be configured based on LED 1000 with other cross sections. LED 1000 includes a layered device including epitaxial layers of a substrate 1005, n-layer 1010, active layer 1015, EBL 1035, p-layer 1020, and p-contact 1025. EBL 1035 may provide electron blocking as would be understood in the art and/or may provide a set-back in the geometry of the configuration. N-contact 1030 may be provided around the layered device and may extend as high or low on the device structure as needed to provide the necessary electrical connections and/or optical isolation between adjacent LEDs 1000 in an array of LEDs. LED 1000 may be formed via method 600 of FIG. 6B and/or 680 of FIG. 6C. LED 1000 is depicted before removal of the substrate 1005 in method 600. As shown in FIG. 10A, the epitaxial layers each include a flat first portion and a sloped sidewall potion. The sloped sidewall region is shown to be etched or grown to a width that creates a pinch-off region as disclosed herein. Notably, the contact placement of the n-contact 1030 and p-contact 1025 and the material grow to form the epitaxial layers minimizes carrier transport to the sloped sidewall and/or edges of the active layer 1015.

In an exemplary embodiment, a method for manufacturing a monolithic light emitting diode (LED) array comprising a plurality of micro-light emitting diodes (uLEDs) comprising a plurality of epitaxial layers comprises: epitaxially depositing an n-layer on a patterned substrate, the patterned substrate comprising a first plurality of flat regions comprising a first crystallographic plane orientation and being located a first distance from a base of the patterned substrate, a second plurality of flat regions comprising the first crystallographic plane orientation and being located a second distance from a base of the patterned substrate, the second distance being smaller than the first distance, a plurality of sloped sidewalls comprising a second crystallographic plane orientation, and a portion of the n-layer positioned adjacent to the sloped sidewalls having a thickness less than a thickness of portions of the n-layer adjacent any of the flat regions; epitaxially depositing an active layer on an area of the n-layer adjacent to the first plurality of flat regions and adjacent to the sloped sidewalls, such that a portion of the active layer positioned adjacent to the sloped sidewalls has a thickness less than a thickness of the portion of the active layer adjacent to the first plurality of flat regions; epitaxially depositing a p-layer on an area of the active layer adjacent to the first plurality of flat regions and adjacent to the sloped sidewalls, such that a portion of the p-layer layer positioned adjacent to the sloped sidewalls has a thickness less than a thickness of the portion of the p-layer layer adjacent to the first plurality of flat regions; forming a plurality of p-contacts on the portion of the p-layer adjacent to the first plurality of flat regions; and forming a plurality of n-contacts on the portion of the n-layer adjacent to the second plurality of flat regions, whereby the plurality of uLEDs is formed. This method may be performed in an absence of any sidewall passivation. Methods may further comprise one or more of: bonding the plurality of uLEDs to a thin film transistor (TFT) backplane, removing the patterned substrate; depositing a phosphor layer onto an exposed surface of the n-layer; adding optical elements optically coupled to the phosphor layer. When the p-contact and the n-contact are formed on the same side of the epitaxial layers, a thin film flip chip (TFFC) array is formed. When the p-contact and the n-contact are formed on opposite sides of the epitaxial layers, a vertical injection thin film (VTF) array is formed.

In an exemplary embodiment, a method for manufacturing a monolithic light emitting diode (LED) array comprising a plurality of micro-light emitting diodes (uLEDs) comprising a plurality of epitaxial layers comprises: forming a patterned template comprising an n-layer on a substrate, the patterned template comprising a first plurality of flat regions comprising a first crystallographic plane orientation and being located a first distance from a base of the substrate, a second plurality of flat regions comprising the first crystallographic plane orientation and being located a second distance from a base of the substrate, the second distance being smaller than the first distance, a plurality of sloped sidewalls comprising a second crystallographic plan plane orientation, and a portion of the n-layer positioned adjacent to the sloped sidewalls having a thickness less than a thickness of portions of the n-layer adjacent any of the flat regions; epitaxially depositing an active layer on an area of the n-layer adjacent to the first plurality of flat regions and adjacent to the sloped sidewalls, and a portion of the active layer positioned adjacent to the sloped sidewalls having a thickness less than a thickness of the portion of the active layer adjacent to the first plurality of flat regions; epitaxially depositing a p-layer on an area of the active layer adjacent to the first plurality of flat regions and adjacent to the sloped sidewalls, and a portion of the p-layer layer positioned adjacent to the sloped sidewalls having a thickness less than a thickness of the portion of the p-layer layer adjacent to the first plurality of flat regions; forming a plurality of p-contacts on the portion of the p-layer adjacent to the first plurality of flat regions; and forming a plurality of n-contacts on the portion of the n-layer adjacent to the second plurality of flat regions, whereby the plurality of uLEDs is formed. This method may be performed in an absence of any sidewall passivation. Methods may further comprise one or more of: bonding the plurality of uLEDs to a thin film transistor (TFT) backplane, removing the patterned substrate; depositing a phosphor layer onto an exposed surface of the n-layer; adding optical elements optically coupled to the phosphor layer. When the p-contact and the n-contact are formed on the same side of the epitaxial layers, a thin film flip chip (TFFC) array is formed. When the p-contact and the n-contact are formed on opposite sides of the epitaxial layers, a vertical injection thin film (VTF) array is formed.

FIG. 10B illustrates a LED 1001 created on a patterned substrate 1006 and shaped n-layer 1011. While LED 1001 includes a circular cross-section, LEDs may be configured based on LED 1001 with other cross sections. LED 1001 includes a layered device including epitaxial layers of a substrate 1006, shaped n-layer 1011, re-grown n-layer 1012, active layer 1016, EBL 1036, p-layer 1021, and p-contact 1026. The shaped n-layer 1011 may be shaped by any applicable shaping process such as lithography. EBL 1036 may provide electron blocking as would be understood in the art and/or may provide a set-back in the geometry of the configuration. N-contact 1031 may be provided around the layered device and may extend as high or low on the device structure as needed to provide the necessary electrical connections and/or optical isolation between adjacent LEDs 1001 in an array of LEDs. LED 1000 may be formed via method 600 of FIG. 6B and/or 690 of FIG. 6C. LED 1000 is depicted before removal of the substrate 1006 in method 600. As shown in FIG. 10B, the epitaxial layers each include a flat first portion and a sloped sidewall potion. The sloped sidewall region is shown to be etched or grown to a width that creates a pinch-off region as disclosed herein. Notably, the contact placement of the n-contact 1031 and p-contact 1026 and the material grow to form the epitaxial layers minimizes carrier transport to the sloped sidewall and/or edges of the active layer 1016.

Figure 11B:
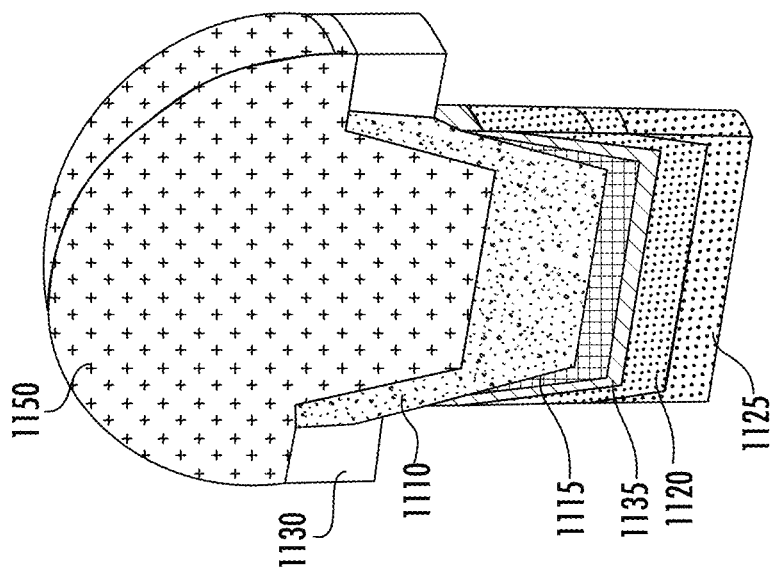
FIGS. 11A and 11B illustrate TFFC versions of LEDs with attached lens.
Figure 11A:
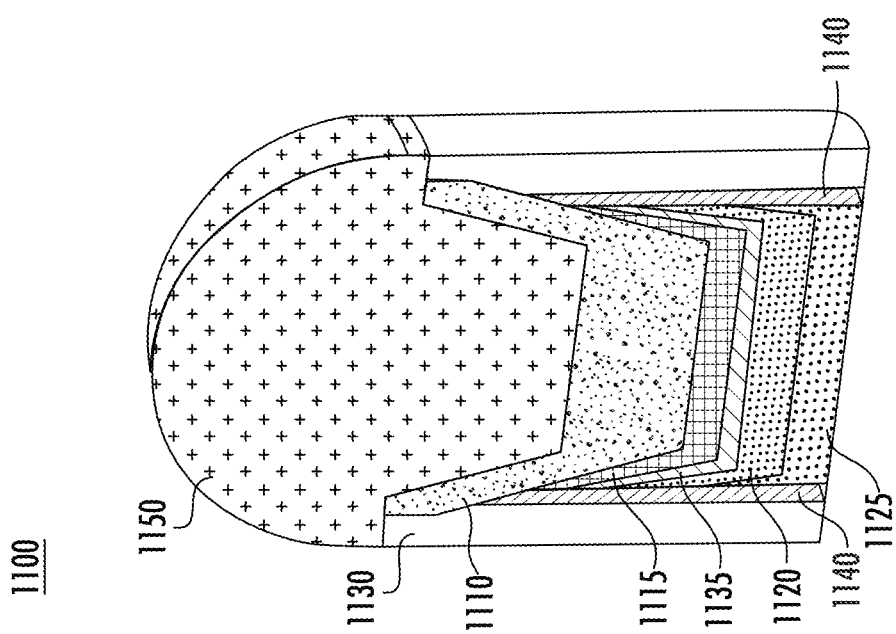

FIGS. 11A and B illustrate TFFC versions of LEDs 1100 with an attached lens. LEDS 1100 may be formed from method 600. LED 1100 depicts an LED further in the process from that of FIG. 10A with the epi structure flipped over and the substrate removed as described above. LED 1100 includes a p-contact 1125 positioned adjacent to a p-layer 1120. P-layer 1120 is located adjacent to EBL 1135, which is adjacent to active layer 1115. N-layer 1110 is positioned adjacent to active layer 1115 distal to EBL 1135. N-contact 1130 is coupled to n-layer 1110. In between the epitaxial layers and n-contact 1130 is a dielectric insulator 1140. Dielectric insulator 1140 between n-layer 1110 and p-layer 1120 does not need to passivate active layer 1115. Dielectric insulator 1140 may operate as an insulator and therefore may be cheaper and simpler to implement. Adjacent to the n-layer 1110 is a micro-molded lens 1150. FIG. 11A depicts LED 1100 with the n-contact 1130 and dielectric insulator 1140 extending approximately even with the p-contact 1125. FIG. 11B has the dielectric insulator 1140 removed while n-contact 1130 extends slightly beyond n-layer 1110.

Figure 12B:
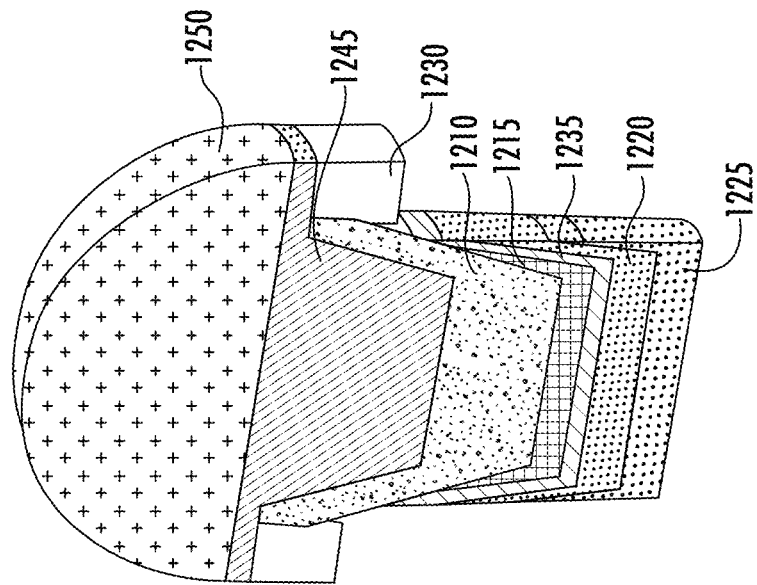
FIGS. 12A and 12B illustrate chip scale package (CSP) versions of LEDs with attached lens.
Figure 12A:
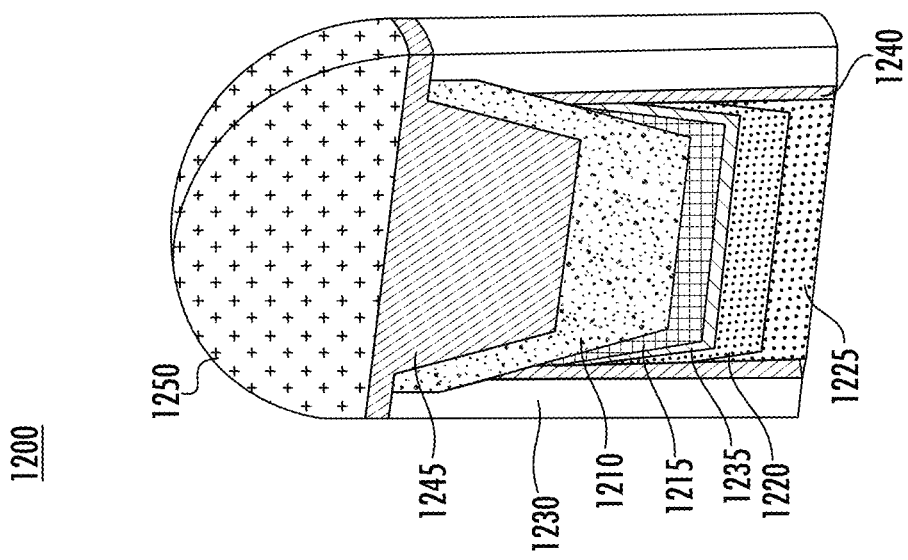

FIGS. 12A and B illustrate chip scale package (CSP) versions of LEDs 1200 with the attached lens. LEDS 1200 may be formed from method 600. LED 1200 depicts a LED further in the process from that of FIG. 10A with the epi structure flipped over. LED 1200 includes a p-contact 1225 positioned adjacent to a p-layer 1220. P-layer 1220 is located adjacent to EBL 1235, which is adjacent to active layer 1215. N-layer 1210 is positioned adjacent to active layer 1215 distal to EBL 1235. N-contact 1230 is coupled to n-layer 1210. In between the epitaxial layers and n-contact 1230 is a dielectric insulator 1240. Dielectric insulator 1240 between n-layer 1210 and p-layer 1220 does not need to passivate active layer 1215. Dielectric insulator 1240 may operate as an insulator and therefore may be cheaper and simpler to implement. Adjacent to the n-layer 1210 is a transparent substrate 1245 with a micro molded lens 1250 adjacent to transparent substrate 1245 distal to n-layer 1210. Transparent substrate 1245 may be thinned as would be understood to those possessing an ordinary skill in the art. FIG. 12A depicts LED 1200 with the n-contact 1230 and dielectric insulator 1240 extending approximately even with the p-contact 1225. FIG. 12B has the dielectric insulator 1240 removed while n-contact 1230 extends slightly beyond n-layer 1210.

Figure 13:
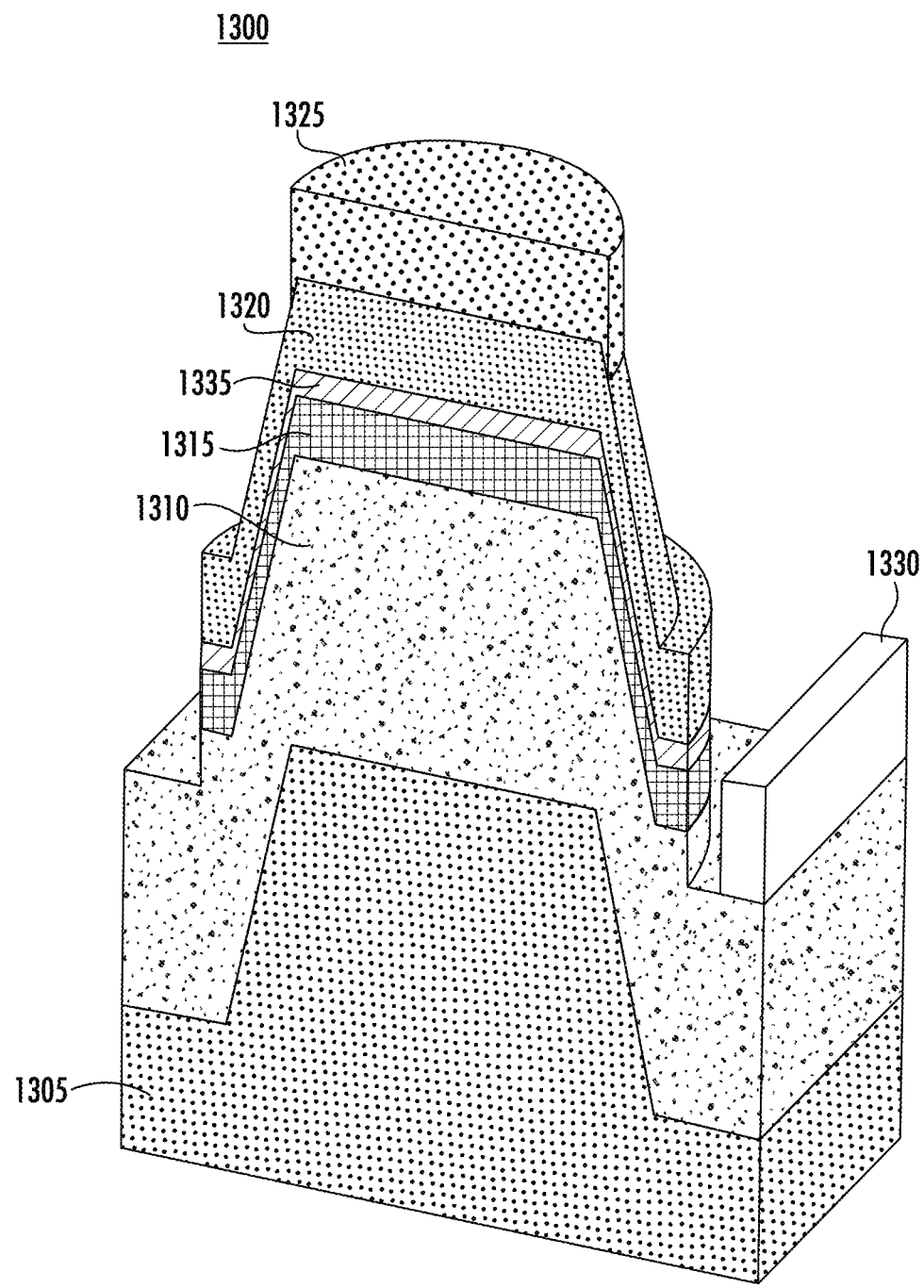
FIG. 13 illustrates an alternative LED embodiment requiring less processing (p-side sidewall)

FIG. 13 illustrates an alternative LED 1300 embodiment requiring less processing (p-side sidewall). Similar to LED 1000 of FIG. 10A, LED 1300 includes a layered device including layers of a substrate 1305, n-layer 1310, active layer 1315, EBL 1335, p-layer 1320, and p-contact 1325. N-contact 1330 may be provided over the n-layer 1310 and may extend as high or low on the device structure as needed to provide the necessary electrical connections and/or optical isolation between adjacent LEDs 1300 in an array of LEDs. LED 1300 may be formed via method 600. LED 1300 is depicted before removal of the substrate 1305 in method 600. LED 1300 differs from LED 1000 in that in the process of making LED 1300 there is a single etch performed that starts at a second flat region of p-layer 1320. According to an alternative embodiment, no additional etch may be performed as the p-side of p-layer 1320 at the sloped sidewall may be thin to adequately reduce hole transport to active layer 1315.

Figure 14A:
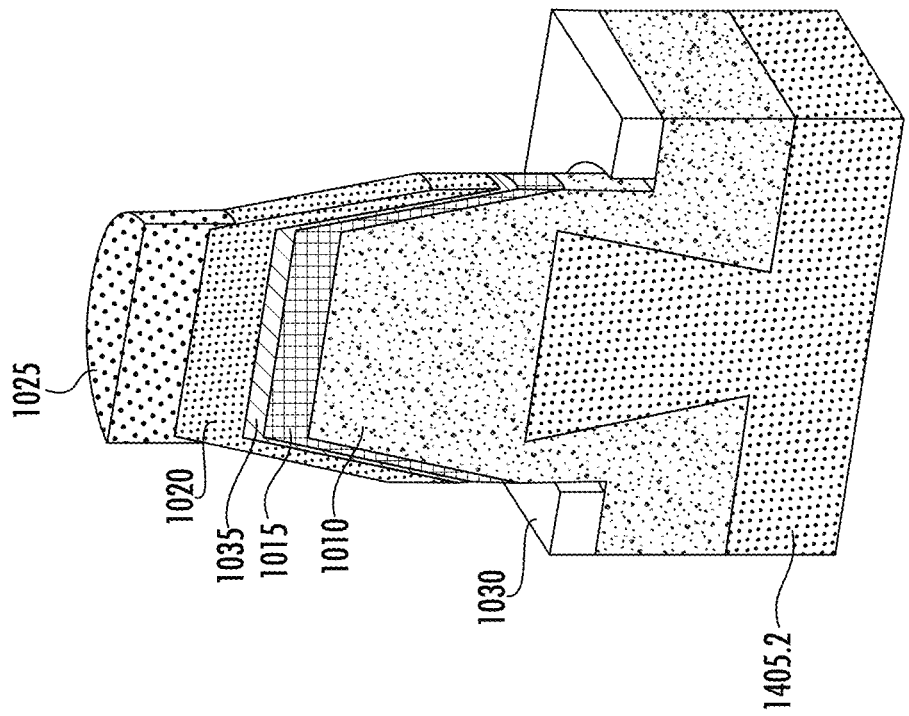
FIGS. 14A and 14B illustrate alternative embodiments for substrate (shown) or template pattern angle.
Figure 14B:
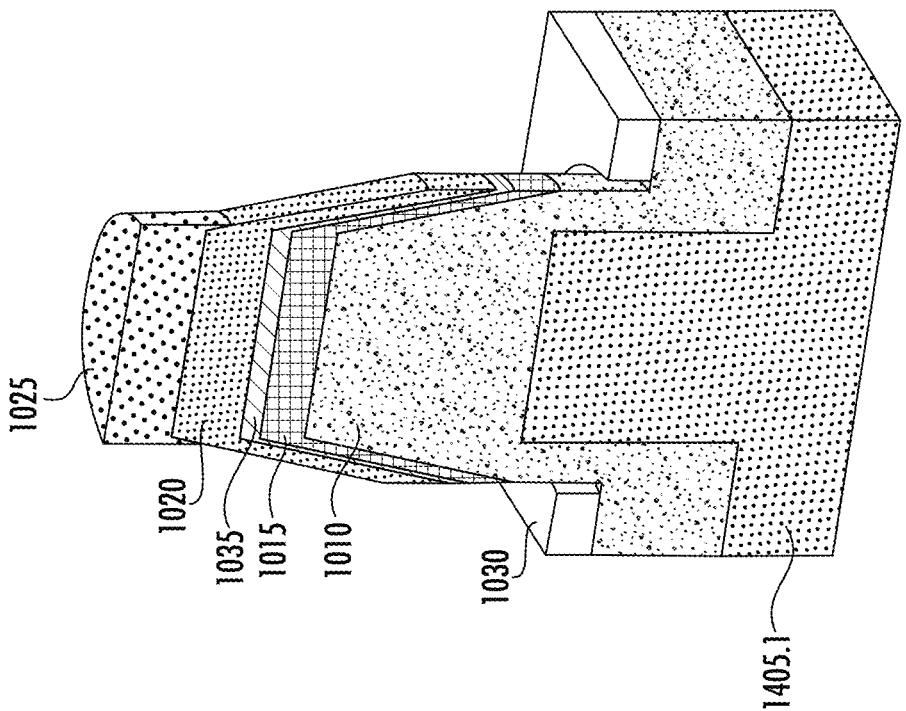

FIG. 14A and FIG. 14B illustrate alternative embodiments for the template pattern of the substrate (shown) or template pattern angle generally. FIG. 14A and FIG. 14B depict the LED 1000 of FIG. 10A. LED 1000 includes a layered device including layers of a substrate 1405, n-layer 1010, active layer 1015, EBL 1035, p-layer 1020, and p-contact 1025. N-contact 1030 may be provided around the layered device and may extend as high or low on the device structure as needed to provide the necessary electrical connections. As illustrated in FIG. 14A, substrate 1405 is formed as substrate 1405.1. Substrate 1405.1 includes vertical sides that may be beneficial in certain growth conditions. As illustrated specifically in FIG. 14B, substrate 1405 is formed as substrate 1405.2. Substrate 1405.2 includes an inverted side-cut that may be beneficial in certain growth conditions.

Figure 15C:
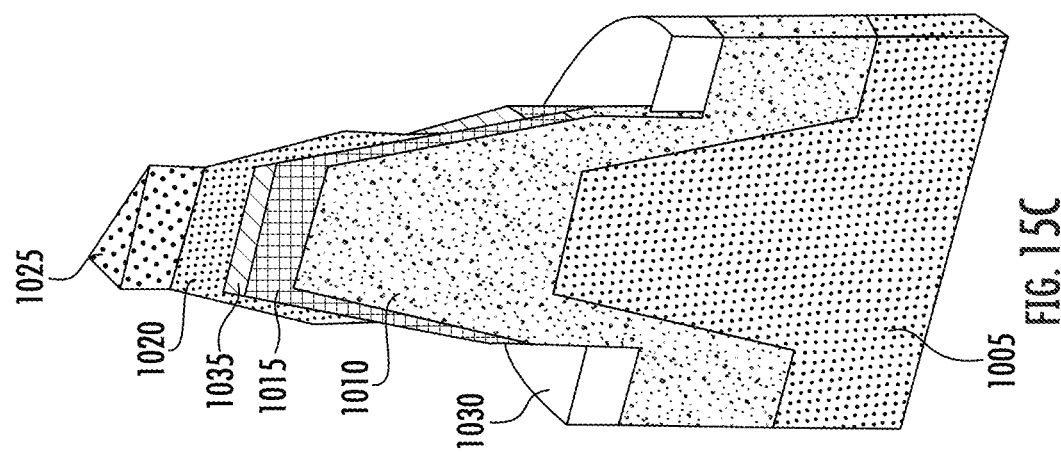
FIGS. 15A-15C illustrate embodiments for different cross-sections of substrate (shown) or template patterns (for example, rectangular, triangular, polygonal)
Figure 15B:
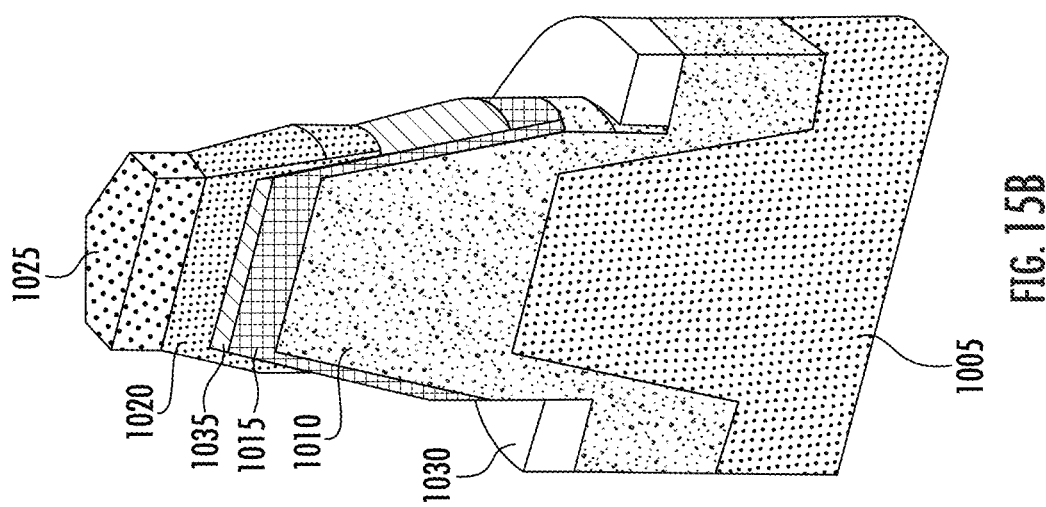
Figure 15A:
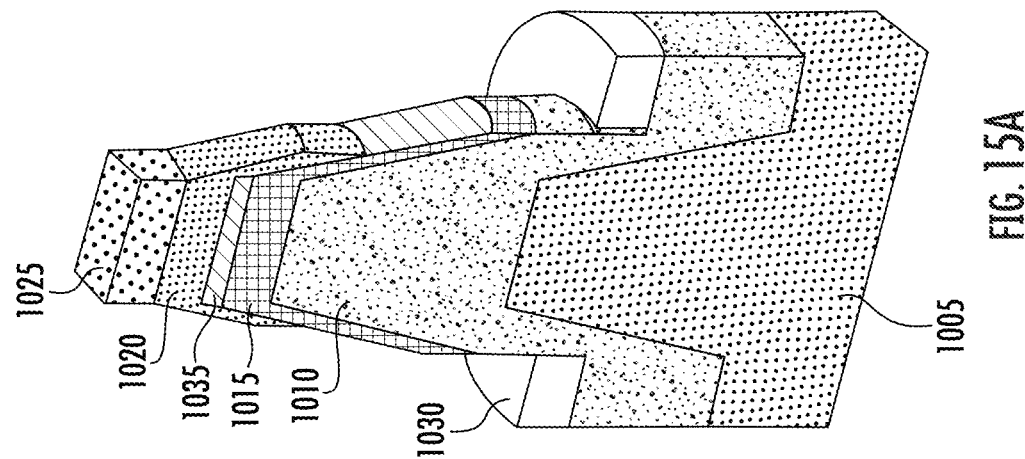

FIGS. 15A-C illustrate embodiments for different cross-sections of substrate (shown) or template patterns generally. FIGS. 15A-C depict the LED 1000 of FIG. 10A. LED 1000 includes a layered device including layers of a substrate 1005, n-layer 1010, active layer 1015, EBL 1035, p-layer 1020, and p-contact 1025. EBL 1035 may provide electron blocking as would be understood in the art and/or may provide a set-back in the geometry of the configuration. N-contact 1030 may be provided around the layered device and may extend as high or low on the device structure as needed to provide the necessary electrical connections. The LED of FIG. 15A is illustrated as a rectangular pattern. The LED of FIG. 15B is illustrated as a polygonal pattern. The LED of FIG. 15C is illustrated as a triangular pattern. Other shaped patterns may also be created.

Figure 16A:
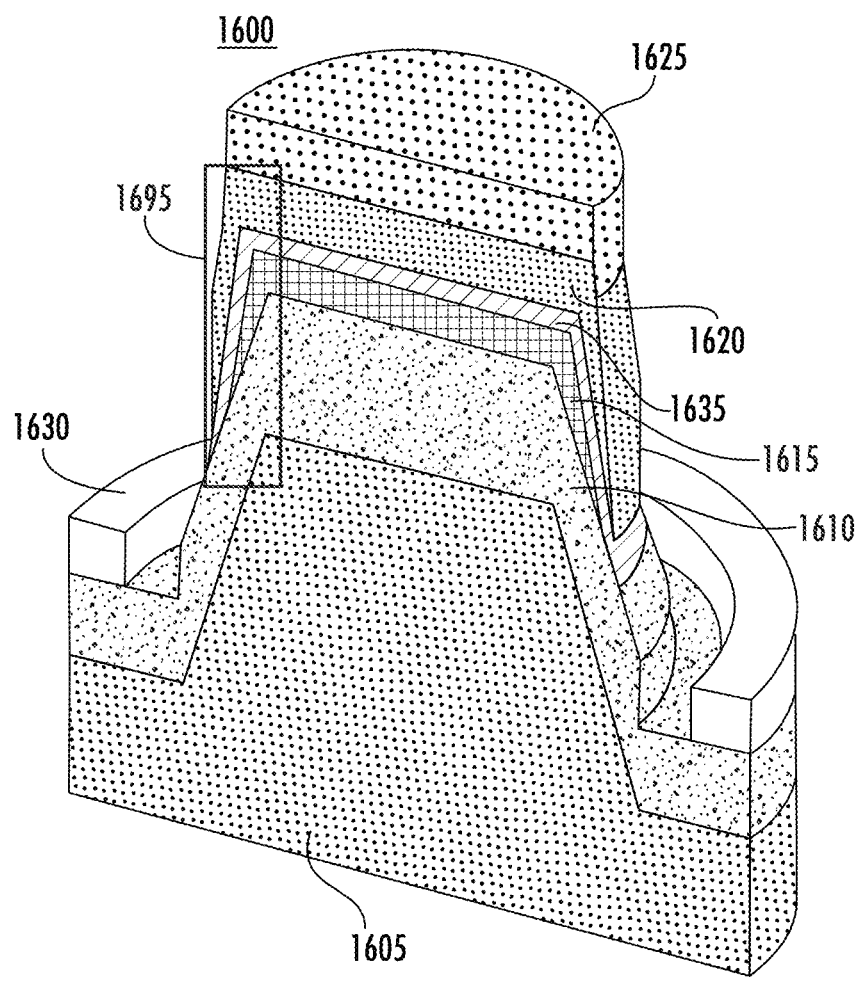
FIG. 16A illustrates an embodiment of LED with isolated active region via "pinch-off"
Figure 16B:
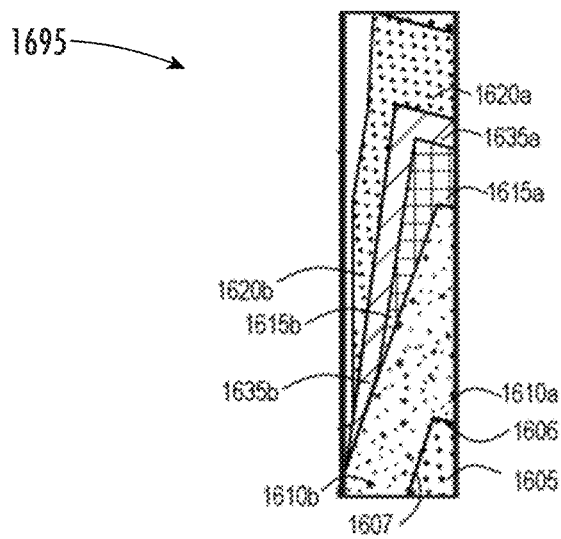
FIG. 16B illustrates a call-out of FIG. 16A to show relative layer sizing of the pinch-off zone.

FIG. 16A illustrates an embodiment of LED 1600 with isolated active region, e.g., light emitting layers, via "pinch-off". Reference herein to pinch-off indicates a change in thickness of a layer of the same material as positioned on a flat region versus a sloped region or sidewall. Similar to LED 1000 of FIG. 10A, LED 1600 includes a layered device including layers of a substrate 1605, n-layer 1610, active layer 1615, EBL 1635, p-layer 1620, and p-contact 1625. N-contact 1630 may be provided around the layered device and may extend as high or low on the device structure as needed to provide the necessary electrical connections. LED 1600 may be formed via method 600. LED 1600 is depicted before removal of the substrate 1605 in method 600. LED 1600 includes a realization of pinch-off that implies epitaxial growth optimization, which is highlighted by a pinch-off zone on sloped sidewalls 1695. Notably, as shown in FIG. 16A, the sloped sidewalls of the n-layer 1610, active layer 1615, EBL 1635, p-layer 1620 may be etched or grown such that epitaxial layers of the sloped sidewall may have a thickness that is less than 80% of their corresponding thickness in the first flat region and/or second flat region. An exemplary pinch-off zone on the sloped sidewall 1695 has a structure in accordance with FIG. 16B in that there is a step-change in thickness of a given-layer from the flat region to the sloped sidewall. In FIG. 16B, excerpted substrate 1605 has a flat region 1606 and a sloped sidewall 1607. The n-layer has a first portion 1610*a* on the flat region 1606 having a first thickness and a second portion 1610*b* on the sidewall 1607 having a second thickness. The active layer has a first portion 1615*a* adjacent to the flat region 1606 (directly on the first portion 1610*a* of the n-layer) having a first thickness and a second portion 1615*b* adjacent to the sidewall 1607 (directly on the second portion 1610*b* of the n-layer) having a second thickness. The EBL layer has a first portion 1635*a* adjacent to the flat region 1606 (directly on the first portion 1615*a* of the active layer) having a first thickness and a second portion 1635*b* adjacent to the sidewall 1607 (directly on the second portion 1615*b* of the active layer) having a second thickness. The p- layer has a first portion 1620*a* adjacent to the flat region 1606 (directly on the first portion 1635*a* of the EBL layer) having a first thickness and a second portion 1620*b* adjacent to the sidewall 1607 (directly on the second portion 1635 of the EBL layer) having a second thickness. For any of the layers, independently, the second thickness is less than the first thickness. In one or more embodiments, the second thickness is less than 80%, or 70%, or 60%, or 50%, or 40%, or 30%, or 20%, or 10%, or 5% of the first thickness. For a given doping level, the electrical resistance of the p-layer is inversely proportional to the layer thickness, thus the reduction of thickness of the p-layer in the sloped region increases electrical resistance and reduces parasitic hole leakage currents between the first region and the second region or sloped sidewalls. For example, a 50% reduction in thickness may increase the resistance by 200% and reduce parasitic hole currents by a factor of 2. Similar reduction of the thickness of the QW active region in the sloped sidewall will increase the energy bandgap of the crystal in that region. The higher energy bandgap will create an energy barrier and confine carriers to the first region. For example, a 50% decrease in QW thickness would increase the energy bandgap by ~75 meV and provide effective confinement. A second effect of the thinner QW active region is to increase the forward voltage of the p-n junction in the sloped sidewalls. Parasitic hole currents that flow from the first region to the sloped sidewalls will be blocked from flowing through the p-n junction in the sloped sidewalls. The combined effect of thinner p-layer and QW active region in the sloped sidewalls may effectively cause greater than 90% of a forward bias hole injection to be confined to the top flat region of the LED 1600.

Figure 17:
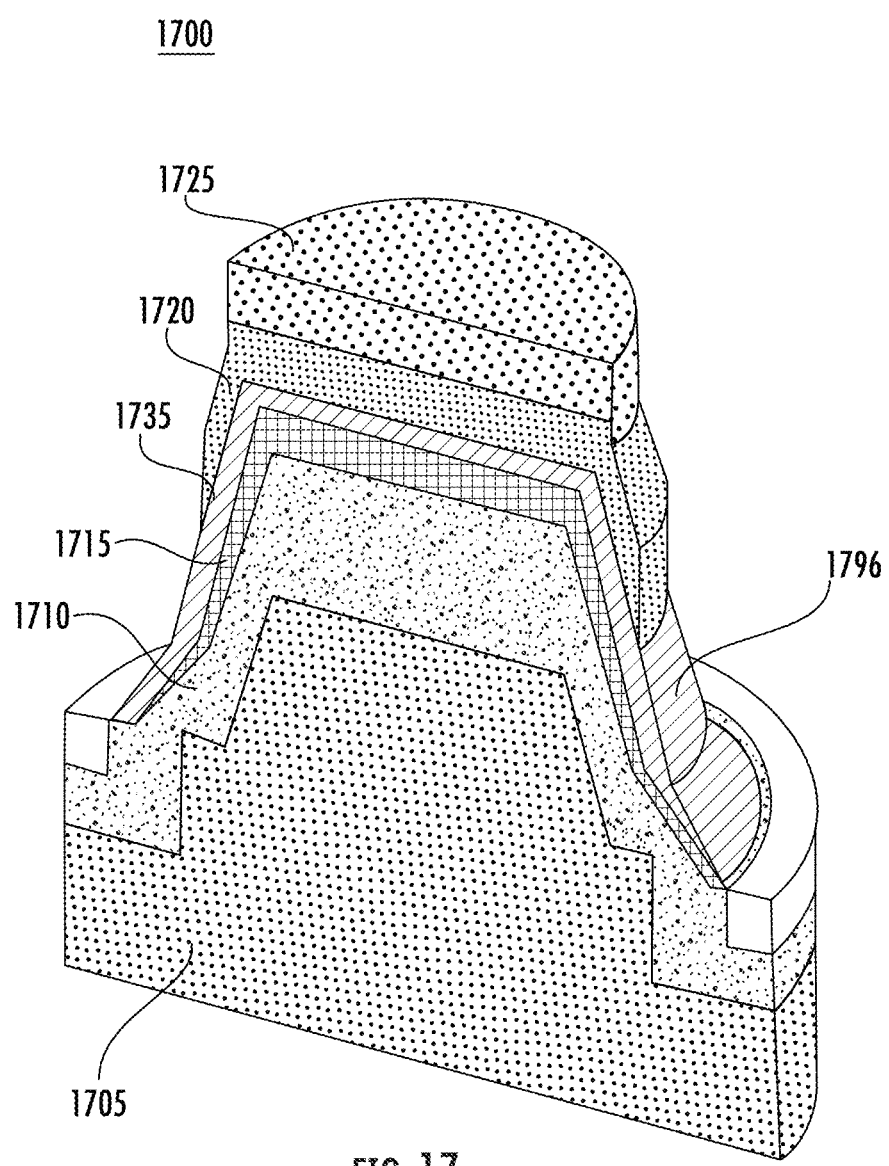
FIG. 17 illustrates a LED on multilevel patterned substrates.

FIG. 17 illustrates a LED 1700 on a multilevel patterned substrate. Similar to LED 1000 of FIG. 10A, LED 1700 includes a layered device including layers of a substrate 1705, n-layer 1710, active layer 1715, EBL 1735, p-layer 1720, and p-contact 1725. N-contact 1730 may be provided around the layered device and may extend as high or low on the device structure as needed to provide the necessary electrical connections. LED 1700 may be formed via method 600. LED 1700 is depicted before removal of the substrate 1705 in method 600. LED 1700 includes an active layer 1715 that does not necessarily include pinch-off. The area of 1796 shows EBL 1735 having a portion on the sidewall whose thickness is not less than the thickness on the flat region. LED 1700 may be realized using self-align features.

Figure 18:
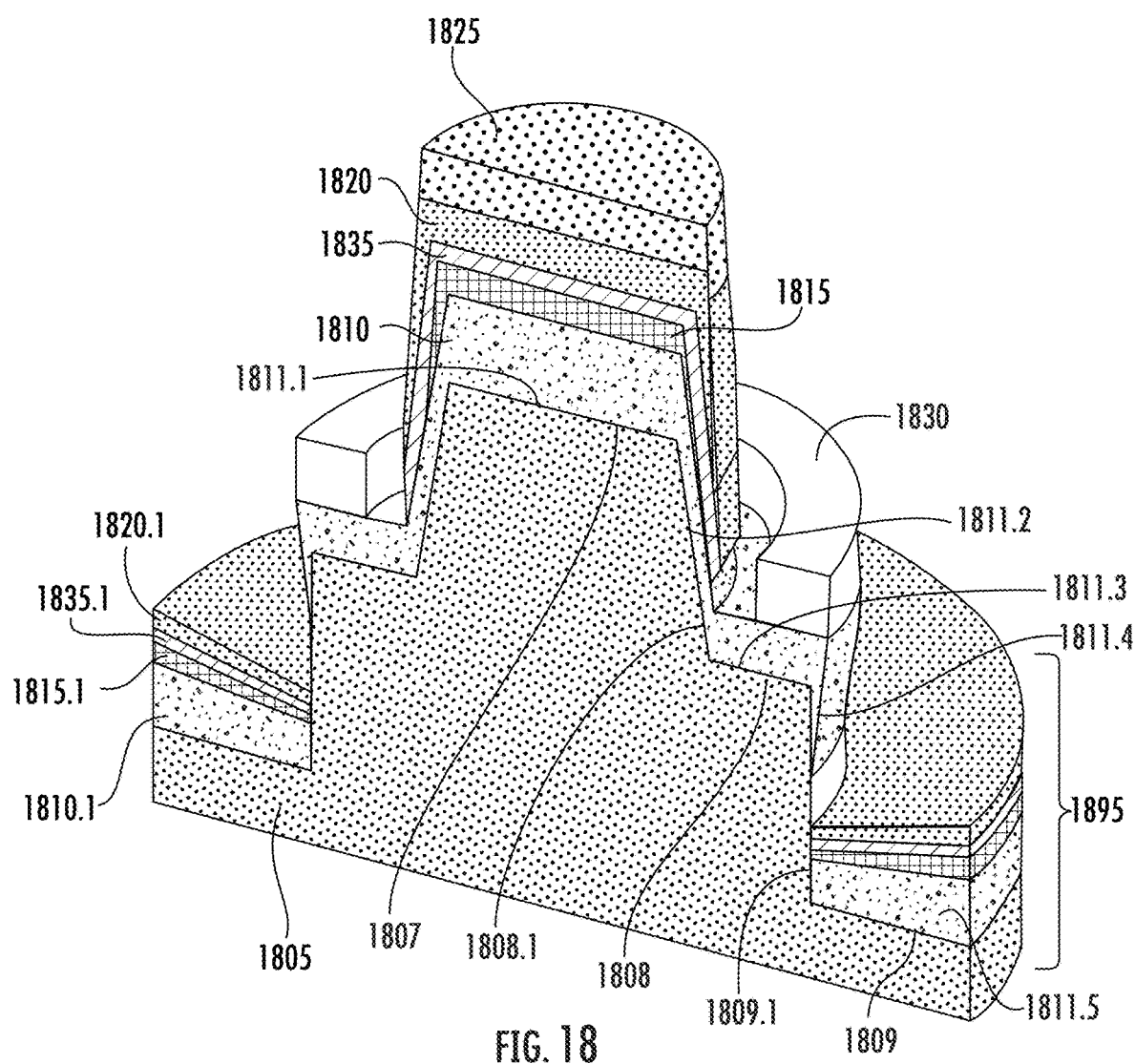
FIG. 18 illustrates an isolated LED realized through use of multilevel patterned substrate.

FIG. 18 illustrates an isolated LED 1800 realized through a multilevel patterned substrate. Similar to LED 1000 of FIG. 10A, LED 1800 includes a layered device including layers of a substrate 1805, n-layer 1810, active layer 1815, EBL 1835, p-layer 1820, and p-contact 1825. N-contact 1830 may be provided around the layered device and may extend as high or low on the device structure as needed to provide the necessary electrical connections. LED 1800 may be formed via method 600. LED 1800 is depicted before removal of the substrate 1805 in method 600. LED 1800 may be realized using a multi-step pattern of substrate 1805, which comprises a first flat region 1807, a second flat region 1808, a third flat region 1809, a sloped sidewall 1808.1 connecting the first flat region 1807 and the second flat region 1808, and a bottom sidewall 1809.1 connecting the second flat region 1808 and the third flat region 1809. On the first flat region 1807 is a first flat portion 1811.1 of the n-layer 1810. On the sloped sidewall 1808.1 is a second sloped portion 1811.2 of the n-layer 1810. On the second flat region 1808 is a third flat portion 1811.3 of the n-layer 1810. On the bottom sidewall 1809.1 is a fourth pinched portion 1811.4 of the n-layer 1810. On the third flat region 1809 is a fifth flat portion 1811.5 of the n-layer 1810. This multi-step substrate is described above with respect to FIG. 2B. LED 1800 as depicted has no processing beyond the inner LED. As a result, an additional epitaxial layer 1895 including a substrate 1805, another growth of n-layer 1810.1, another growth of active layer 1815.1, another growth of EBL 1835.1, and another growth of p-layer 1820.1 is formed.

This design allows the deposition of fully isolated LEDs and the layers below may be ignored and removed, simplifying the wafer fabrication.

FIGS. 19A and 19B illustrate a monolithic TFFC array 1900 of LEDs 2000 using phosphor conversion and optical isolation that does not require pick and place. As is illustrated in FIG. 19A, a view from the lens side of array 1900 is provided. As is illustrated in FIG. 19B, a view from the distal to the lens side of array 1900 is provided. Array 1900 is illustrated as an array of LEDs that is 4×4 with the fourth row being depicted as cut in half so that the internal structure of each LED 2000 may be viewed. The specifics of each LED are provided in and described with respect to FIG. 20. In FIGS. 19A and B, there is a column on each end of red LEDs 1901 of LEDs 2000. In between the two red columns is a column of green LEDs 1902 of LED 2000 and a column of blue LEDs 1903 of LED 2000. Such a configuration enables RGB as understood in the art. As shown in FIGS. 19A and 19B, epitaxial layers of each LED may extend from a first flat region shown towards the bottom of LED, to sloped sidewalls, and onto the second flat region adjacent to the respective phosphor layer of each of the respective LEDs. Alternatively, the sloped sidewalls may be grown or etched such that a subset of the epitaxial layers do not extend to the second flat region adjacent to respective phosphor layers.

Figure 20:
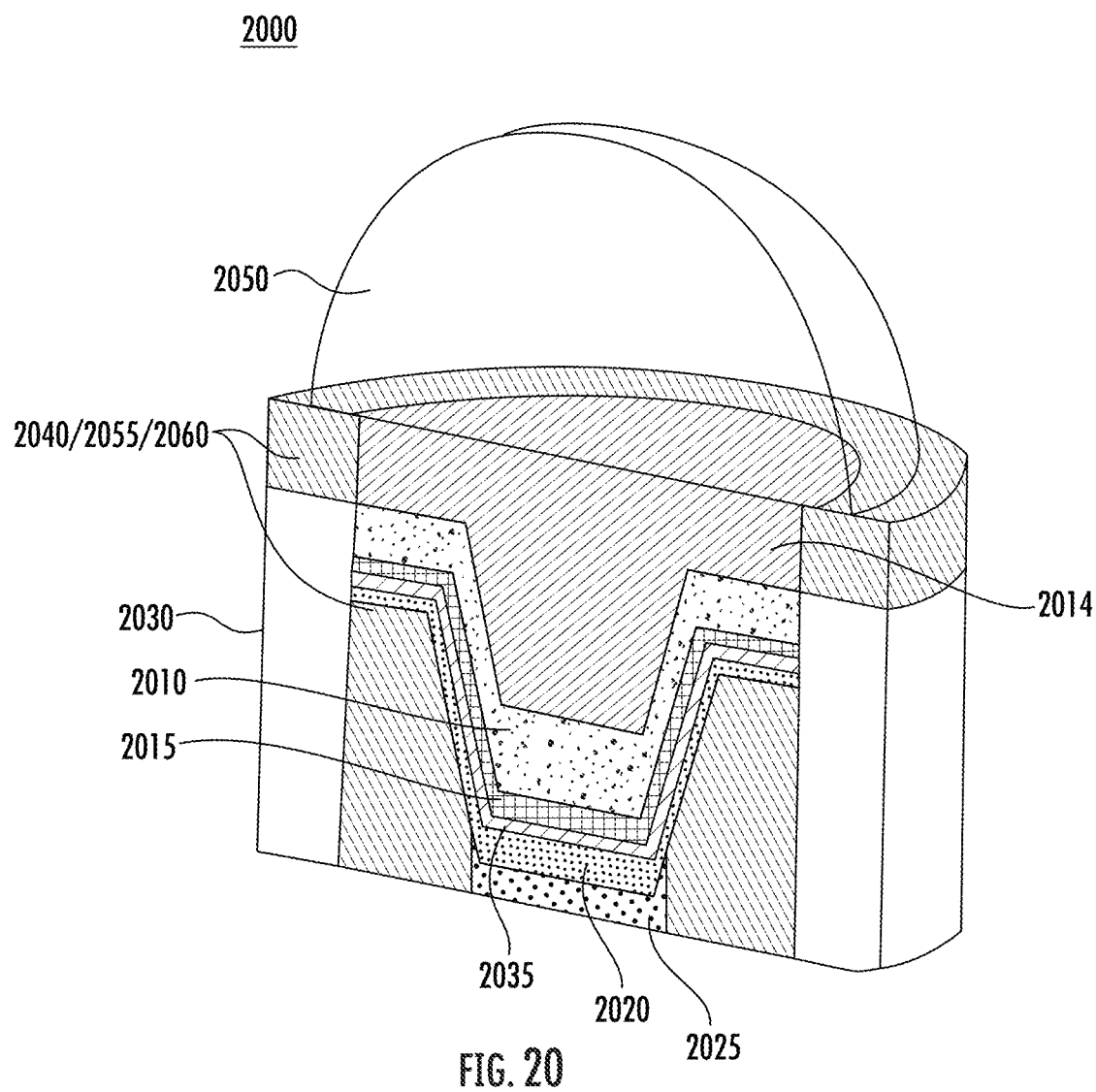
FIG. 20 illustrates a LED unit cell of monolithic TFFC array using phosphor conversion and optical isolation.

FIG. 20 illustrates a LED 2000 unit cell of monolithic TFFC array using phosphor conversion and optical isolation. LED 2000 may be formed from method 600. LED 2000 includes a p-contact 2025 positioned adjacent to a p-layer 2020. P-layer 2020 is located adjacent to EBL 2035, which is adjacent to active layer 2015. N-layer 2010 is positioned adjacent to active layer 2015 distal to EBL 2035. N-contact 2030 is coupled to n-layer 2010. Phosphor layer 2014 is included adjacent to n-layer 2010. In between the epitaxial layers and n-contact 2030, and surrounding any exposed regions of phosphor layer 2014 is a dielectric insulator 2040/optical isolator 2055/stiffener 2060. Adjacent to the phosphor layer 2014 is a micro molded lens 2050 distal to n-layer 2410. Dielectric insulator 2040/optical isolator 2055/ stiffener 2060 may be three separate layers or may be a single layer that performs the function of a dielectric insulator, an optical insulator and a stiffener. As shown in FIG. 20, epitaxial layers may extend from a first flat region shown towards the bottom of LED 2000, to sloped sidewalls, and onto the second flat region adjacent to phosphor layer 2014. Alternatively, the sloped sidewalls may be grown or etched such that a subset of the epitaxial layers do not extend to the second flat region adjacent to phosphor layer 2014.

Figure 21A:
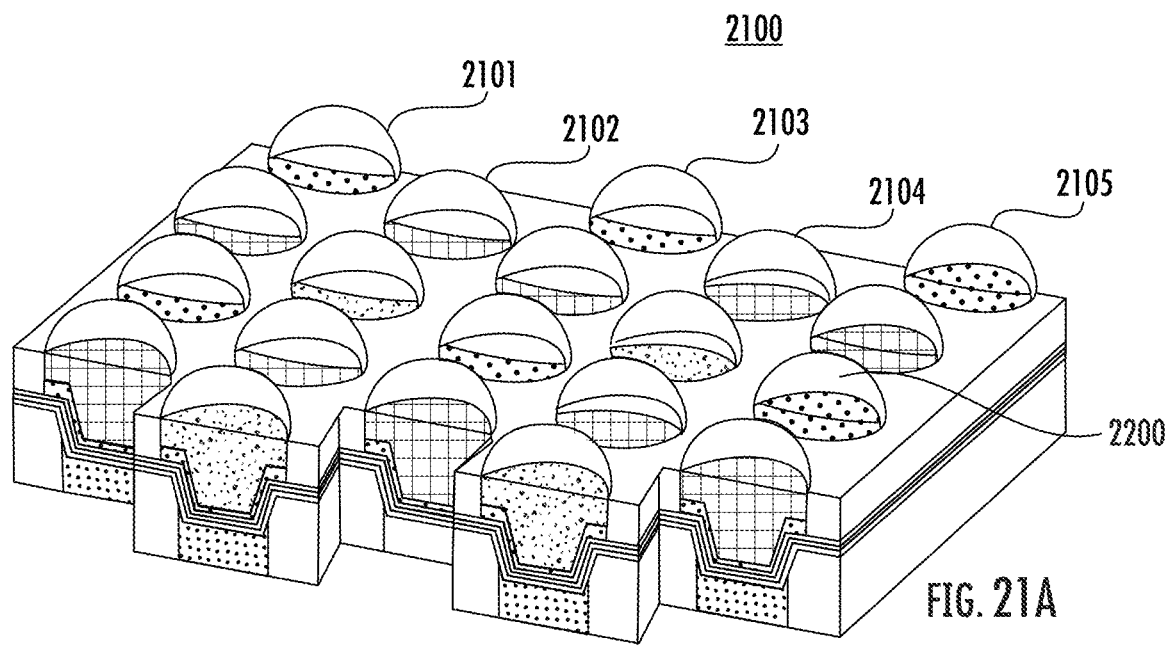
FIGS. 21A and 21B illustrate a monolithic VTF array of LEDs using phosphor conversion and optical isolation that does not require pick and place.
Figure 21B:
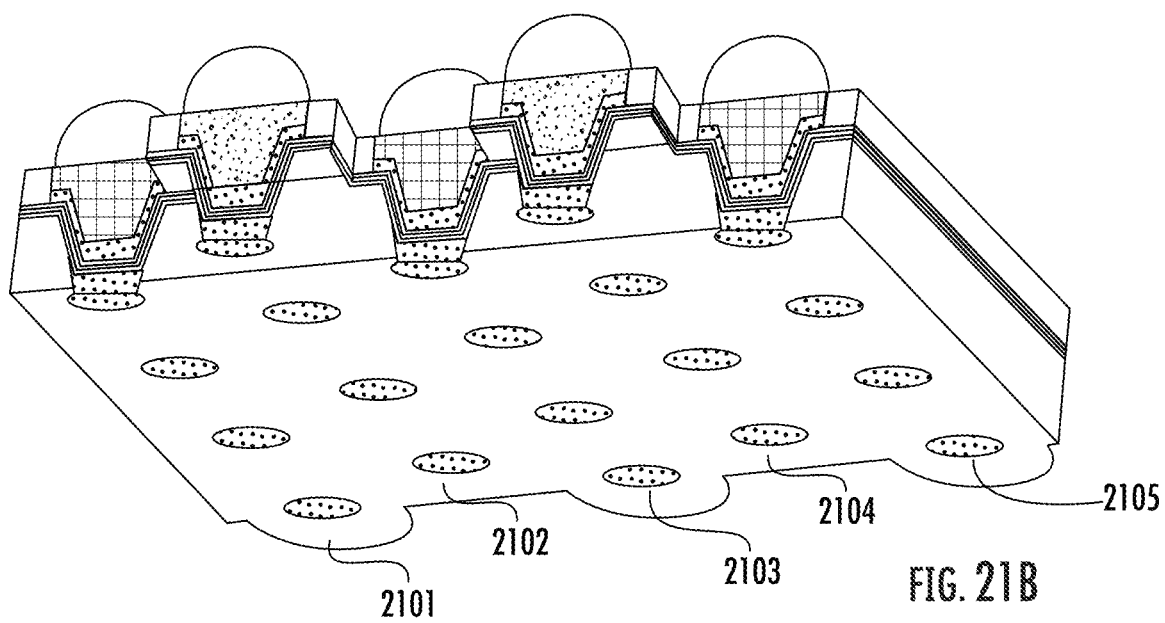
Figure 22:
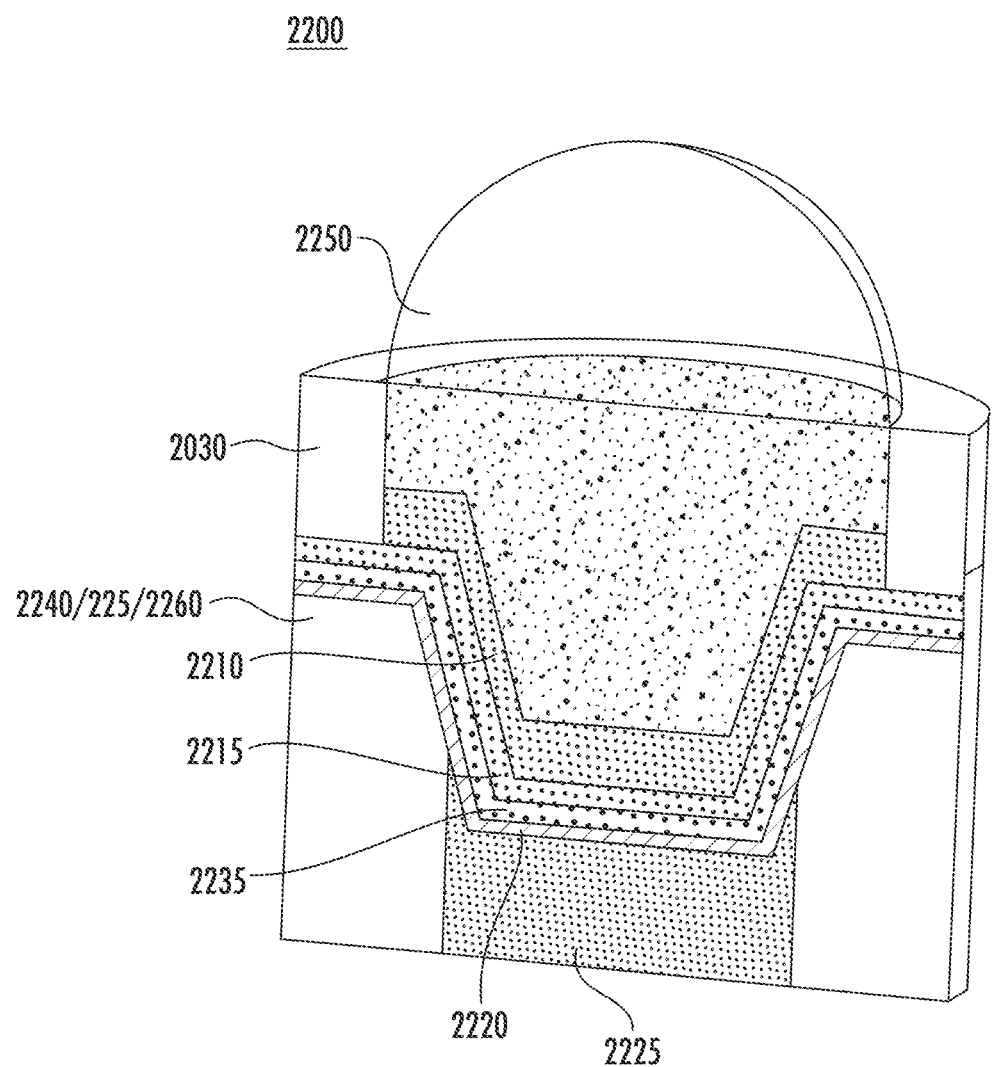
FIG. 22 illustrates a LED unit cell of monolithic VTF array using phosphor conversion and optical isolation.

FIGS. 21A and B illustrate a monolithic VTF array 2100 of LEDs 2200 in FIG. 22 using phosphor conversion and optical isolation that does not require pick and place. As is illustrated in FIG. 21A, a view from the lens side of array 2100 is provided. As is illustrated in FIG. 21B, a view from the distal side of array 2100 is provided. Array 2100 is illustrated as an array of LEDs that is 5×4 with the fourth row being depicted as cut in half so that the internals of each LED 2000 may be viewed. In array 2100 each column is offset from its neighbor so as to misalign the LEDs 2200 in adjacent columns from each other. For example, columns 2101, 2103 and 2105 are aligned, while columns 2102 and 2104 are offset approximately on half width of the LED 2200 (accounting for the spacing between LEDs 2200). The specifics of each LED are provided in and described with respect to FIG. 22. In FIGS. 21A and B, the odd columns 2101, 2103 and 2105 alternate between green LEDs 2200 and red LEDs 2200. The even columns 2102 and 2104 alternate between green LEDs 2200 and blue LEDs 2200. Such a configuration enables RGB as understood in the art. As shown in FIGS. 21A and 21B, epitaxial layers of each LED may extend from a first flat region shown towards the bottom of LED, to sloped sidewalls, and onto the second flat region adjacent to the respective phosphor layer of each of the respective LEDs. Alternatively, the sloped sidewalls may be grown or etched such that a subset of the epitaxial layers do not extend to the second flat region adjacent to respective phosphor layers.

FIG. 22 illustrates a LED 2200 unit cell of monolithic VTF array using phosphor conversion and optical isolation. Similar conceptually to LED 2000 of FIG. 20, LED 2200 may be formed from method 800. LED 2200 includes a p-contact 2225 positioned adjacent to a p-layer 2220. P-layer 2220 is located adjacent to EBL 2235, which is adjacent to active layer 2215. N-layer 2210 is positioned adjacent to active layer 2215 distal to EBL 2235. N-contact 2230 is coupled to n-layer 2210 while being positioned separated from the other layers as described above with respect to FIGS. 7 and 8. N-contact 2230 is configured to provide optical isolation, analogous to 2055 of FIG. 20. Phosphor layer 2214 is included adjacent to n-layer 2210. The epitaxial layers are surrounded by a dielectric insulator 2240/stiffener 2260. Adjacent to the n-phosphor layer 2214 is a micro molded lens 2250 distal to n-layer 2210. Dielectric insulator 2240/stiffener 2260 may be separate layers or may be a single layer that performs the function of a dielectric insulator and a stiffener. As shown in FIG. 22, epitaxial layers may extend from a first flat region shown towards the bottom of LED 2200, to sloped sidewalls, and onto the second flat region adjacent to phosphor layer 2014. Alternatively, the sloped sidewalls may be grown or etched such that a subset of the epitaxial layers do not extend to the second flat region adjacent to phosphor layer 2014.

According to embodiments, a method for manufacturing an LED includes providing a patterned substrate, the patterned substrate having a first flat region and a second flat region on a recessed plane relative to the first flat region, and sloped sidewalls connecting the first flat region and the second flat region. A first layer, of a plurality of layers of a semiconductor structure, may be grown over the first flat region at a first growth rate. The first layer over the second flat region may be grown at a second growth rate. The first layer of over the sloped sidewalls may be grown at a third growth rate, the third growth rate being lower than the first growth rate and the second growth rate. The angle of the sloped sidewalls and/or the crystallographic plane orientation may be modified to adjust the growth rate of a given region or sidewall. For example, the crystallographic plane orientation of the sloped sidewalls may result in slower growth rate when compared to the crystallographic plane orientation of the first flat region and/or second flat region. Growing the semiconductor structure may comprise providing a UV emission wavelength over the patterned substrate. Greater than 90% of a forward bias hole injection may be confined to the first flat region. The plurality of layers may comprise a p-type layer over the sloped sidewalls, the p-type layer over the sloped sidewalls may a thickness less than 80% of a thickness of the first flat region.

A resist may be applied to the to the semiconductor structure. The patterned substrate may be removed after growing the semiconductor structure to create a first pocket and a phosphor layer may be deposited into the first pocket. The width of the first flat region added to the sloped sidewalls may be between 1 micrometer and 10 micrometers and the height of sloped sidewalls may between 1 micrometer and 10 micrometers.

According to embodiments, a method for manufacturing an LED includes growing an n-layer having a first flat region and a second flat region on a recessed plane relative to the first flat region, and sloped sidewalls connecting the first flat region and the second flat region, growing at least one of an active layer and a p-layer over the first flat region at a first growth rate, growing at least one of the active layer and the p-layer over the second flat region at a second growth rate, and growing at least one of the active layer and the p-layer over the sloped sidewalls at a third growth rate, the third growth rate being lower than the first growth rate and the second growth rate.

An n-layer growth or regrowth may be grown over the first flat region at the first growth rate, the second flat region at the second growth rate, and the sloped sidewalls at the third growth rate. Growing the semiconductor structure may comprise providing a UV emission wavelength over the n-layer. Greater than 90% of a forward bias hole injection may confined to the first flat region. The p-type layer over the sloped sidewalls may have a thickness that is less than 80% of the thickness of the first flat region. The width of the first flat region added to the sloped sidewalls may be between 1 micrometer and 10 micrometers. The height of sloped sidewalls may between 1 micrometer and 10 micrometers.

According to embodiments, a method for manufacturing a plurality of LEDs include providing a patterned substrate comprising a plurality of patterned areas (e.g., that are shaped as peaks) and non-patterned areas (e.g., that are shaped as valleys between peaks), growing a light emitting structure comprising a plurality of layers, over the patterned substrate, at least one layer of the plurality of layers being thicker at both the first flat regions of the plurality of layers and the second flat regions of the plurality of layers, compared to sloped sidewalls that connects the first flat regions to the second flat regions, depositing a first resist to the light emitting structure to provide access to the substrate via first portions of the light emitting structure without the resist, etching through the first portions of the light emitting structure to the patterned substrate, and depositing an n-contact metal through the etched first portions of the light emitting structure, the n-contact metal shaped to optically isolate LED emissions from an adjacent LED.

The method may further include depositing a second resist to the semiconductor structure, the second resist deposited onto to second portions of the semiconductor structure such that a p-layer is exposed between sections of the second resist, and depositing p-contact metals to produce p-contacts electrically coupled to the p-layer.

The method may further include bonding a thin film transistor (TFT) backplane to at least the n-contact metal and the p-contact metals, injecting an underfill to fill areas surrounding the p-contacts, the n-contact, and the p-layer, and removing the growth substrate by inverting the manufactured structure to expose the n-layer. The width of the first flat region of the first LED added to the sloped sidewalls of the first LED may be between 2 micrometers and 10 micrometers.

The present embodiments and concepts with suitable modifications may be applied to a range of light emitting material including both (Al)InGaN (Aluminum, Indium, Gallium, Nitride) and AlInGaP (Aluminum, Indium, Gallium, Phosphide) LEDs.

The singulated die embodiments may be used for all types of LEDs applications, including a wide range of display sizes and moderate to low pixel density, including, for example, large area monitors and billboards and cellphones. The compact monolithic design is suitable for small high density, high performance arrays such as watches, projectors and Virtual/Mixed/Augmented Reality devices. Optics may be added to control emission pattern with >3 colors generated for custom displays. Flexible, curved displays are compatible with the teachings herein. White emitting phosphor mixtures may be used for illumination applications addressing various pixel combinations to tune color temperature and radiation pattern through system optics. The intensity of some or all pixels may be varied in time to trigger external events or transmit information. Some pixels may be used as detectors while some are used as emitters. Optical patterns may be synchronized to external sound frequencies for entertainment or to convert sound to an equivalent light pattern. A touchscreen may be included in the display construction and pressure signals may be coupled to light patterns. Two color rear automotive lighting may be provided, e.g., the color may become a deeper red and brighter as brakes are more heavily applied. Generally, a color shift may be used to transmit information such as external weather conditions, temperature, etc. Automotive forward lighting units with controllable source patterns may be formed. Finally, the devices created are scalable, limited only by the size and shape of the growth substrate.

Figure 23:
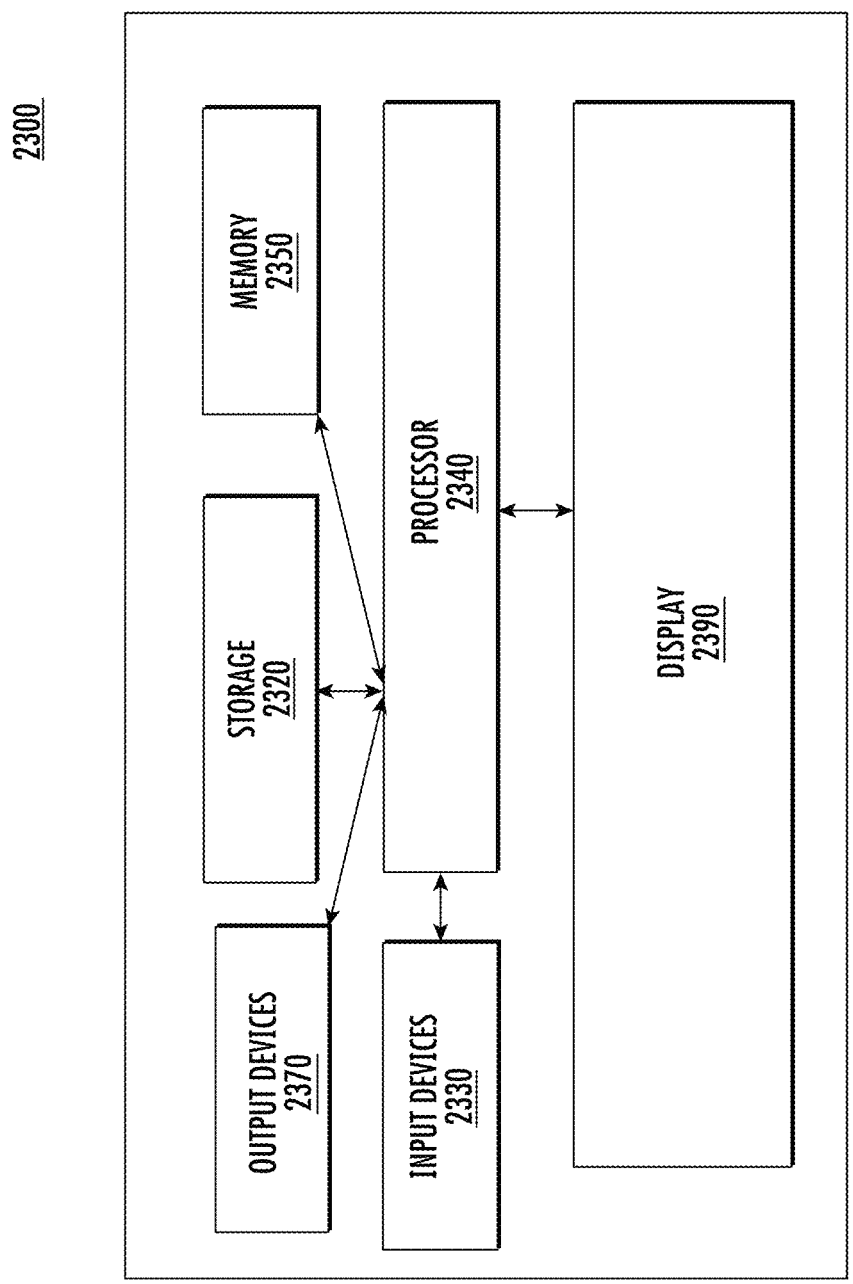
FIG. 23 illustrates a diagram of an example system that may be used to implement all or some of the embodiments described herein.

FIG. 23 is a diagram of an example system 2300 that may be used to implement all, some or portions of the embodiments described herein. System 2300 may correspond to any applicable display including, but not limited to, a mobile device display, a computer display, an electronic display, a television, virtual reality (VR) device, augmented reality (AR) device, a projector, a watch, or the like. It will be understood that the number of LEDs in an LED array in a device may vary depending on the device such as, for example, in a television verses a watch. In the example illustrated in FIG. 23, the system 2300 may include a processor 2340, a memory 2350, storage 2320, one or more input devices 2330, one or more output devices 2370, as well as one or more other components. It will be understood that although the example system 2300 of FIG. 23 discloses a plurality of components, one or more of the disclosed plurality of components may be necessary to implement the embodiments disclosed herein. Additionally, a lighting system or display may include additional components than those that are shown in system 2200.

The processor 2340 may include a central processing unit (CPU), a graphics processing unit (GPU), a CPU and GPU, and/or one or more processor cores. The memory 2350 may include a volatile or non-volatile memory, for example, random access memory (RAM), dynamic RAM, or a cache. The storage 2320 may include a fixed or removable storage, for example, a hard disk drive, a solid state drive, an optical disk, or a flash drive. The one or more input devices 2330 may include, for example, a keyboard, a keypad, a touch screen, a touch pad, a detector, a microphone, an accelerometer, a gyroscope, a biometric scanner, and/or a network connection (e.g., a wireless local area network card for transmission and/or reception of wireless IEEE 802 signals). The one or more output devices 2370 may include, for example, a display, a speaker, one or more lights, an antenna, and/or a network connection.

Figure 19:
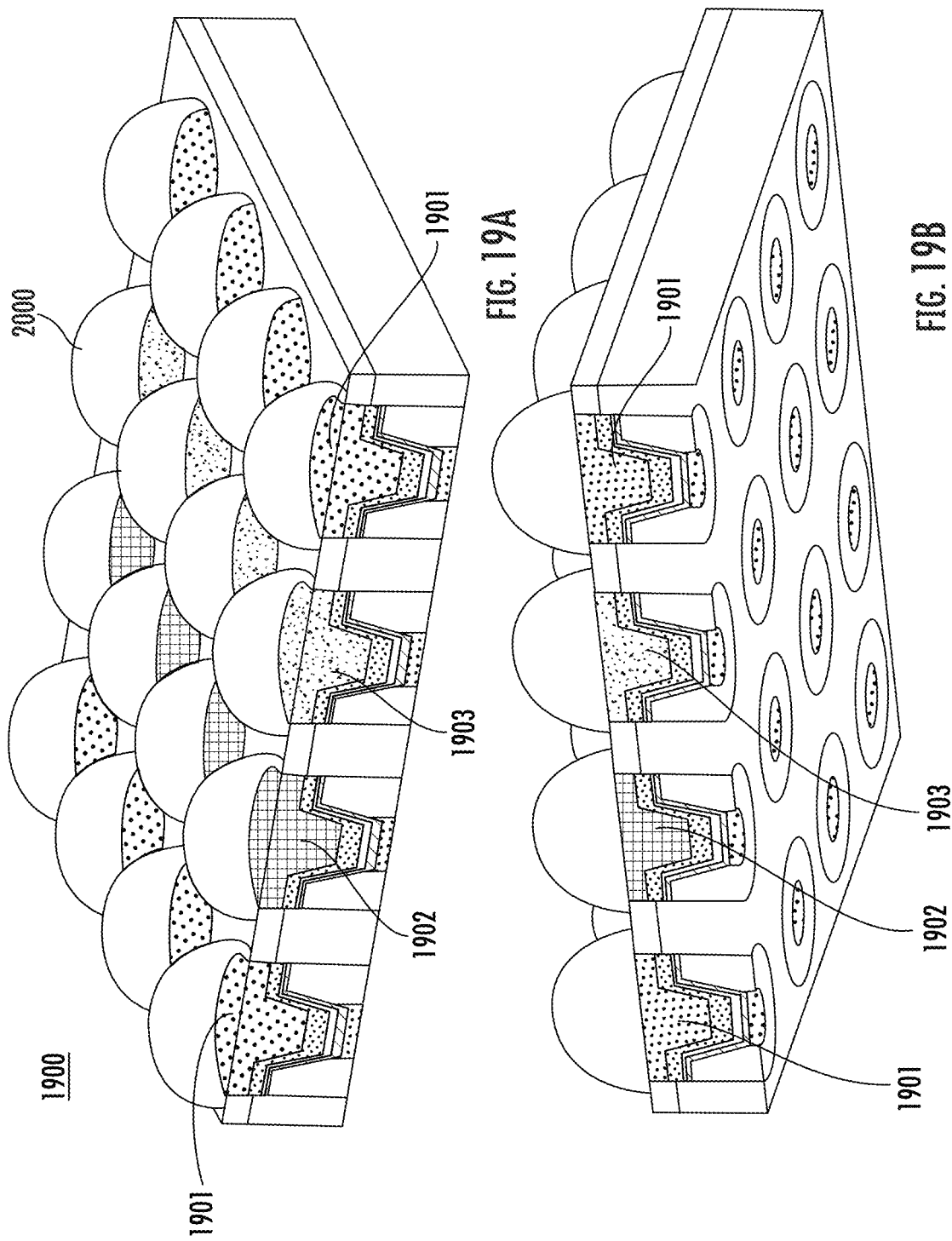
FIGS. 19A and 19B illustrate a monolithic TFFC array of LEDs using phosphor conversion and optical isolation that does not require pick and place.

The display 2390 may be connected to the processor 2340 and may be a display as disclosed in accordance with the embodiments disclosed herein. For example, the LEDs within display 2390 may be manufactured in accordance with FIG. 5, FIG. 6, FIG. 7, and/or FIG. 8 as disclosed herein. Further, the display 2390 may include LEDs within display 2390 that are configured the same as or similar to the LEDs disclosed in FIGS. 9-18, 20 and 22. Further, the display 2290 may include an array of LEDs within the display 2390, as shown in FIGS. 19 and 21.

As an example of the system 2300 in operation, the system 2300 may be a mobile phone and the display 2390 may be a mobile phone screen that includes an array of LEDs in accordance with the embodiments disclosed herein. An input device 2330, such as a touch input component may receive an input to display a first content. The input device 2330 may generate a signal based on the input and provide the signal to the processor 2324. The processor may obtain a pointer location for the corresponding input from the memory 2350 and may provide the pointer location to storage 2320. Storage 2320 may retrieve the content and provide it to the processor 2340. The processor 2340 may provide signals to a backplane contained within the display 2390 such that the backplane individually addresses LEDs within the display 2290 to visually provide the content.

While the system 2300 is shown as a single unit, one of ordinary skill in the art will recognize that the system 2300 can have portions that are split between different locations. For example, the entire system 2300 could be located on the board with the LEDs and/or sensors and/or all or portions of the system may be located on the board while other elements may be located off board. Additionally, only some elements of the system 2300 may be used in an implementation. For example, a storage device and/or memory may not be needed.

Figure 24:
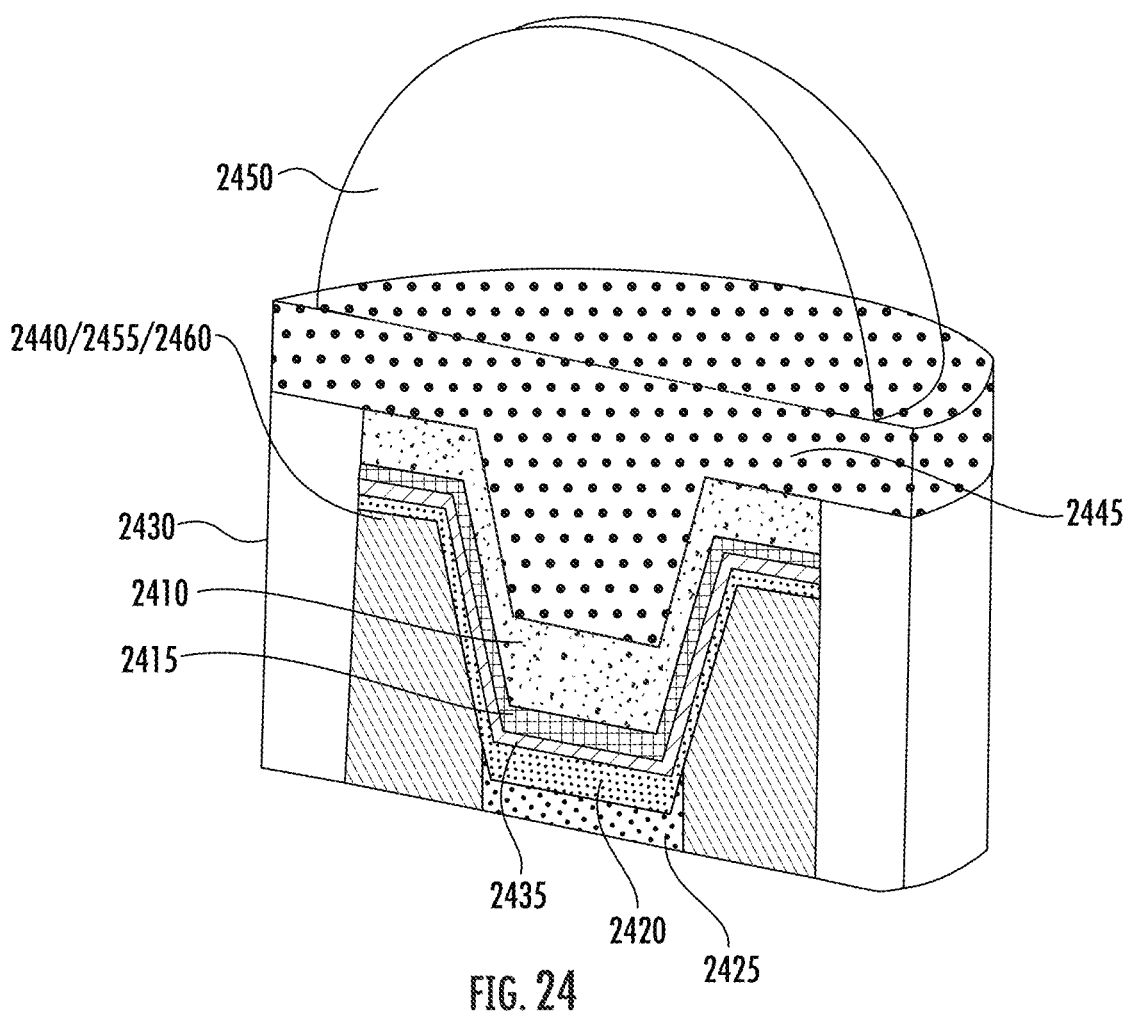
FIG. 24 illustrates a unit cell of a monolithic array of substrate-on LEDs.

FIG. 24 illustrates a LED 2400 unit cell of monolithic TFFC array including a transparent substrate. LED 2400 may be formed from method 600. LED 2400 depicts a LED similar to that of FIG. 12A having a substrate, preferably a transparent substrate 1245. LED 2400 includes a p-contact 2425 positioned adjacent to a p-layer 2420. P-layer 2420 is located adjacent to EBL 2435, which is adjacent to active layer 2415. N-layer 2410 is positioned adjacent to active layer 2415 distal to EBL 2435. N-contact 2430 is coupled to n-layer 2410. In between the epitaxial layers and n-contact 2430 is a dielectric insulator 2440/optical isolator 2455/stiffener 2460. Adjacent to the transparent substrate 2445 is a micro molded lens 2450 distal to n-layer 2410. Dielectric insulator 2040/optical isolator 2055/stiffener 2060 may be three separate layers or may be a single layer that performs the function of a dielectric insulator, an optical insulator and a stiffener. As shown in FIG. 24, epitaxial layers may extend from a first flat region of the substrate, to a sloped region, and onto a second flat region of the substrate.

FIGS. 25A and 25B illustrate a monolithic TFFC array 2500 of LEDs 2400 that does not require pick and place. As is illustrated in FIG. 25A, a view from the lens side of array 2500 is provided. As is illustrated in FIG. 25B, a view from the distal to the lens side of array 2500 is provided. Array 2500 is illustrated as an array of LEDs that is 4×4 with the fourth row being depicted as cut in half so that the internal structure of each LED 2400 may be viewed. The specifics of each LED are provided in and described with respect to FIG. 24. In FIGS. 25A and 25B, the LEDs 2400 are all the same color.

The methods provided may be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors may be manufactured by configuring a manufacturing process using the results of processed hardware description language (HDL) instructions and other intermediary data including netlists (such instructions capable of being stored on a computer readable media). The results of such processing may be mask works that are then used in a semiconductor manufacturing process to manufacture a processor which implements features of the disclosure.

The methods or flow charts provided herein may be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting diode (LED) comprising:
  a first plurality of epitaxial layers comprising:
    a first n-layer having a first flat portion, a second sloped portion, a third flat portion, a fourth pinched portion, and a fifth flat portion,
    a first active layer having a first flat portion adjacent to the first flat portion of the first n-layer and a second sloped portion adjacent to second sloped portion of the first n-layer;
    a first p-layer having a first flat portion adjacent to the first flat portion of the first active layer and a second sloped portion adjacent to the second sloped portion of the first active layer;
    wherein the first flat portion of the first p-layer is thicker than at least a part of the second sloped portion of the first p-layer;
  a p-contact on the first flat portion of the first p-layer; and
  an n-contact formed on the third flat portion of the first n-layer.

2. The LED of claim 1, wherein the third flat portion of the first n-layer is thicker than at least a part of the fourth pinched portion of the first n-layer.

3. The LED of claim 1, wherein the first plurality of epitaxial layers further comprises a first electron blocking layer located between the first p-layer and the first active layer, the first electron blocking layer having a first portion adjacent to the first flat portion and a second portion adjacent to the second sloped portion of the first p-layer.

4. The LED of claim 3, wherein the first active layer contacts the first n-layer, the first electron blocking layer contacts the first active layer, and the first p-layer contacts the first active layer.

5. The LED of claim 1 further comprising a second plurality of epitaxial layers adjacent to the fifth flat portion of the first n-layer, the second plurality of epitaxial layers comprising: a second p-layer, and a second active layer.

6. The LED of claim 5, wherein the second plurality of epitaxial layers further comprises a second electron blocking layer located between the second p-layer and the second active layer.

7. The LED of claim 1 further comprising at least one layer of light converting phosphor adjacent to the first n-layer.

8. The LED of claim 1, wherein there is an absence of a passivation layer on the second sloped portion of the first n-layer.

9. The LED of claim 1, wherein the LED is in singulated form.

10. A light emitting diode (LED) comprising:
a patterned substrate comprising:
   a first flat region,
   a second flat region parallel to the first flat region,
   a third flat region,
   a sloped sidewall connecting the first flat region and the second flat region, and
   a bottom sidewall connecting the second flat region and the third flat region,
   wherein the first flat region is located at a first height from the third flat region and the second flat region is located at a second height from the third flat region;
a first plurality of epitaxial layers comprising:
   a first n-layer having a first portion adjacent to the first flat region, a second portion adjacent to the sloped sidewall, a third portion adjacent to the second flat region, and a fourth portion adjacent to the bottom sidewall,
   a first active layer having a first portion adjacent to the first flat region of the first n-layer and a second portion adjacent to the second portion of the first n-layer,
   a first p-layer having a first portion adjacent to the first flat portion of the first active layer, and a second portion adjacent to the second portion of the first active layer,
   wherein the first portion of the first p-layer adjacent to the first flat region is thicker than at least a part of the second portion of the first p-layer adjacent to the sloped sidewall;
   a p-contact on the first portion of the first p-layer adjacent to the first flat region;
   an n-contact formed on the third portion of the first n-layer adjacent to the second flat region.

11. The LED of claim 10, wherein the third portion of the first n-layer adjacent to the second flat region is thicker than at least a part of the fourth portion of the first n-layer adjacent to the bottom sidewall.

12. The LED of claim 10, wherein the first plurality of epitaxial layers further comprises a first electron blocking layer located between the first p-layer and the first active layer, the first electron blocking layer having a first portion adjacent to the first flat region of the first active layer and a second portion adjacent to the section portion of the first active layer.

13. The LED of claim 10, wherein the first n-layer contacts the patterned substrate, the first active layer contacts the first n-layer, the first electron blocking layer contacts the first active layer, and the first p-layer contacts the first active layer.

14. The LED of claim 10 further comprising a second plurality of epitaxial layers adjacent to the third flat region, the second plurality of epitaxial layers comprising: a second n-layer, a second p-layer, and a second active layer.

15. The LED of claim 14, wherein the second plurality of epitaxial layers further comprises a second electron blocking layer located between the second p-layer and the second active layer.

16. The LED of claim 14, wherein the second n-layer contacts the third flat region and at least a part of the bottom sidewall, the second active layer contacts the second p-layer and at least a part of the bottom sidewall, the second electron blocking layer contacts the second active layer and at least a part of the bottom sidewall, and the second p-layer contacts the second active layer and at least a part of the bottom sidewall.

17. The LED of claim 10, wherein a difference between the first height and the second height is between 1 μm and 10 μm.

18. The LED of claim 10, wherein an angle created by the first flat region and the sloped sidewall is between 45 degrees and 160 degrees.

19. The LED of claim 10, wherein the patterned substrate comprises: sapphire, silicon, silicon carbide, GaN, or GaAs and/or the first n-layer comprises nGaN and the first p-layer comprises pGaN.

20. The LED of claim 10, wherein there is an absence of a passivation layer on the sloped sidewall.

21. The LED of claim 1, wherein the first plurality of the epitaxial layers are in a multilevel configuration comprising such that with respect to the first n-layer, the first flat portion, the third flat portion, and the fifth flat portion are at different levels of the LED.

22. The LED of claim 10, wherein the patterned substrate is a multilevel patterned substrate such that the second height of the second flat region from the third flat region differs from the first height of the first flat region from the third flat region, and the first plurality of the epitaxial layers are in a multilevel configuration comprising such that with respect to the first n-layer, the first flat portion and the third flat portion are at different levels of the LED.

* * * * *